United States Patent
Sharon et al.

(10) Patent No.: US 8,873,285 B2
(45) Date of Patent: Oct. 28, 2014

(54) SIMULTANEOUS MULTI-LEVEL BINARY SEARCH IN NON-VOLATILE STORAGE

(71) Applicant: SanDisk IL Ltd., Kfar Saba (IL)

(72) Inventors: Eran Sharon, Rishon Lezion (IL); Yan Li, Milpitas, CA (US); Nima Mokhlesi, Los Gatos, CA (US)

(73) Assignee: SanDisk II, Ltd., Kfar Saba (IL)

( * ) Notice: Subject to any disclaimer, the term of this patent is extended or adjusted under 35 U.S.C. 154(b) by 0 days.

(21) Appl. No.: 13/937,983

(22) Filed: Jul. 9, 2013

(65) Prior Publication Data

US 2013/0294169 A1    Nov. 7, 2013

Related U.S. Application Data

(62) Division of application No. 13/491,166, filed on Jun. 7, 2012, now Pat. No. 8,509,000, which is a division of application No. 12/732,121, filed on Mar. 25, 2010, now Pat. No. 8,233,324.

(51) Int. Cl.

| | |
|---|---|
| *G11C 11/34* | (2006.01) |
| *G11C 16/34* | (2006.01) |
| *G11C 11/56* | (2006.01) |
| *G11C 16/04* | (2006.01) |

(52) U.S. Cl.
CPC ........ *G11C 16/3454* (2013.01); *G11C 11/5642* (2013.01); *G11C 16/0483* (2013.01); *G11C 2211/5624* (2013.01); *G11C 2211/5631* (2013.01)
USPC .............. 365/185.03; 365/185.17; 365/185.2; 365/185.21

(58) Field of Classification Search
USPC ................ 365/185.03, 185.17, 185.2, 185.21
See application file for complete search history.

(56) References Cited

U.S. PATENT DOCUMENTS

| | | |
|---|---|---|
| 5,163,021 A | 11/1992 | Mehrotra et al. |
| 5,543,738 A | 8/1996 | Lee et al. |

(Continued)

FOREIGN PATENT DOCUMENTS

| | | |
|---|---|---|
| EP | 1814123 A1 | 1/2007 |
| WO | 2008063970 A2 | 5/2008 |

OTHER PUBLICATIONS

Office Action Restriction dated Jan. 19, 2012, U.S. Appl. No. 12/732,121, filed Mar. 25, 2010, 8 pages.

(Continued)

*Primary Examiner* — Han Yang
(74) *Attorney, Agent, or Firm* — Vierra Magen Marcus LLP

(57) ABSTRACT

Methods and devices for simultaneously verifying or reading multiple states in non-volatile storage are disclosed. Methods and devices for efficiently reducing or eliminating cross-coupling effects in non-volatile storage are disclosed. Methods and devices for efficiently performing reads at a number of voltages to search for the threshold voltage of a memory cell are disclosed. Memory cells on different NAND strings that are read at the same time may be tested for different threshold voltage levels. Memory cells may be tested for different threshold voltages by applying different gate-to-source voltages to memory cells being tested for different threshold voltages. Memory cells may be tested for different threshold voltages by applying different drain to source voltages to the memory cells. Different amounts of compensation for cross-coupling affects may be applied to memory cells on different NAND strings that are read or programmed at the same time. A binary search may be performed.

23 Claims, 38 Drawing Sheets

(56) References Cited

U.S. PATENT DOCUMENTS

| | | | |
|---|---|---|---|
| 5,838,612 | A | 11/1998 | Calligaro et al. |
| 6,069,821 | A | 5/2000 | Jun et al. |
| 7,002,843 | B2 | 2/2006 | Guterman et al. |
| 7,020,026 | B2 | 3/2006 | Guterman et al. |
| 7,073,103 | B2 | 7/2006 | Gongwer et al. |
| 7,280,408 | B2 | 10/2007 | Guterman et al. |
| 7,349,264 | B2 | 3/2008 | Mokhlesi et al. |
| 7,414,887 | B2 | 8/2008 | Guterman et al. |
| 7,460,406 | B2 | 12/2008 | Mokhlesi et al. |
| 7,778,106 | B2 | 8/2010 | Mokhlesi |
| 7,843,726 | B2 | 11/2010 | Roohparvar et al. |
| 8,040,725 | B2 | 10/2011 | Kang |
| 8,233,324 | B2 | 7/2012 | Sharon et al. |
| 2004/0213031 | A1 | 10/2004 | Hosono et al. |
| 2005/0162913 | A1 | 7/2005 | Chen |
| 2007/0121383 | A1 | 5/2007 | Chen et al. |
| 2007/0147141 | A1 | 6/2007 | Shibata |
| 2008/0263266 | A1* | 10/2008 | Sharon et al. .......... 711/103 |
| 2009/0010068 | A1* | 1/2009 | Lee .................. 365/185.19 |
| 2010/0074015 | A1 | 3/2010 | Chandrasekhar et al. |
| 2011/0007568 | A1 | 1/2011 | Chang et al. |
| 2011/0235420 | A1 | 9/2011 | Sharon et al. |
| 2012/0250415 | A1 | 10/2012 | Sharon et al. |

OTHER PUBLICATIONS

Response to Office Action Restriction dated Feb. 15, 2012, U.S. Appl. No. 12/732,121, filed Mar. 25, 2010, 24 pages.
Notice of Allowance and Issue Fee(s) due dated Apr. 26, 2012, U.S. Appl. No. 12/732,121, filed Mar. 25, 2010, 16 pages.
International Search Report and Written Opinion of the International Searching Authority dated Jul. 6, 2011, PCT Application No. PCT/US2011/029256, filed Mar. 21, 2011, 10 pages.
Office Action Restriction dated Mar. 12, 2013, U.S. Appl. No. 13/491,166, filed Jun. 7, 2012, 7 pages.
Response to Office Action Restriction dated Apr. 3, 2013, U.S. Appl. No. 13/491,166, filed Jun. 7, 2012, 8 pages.
Notice of Allowance and Fee(s) Due dated Apr. 22, 2013, U.S. Appl. No. 13/491,166, filed Jun. 7, 2012, 17 pages.
European Office Action dated Nov. 14, 2012, European Patent Application No. 11713909.7, filed Mar. 21, 2011, 2 pages.
Response to European Office Action (Written Opinion of the International Searching Authority) dated May 23, 2013, European Patent Application No. 11713909.7, filed Mar. 21, 2011, 18 pages.

* cited by examiner

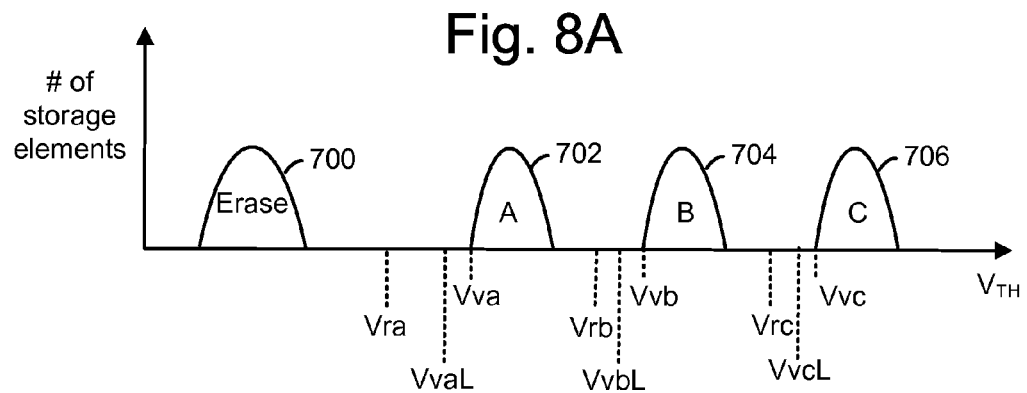
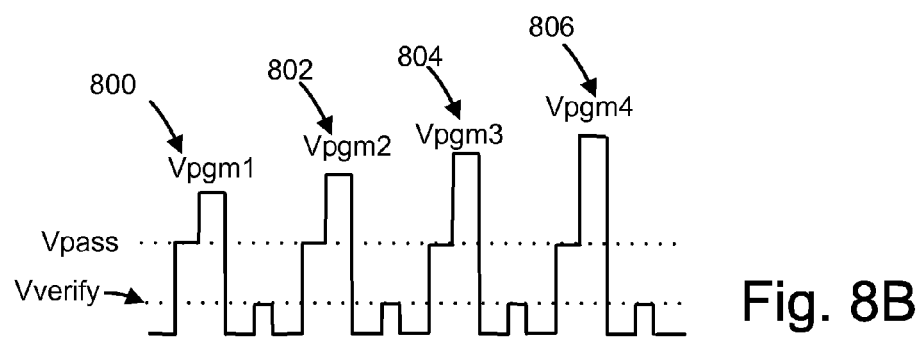

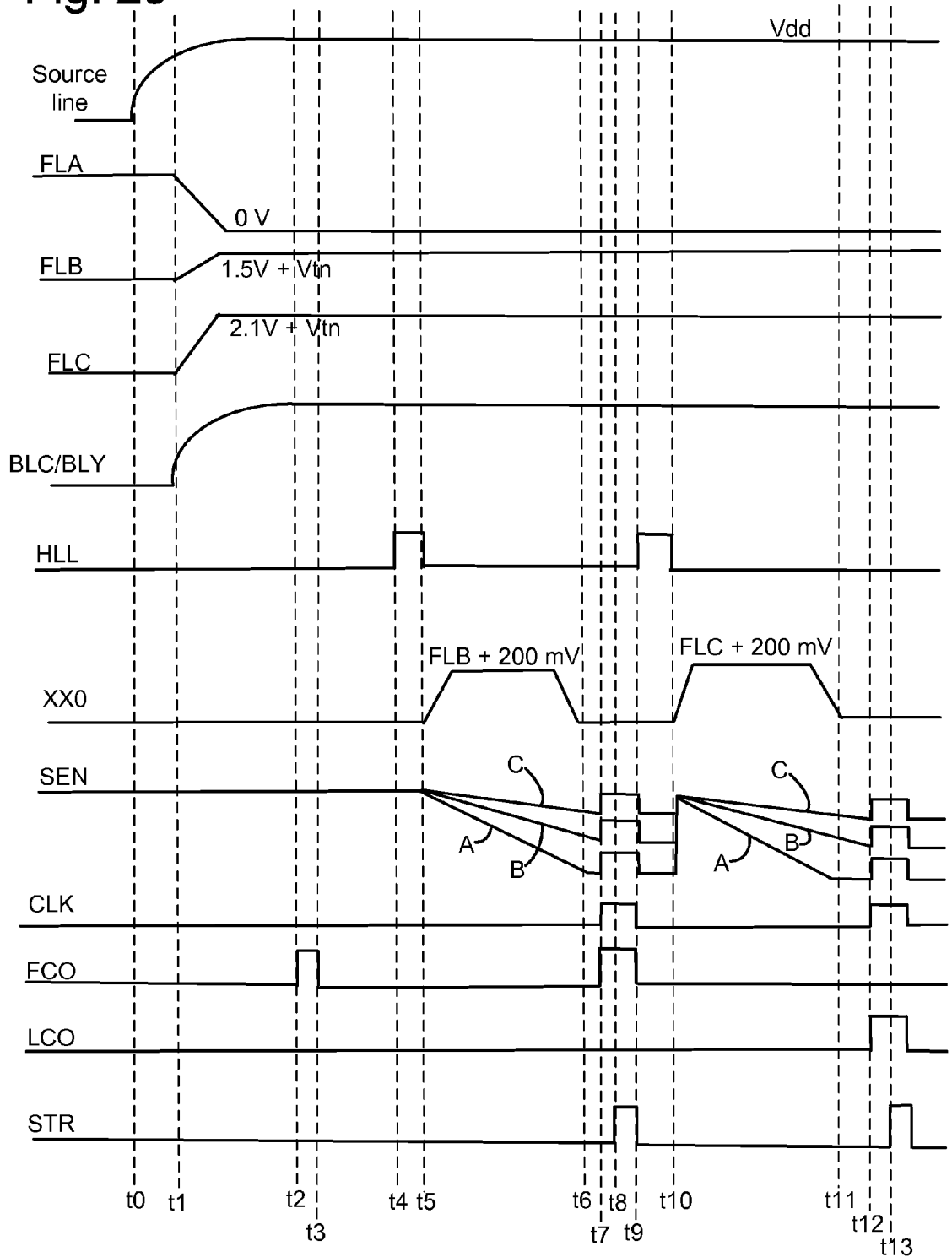

SIMULTANEOUS MULTI-LEVEL BINARY SEARCH IN NON-VOLATILE STORAGE

CLAIM OF PRIORITY

This application is a divisional application of U.S. patent application Ser. No. 13/491,166, entitled "SIMULTANEOUS MULTI-STATE READ OR VERIFY IN NON-VOLATILE STORAGE", filed Jun. 7, 2012, which is a divisional application of U.S. patent application Ser. No. 12/732,121, entitled "SIMULTANEOUS MULTI-STATE READ OR VERIFY IN NON-VOLATILE STORAGE," filed Mar. 25, 2010, now U.S. Pat. No. 8,233,324, which are incorporated herein by reference in their entireties.

BACKGROUND OF THE INVENTION

1. Field of the Invention

This disclosure relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both traditional EEPROM and flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

U.S. Pat. No. 7,073,103, entitled "Smart Verify For Multi-State Memories," incorporated herein by reference in its entirety, describes a process for minimizing the number of sequential verify operations for each program/verify/lockout step of a write sequence. Initially, only the lowest state of the multi-state range to which selected storage elements are programmed is checked during the verify phase. Once the first storage state is reached by one or more of the selected elements, the next state in a sequence of multi-states is added to the verify process. This next state can either be added immediately upon the fastest elements reaching the preceding state in the sequence, or after a delay of several program pulses. The adding of states to the set being checked in the verify phase continues through the rest of the set of multi-states in sequence, until the highest state has been added. Additionally, lower states can be removed from the verify set as all of the selected storage elements bound for these levels verify successfully to those target values and are locked out from further programming. Note that this technique may require that more than one state be verified following each programming pulse.

While methods for improving the verify technique are known, a need still exists for further improvements which are applicable to different programming schemes.

BRIEF DESCRIPTION OF THE DRAWINGS

FIG. 1B is an equivalent circuit diagram of the NAND string of FIG. 1a.

FIG. 8A depicts an example set of threshold voltage distributions for a four-state memory device in which each storage element stores two bits of data.

FIG. 8B depicts a series of program and verify pulses which are applied to a selected word line during a programming operation.

FIG. 29 depicts a timing diagram for signals associated with a forward sensing embodiment.

DETAILED DESCRIPTION

Figure 1A:
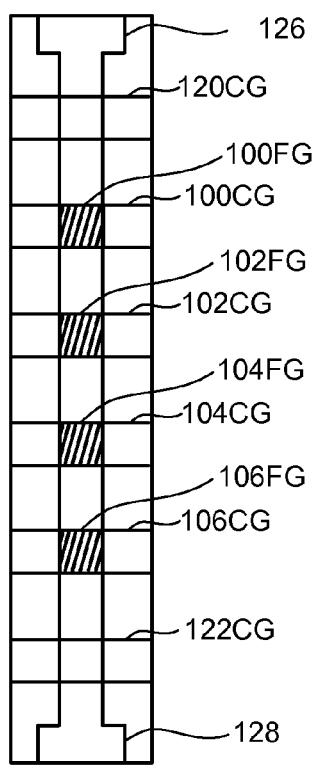
FIG. 1A is a top view of a NAND string.

Methods and devices for simultaneously verifying or reading multiple states in non-volatile storage are disclosed. Technology disclosed herein reduces the time for non-volatile storage operations such as program verify, and read in non-volatile.

Methods and devices for efficiently reducing or eliminating cross-coupling effects in non-volatile storage are disclosed. Technology disclosed herein reduces the time it takes to program or read while reducing or eliminating cross-coupling effects.

Methods and devices for efficiently performing reads at a number of voltages to search for the threshold voltage of a memory cell are disclosed. Technology disclosed herein reduces the time is takes to determine "soft bits."

In one embodiment, memory cells on different NAND strings that are read at the same time are tested for different threshold voltage levels. For example, a memory cell on one NAND string is tested to determine whether its threshold voltage is above a first voltage level, whereas a memory cell on another NAND string is tested to determine whether its threshold voltage is above a second voltage level. As a specific example, one memory cell is tested to determine if its threshold voltage is above the voltage level associated with one data state, whereas, the other memory cell is tested to determine if its threshold voltage is above the voltage level associated with another data state. Therefore, in a memory array that programs memory cells to multiple bits per memory cell, more than one data state can be tested at a time.

In one embodiment, the technique is used during a verify operation associated with programming memory cells to multiple data states. By verifying multiple data states at a time, the programming sequence is sped up. For example, one or more programming pulses are applied to the memory cells with the goal of eventually programming some memory cells to one state and others to a different state (in all there might be 4, 5, 6, 7, 8, 9, ..., 16, or more states). Then, a verify operation is performed to determine whether the memory cells were programmed to their respective intended states as a result of the one or more programming pulses. By verifying multiple states with the same verify operation, time may be saved. In some embodiments, the same voltage is applied to the gates of the memory cells that are being verified for different threshold voltages.

In one embodiment, memory cells are tested for different threshold voltages by applying different gate-to-source voltages to memory cells being tested for different threshold voltages. One embodiment involves biasing a common source line of a NAND string to a first voltage and causing one voltage to a first set of bit lines and a different voltage to a second set of bit lines. The first set of bit lines are associated with NAND strings having a memory cell being programmed to a first state and the second set of bit lines are associated with NAND strings having a memory cell being programmed to a second state. However, the same voltage is applied to the gates of the memory cells being programmed. The bit line voltages may be lower than the common source line such that, in effect, the side of the memory cell nearest the source line functions as the drain and the side of the memory cell nearest its bit line functions as the source. Therefore, the memory cell's current flows from the source line to its bit line. This technique may therefore be referred to as "reverse sensing" in that the current flows in the opposite direction as is commonly done to sense memory cells on a NAND string.

In one embodiment, memory cells are tested for different threshold voltages by applying different drain to source voltages to the memory cells. One embodiment involves biasing a common source line of a NAND string to a first voltage and causing one voltage to a first set of bit lines and a different voltage to a second set of bit lines. The first set of bit lines are associated with NAND strings having a memory cell being programmed to a first state and the second set of bit lines are associated with NAND strings having a memory cell being programmed to a second state. However, the same voltage is applied to the gates of the memory cells being programmed. The different bit line voltages cause different drain-to-source voltages for memory cells being tested for different threshold voltages. The drain voltage of at least some of the memory cells is sufficiently high to cause drain induced barrier lowering (DIBL), which alters the threshold voltage of the memory cell. For example, the goal may be to verify that the threshold voltage of a first memory cell is at least 3.0V and the threshold voltage of a second memory cell is at least 3.5V. In fact, the first memory cell may have a threshold voltage of 3.0V and the second memory cell may have a threshold voltage of 3.5V without any DIBL effect. By creating sufficient DIBL to lower the threshold voltage of the second memory cell from 3.5V to 3.0V, the threshold voltage of both memory cells can be tested using the same gate to source voltage. As an example, under the foregoing conditions, a Vgs of 3.0V may cause both memory cells to turn on, thereby verifying memory cells having different threshold voltages at the same time. Note this means that the same voltage is applied to the gates of the memory cells that are being verified for different threshold voltages.

In one embodiment, a different amount of compensation for cross-coupling affects is applied to memory cells on different NAND strings that are read at the same time. The compensation may be based on the threshold voltage of one or more neighbor memory cells. For example, a memory cell on one NAND string receives a first amount of cross-coupling compensation, whereas a memory cell on another NAND string that is being read at the same time receives a second amount of cross-coupling compensation. As a specific example, the different NAND strings have a different amount of voltage applied across them to achieve a different amount of cross-coupling compensation. In one embodiment, different memory cells have a different Vgs during read to achieve a different amount of cross-coupling compensation. In one embodiment, different memory cells have a different Vds during read to achieve a different amount of cross-coupling compensation.

In one embodiment, a different amount of compensation for cross-coupling affects is applied to memory cells on different NAND strings during the verify stage of programming. The compensation may be based on the intended state to which a neighbor memory cell is to be programmed at a later time. For example, a memory cell on one NAND string receives a first amount of cross-coupling compensation, whereas a memory cell on another NAND string that is being verified at the same time receives a second amount of cross-coupling compensation. As a specific example, the different NAND strings have a different amount of voltage applied across them to achieve a different amount of cross-coupling compensation. In one embodiment, different memory cells have a different Vgs during verify to achieve a different amount of cross-coupling compensation. In one embodiment, different memory cells have a different Vds during verify to achieve a different amount of cross-coupling compensation.

In one embodiment, a search for the threshold voltage is performed efficiently by performing reads at different threshold voltages at the same time. For example, a read is performed at the center of a window that covers a range of threshold voltages of interest. This read may be performed on many memory cells on a selected word line. Then, based on the outcome of the read, another read is performed at multiple threshold voltages. For example, if a given memory cell's threshold voltage is determined to be higher than the center of the window, then that cell is read at the midpoint between the center and the top of the window. On the other hand, if a given memory cell's threshold voltage is determined to be lower than the center of the window, then that cell is read at the midpoint between the bottom of the window and the center. In effect, a binary search is performed for the threshold voltage. In one embodiment, different NAND strings have a different amount of voltage applied across them to read for different threshold voltages at the same time to speed up the search. In one embodiment, different memory cells have a different Vgs to read for different threshold voltages at the same time to speed up the search. In one embodiment, different memory cells have a different Vds to read for different threshold voltages at the same time to speed up the search.

In one embodiment, soft bits are efficiently determined by performing reads at different threshold voltages at the same time. Determining soft bits allows the threshold voltage of the memory cells to be determined to a finer level of granularity. As one example, if there are four data states, initially three separate reads may be performed with each read being at a point between two adjacent data states. These initial reads do not determine the soft bits, but instead may make an initial assignment of the threshold voltage of each memory cell to one data state. Then, two reads may be performed together at offsets from each of the first reads. For example, one read is at V−Δ and the other at V+Δ during the same read operation. The data from these reads may be used to determine "soft bits," which may be provided to an ECC correction algorithm. In one embodiment, different NAND strings have a different amount of voltage applied across them to read for V−Δ and V+Δ at the same time. In one embodiment, different memory cells have a different Vgs to read for V−Δ and V+Δ at the same time. In one embodiment, different memory cells have a different Vds to read for read for V−Δ and V+Δ at the same time.

Example Memory System and Operation

Figure 1B:
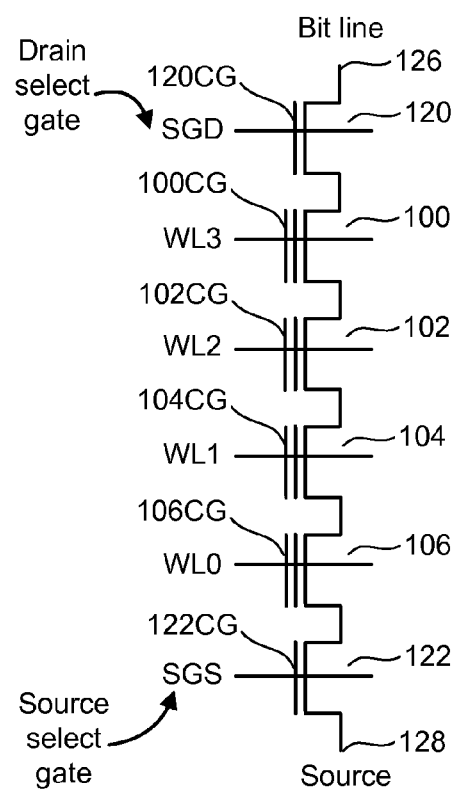

One example of a memory system suitable for implementing embodiments uses a NAND flash memory architecture, which includes connecting multiple transistors in series between two select gates. The transistors connected in series and the select gates are referred to as a NAND string. FIG. 1a is a top view showing one NAND string. FIG. 1b is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

Figure 2:
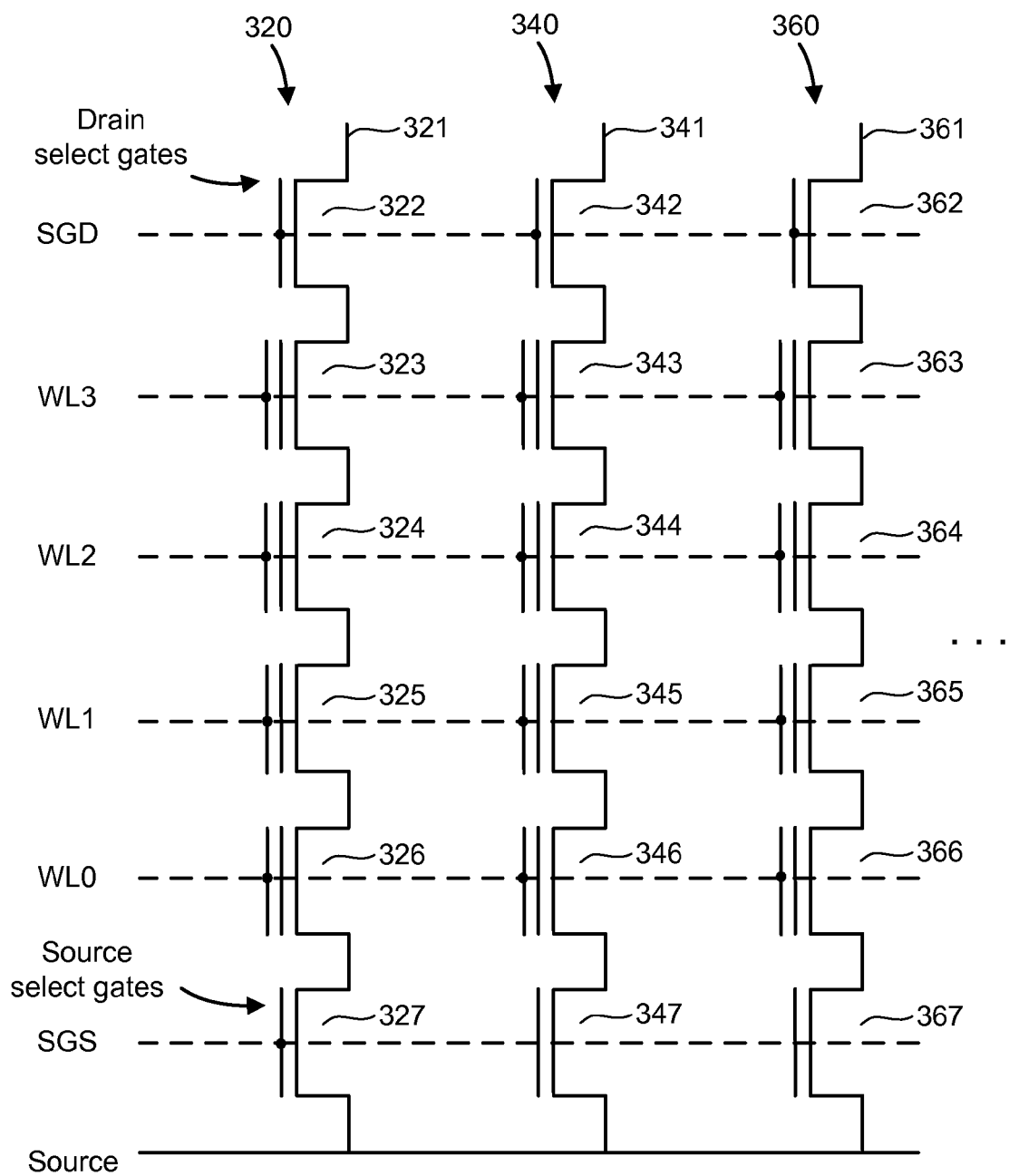
FIG. 2 is a circuit diagram depicting three NAND strings.

FIG. 2 is a circuit diagram depicting three NAND strings. A typical architecture for a flash memory system using a NAND structure will include many NAND strings. For example, three NAND strings 320, 340 and 360 are shown in a memory array having many more NAND strings. Each of the NAND strings includes two select gates and four storage elements. While four storage elements are illustrated for simplicity, NAND strings can have thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD. In other embodiments, the select lines do not necessarily need to be in common among the NAND strings; that is, different select lines can be provided for different NAND strings. WL3 is connected to the control gates for storage elements 323, 343 and 363. WL2 is connected to the control gates for storage elements 324, 344 and 364. WL1 is connected to the control gates for storage elements 325, 345 and 365. WL0 is connected to the control gates for storage elements 326, 346 and 366. As can be seen, each bit line and the respective NAND string comprise the columns of the array or set of storage elements. The word lines (WL3, WL2, WL1 and WL1) comprise the rows of the array or set. Each word line connects the control gates of each storage element in the row. Or, the control gates may be provided by the word lines themselves. For example, WL2 provides the control gates for storage elements 324, 344 and 364. In practice, there can be thousands of storage elements on a word line.

In some embodiments, the voltage applied to the bit line is greater than the voltage applied to source when reading a memory cell on the NAND string. In some embodiments, the voltage applied to the bit line is less than the voltage applied to source when reading a memory cell on the NAND string. For consistency of discussion, the source line will always be referred to as a source line regardless of whether the voltage applied to it is less than or greater than the voltage applied to the bit line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2, the program voltage will also be applied to the control gates of storage elements 344 and 364.

Figure 3:
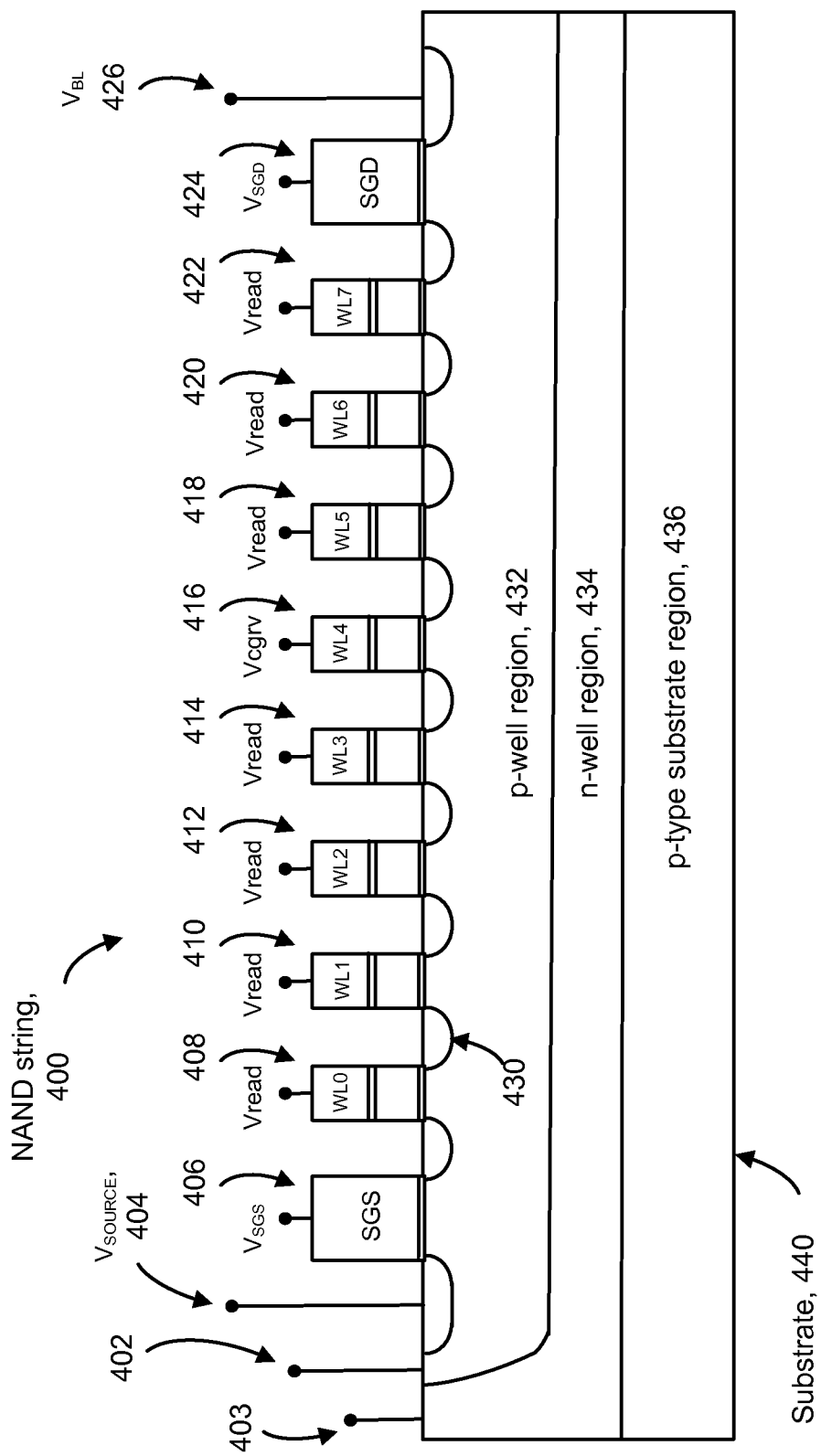
FIG. 3 depicts a cross-sectional view of a NAND string formed on a substrate.

FIG. 3 depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 440. A number of source/drain regions, one example of which is source/drain region 430, are provided on either side of each storage element and the select gates 406 and 424.

In one approach, the substrate 440 employs a triple-well technology which includes a p-well region 432 within an n-well region 434, which in turn is within a p-type substrate region 436. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages, such as body bias voltages, can also be applied to the p-well region 432 via a terminal 402 and/or to the n-well region 434 via a terminal 403. During a read or verify operation, a control gate voltage $V_{CGRV}$ is provided on a selected word line, in this example, WL4, which is associated with storage element 416. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{READ}$ is applied to the remaining word lines associated with NAND string 400. $V_{SGS}$ and $V_{SGD}$ are applied to the select gates 406 and 424, respectively.

Note that the direction current flow along the NAND string may depend on the relative magnitudes of $V_{SOURCE}$ to $V_{BL}$. For example, if $V_{BL}$ is greater than $V_{SOURCE}$, then the current may flow from the bit line to the source. In such an example, source/drain region 430 may serve as the drain of memory cell 408 and as the source of memory cell 410. However, if $V_{BL}$ is less than $V_{SOURCE}$, then the current may flow from the source line to the bit line. In such an example, source/drain region 430 may serve as the source of memory cell 408 and as the drain of memory cell 410. Thus, whether a source/drain region 430 functions as the source or as the drain of a given memory cell may depend on the relative magnitudes of $V_{SOURCE}$ to $V_{BL}$. As previously mentioned, the source line will be referred to herein as a source line regardless of whether $V_{SOURCE}$ is less than or greater than $V_{BL}$. Moreover, the voltage applied to the source line will be referred to herein as $V_{SOURCE}$ regardless of whether $V_{SOURCE}$ is less than or greater than $V_{BL}$.

Figure 4:
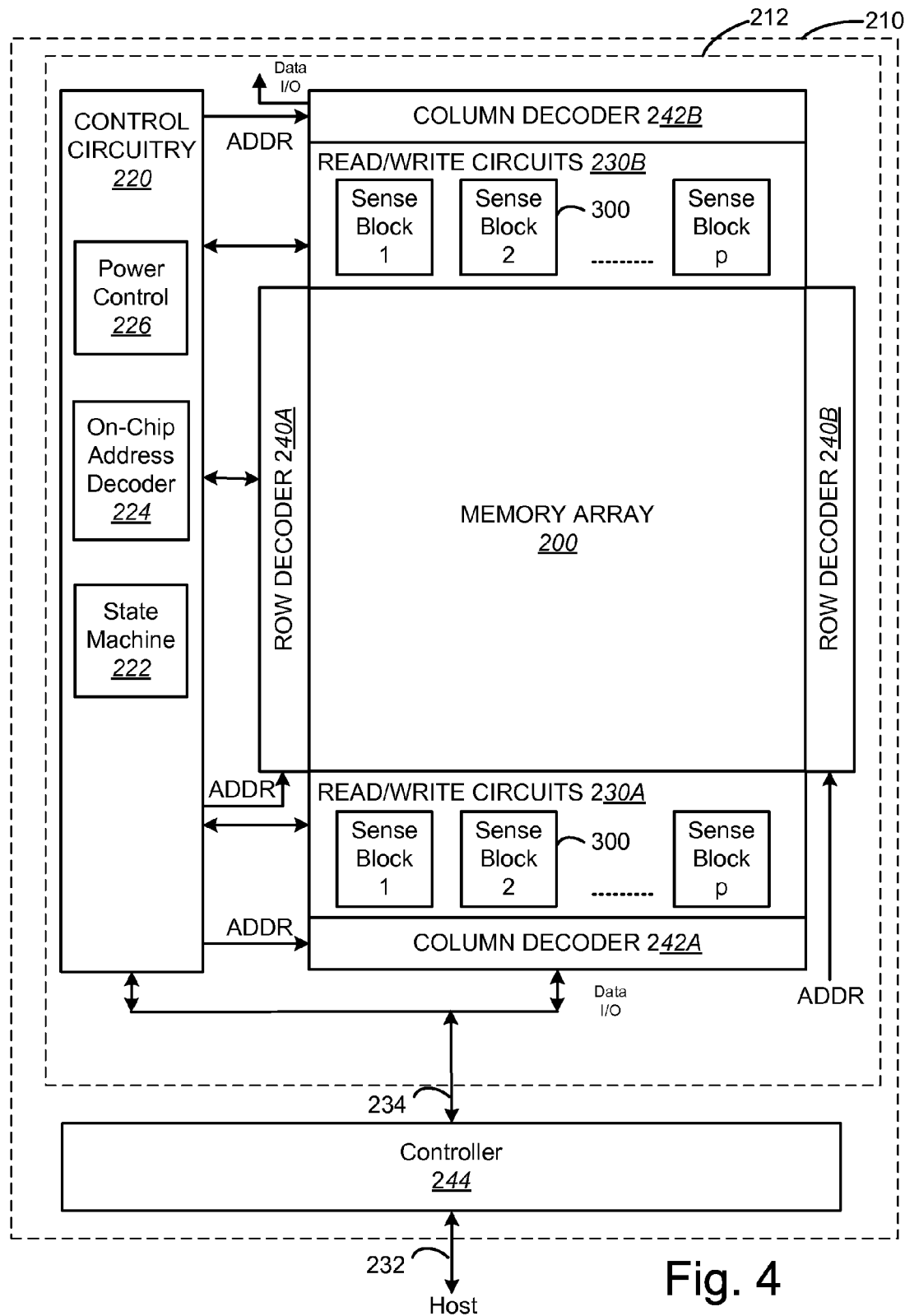
FIG. 4 illustrates a non-volatile storage device that may include one or more memory die or chips.

FIG. 4 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 5:
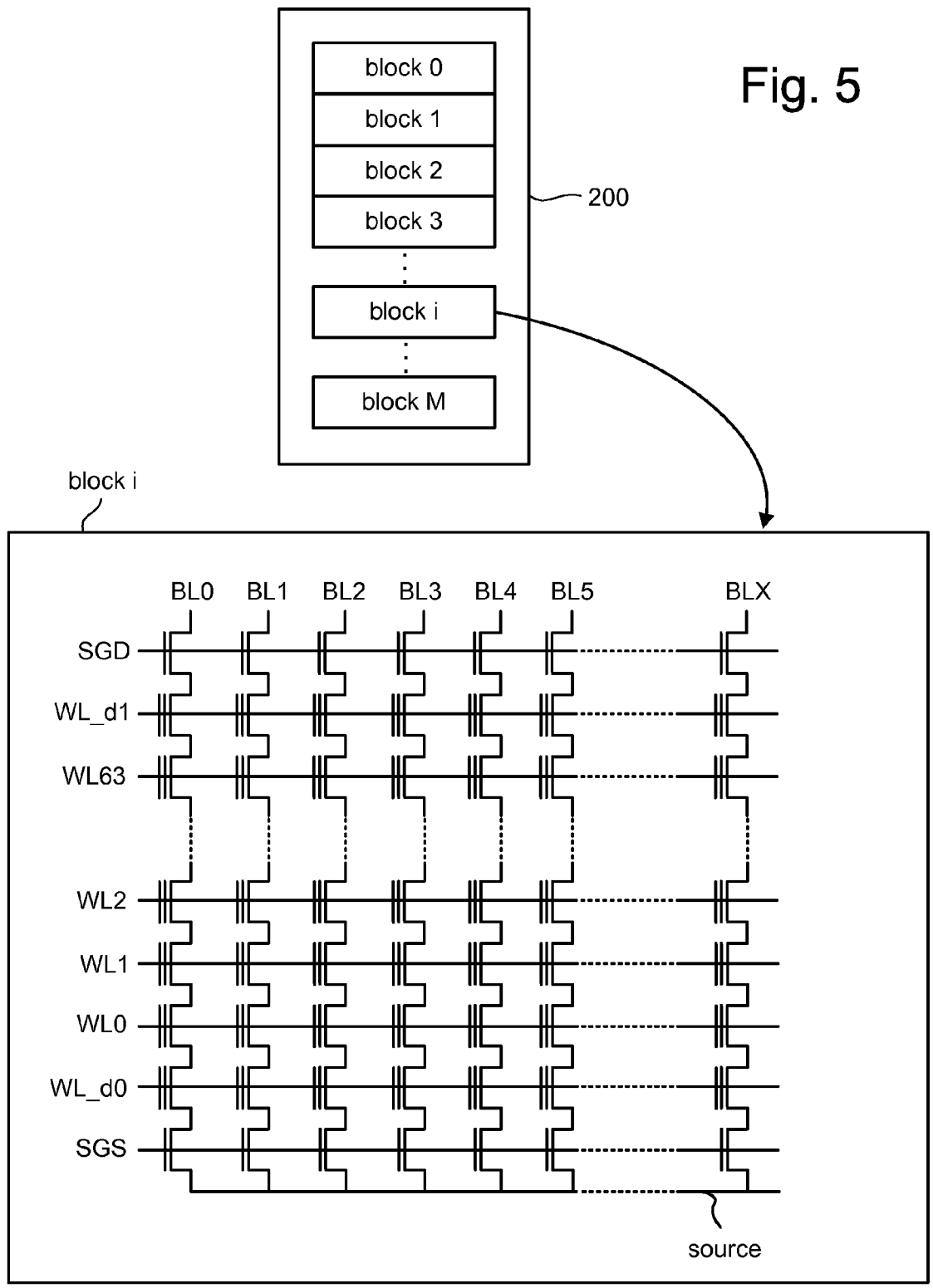
FIG. 5 depicts an exemplary structure of memory cell array.

FIG. 5 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5 also shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6:
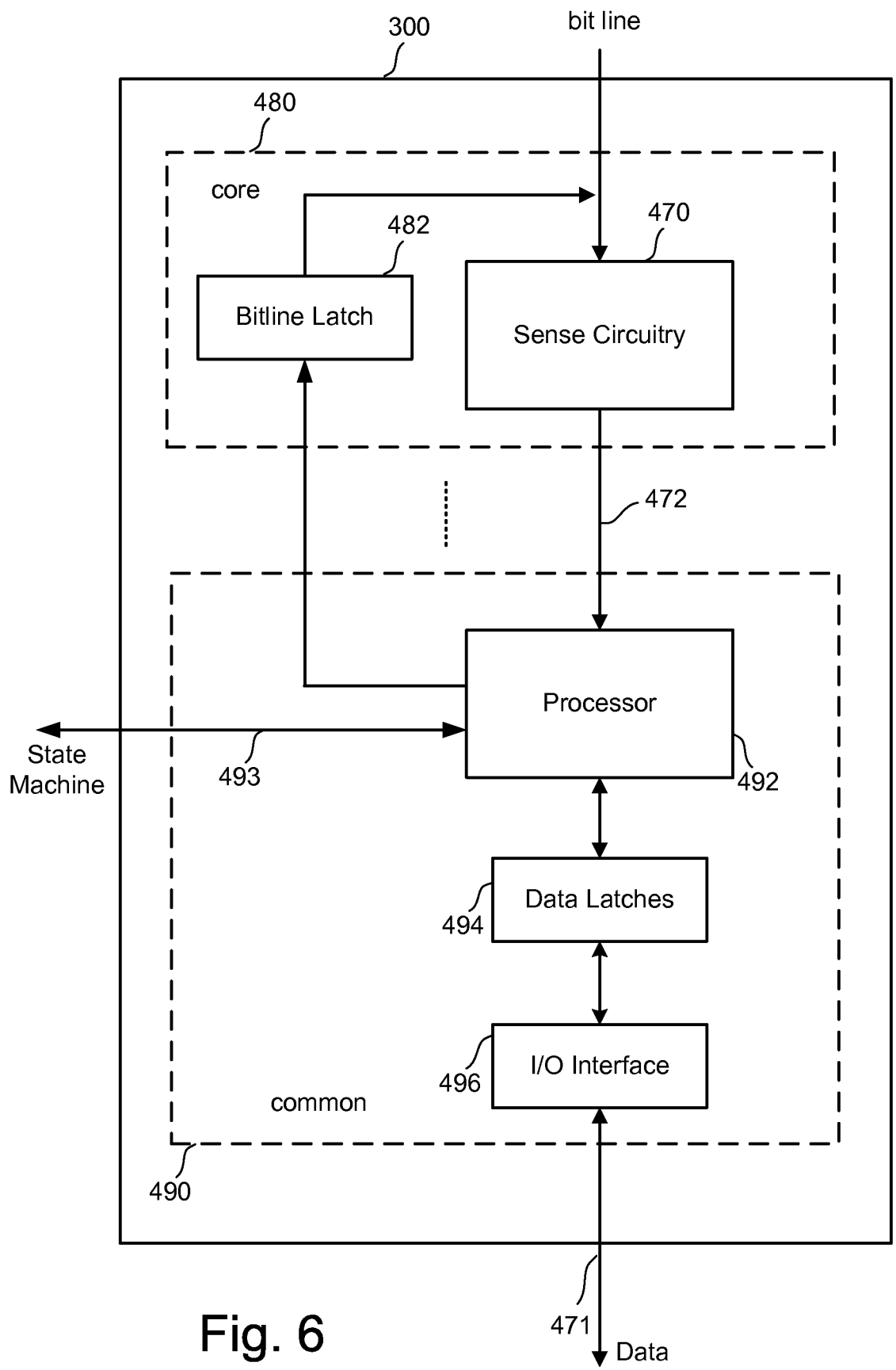
FIG. 6 is a block diagram of an individual sense block.

FIG. 6 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is herby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 471. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 471 during a program operation. The imported data bits represent write data meant to be programmed into the memory. I/O interface 496 provides an interface between data latches 494 and the data bus 471.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 6) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 471. The program operation, under the control of the state machine, comprises a series of programming voltage pulses (with increasing magnitudes) applied to the control gates of the addressed memory cells. Each programming pulse may be followed by a verify process to determine if the memory cell has been programmed to the desired state. Processor 492 monitors the verified memory state relative to the desired memory state. When the two are in agreement, processor 492 may set the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 471, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Figure 7A:
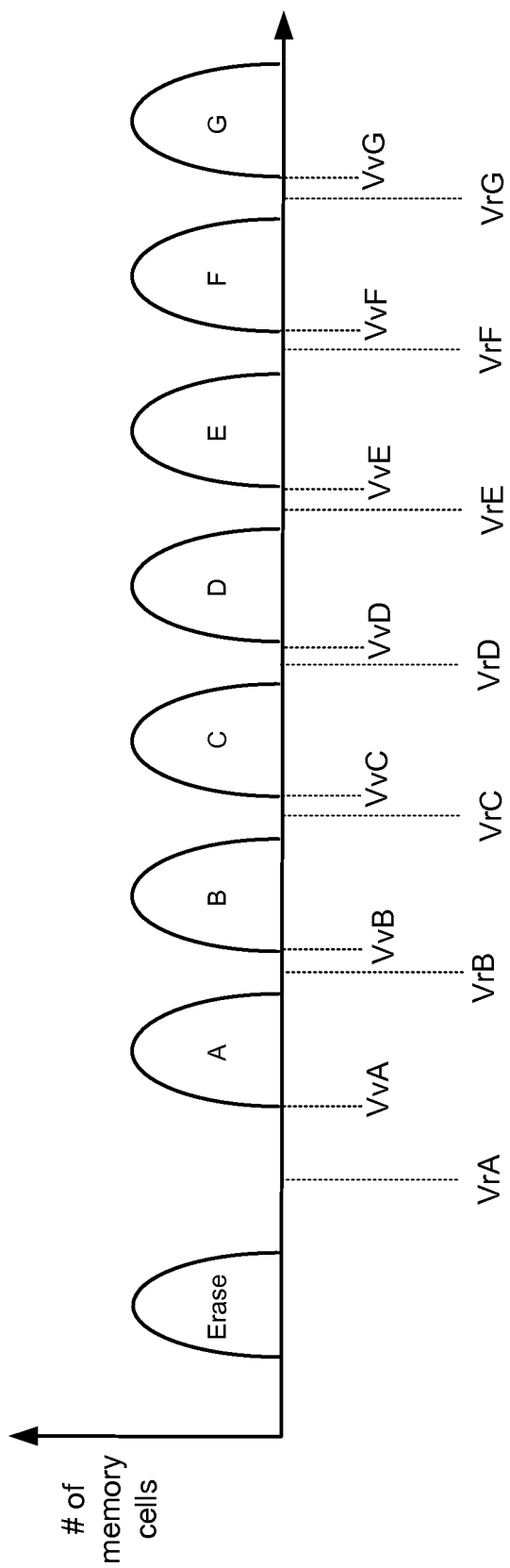
FIG. 7A depicts example threshold voltage distributions for states of memory cells in which there are eight states.

At the end of a successful programming process (with verification), the threshold voltages of the memory cells should be within one or more distributions of threshold voltages for programmed memory cells or within a distribution of threshold voltages for erased memory cells, as appropriate. FIG. 7A depicts example threshold voltage distributions for states of memory cells in which there are eight states. The eight data states include an erase state and states A-G. In this example, three bits may be stored per memory cell. Between each of the data states are read reference voltages used for reading data from memory cells. For example, FIG. 7A shows read reference voltage Vra between data states erase and A, and Vrb between data states A and B. By testing whether the threshold voltage of a given memory cell is above or below the respective read reference voltages, the system can determine what state the memory cell is in. At or near the lower edge of each data state are verify reference voltages. For example, FIG. 7A shows VvA for state A and VvB for state B, etc. When programming memory cells to a given state, the system will test whether those memory cells have a threshold voltage greater than or equal to the verify reference voltage.

Figure 7B:
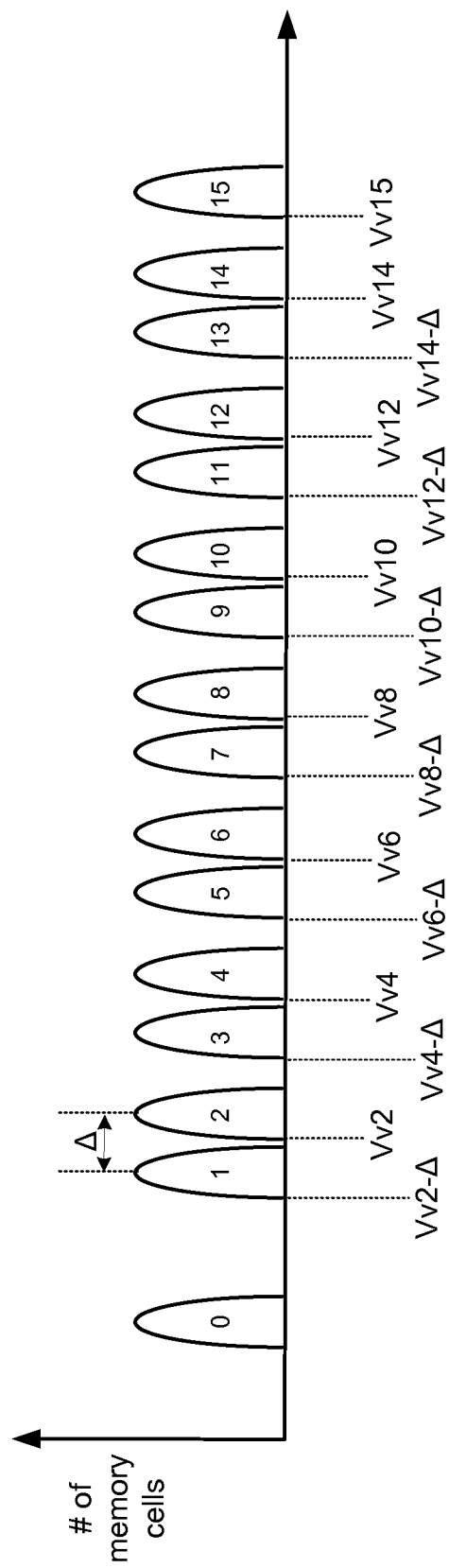
FIG. 7B illustrates example threshold voltage distributions corresponding to data states for the memory cell array when each memory cell stores four bits of data.

FIG. 7B illustrates example threshold voltage distributions corresponding to data states for the memory cell array when each memory cell stores four bits of data. Other embodiments, however, may use more or fewer than four bits of data per memory cell. FIG. 7B shows 16 threshold voltage distributions corresponding to data states 0-15. In the embodiment of FIG. 7B, the gap between at least some adjacent states is the same (e.g., Amv). For example, states 1 and 2 are relatively close together (separated by Amv), whereas states 2 and 3 are further apart. Moreover, in this embodiment, the gap between the verify level for states that are close together is the same. For example, the verify level for state 2 is Vv2 and the verify level for state 1 is Vv2-Δ. This is also true for other states. In one embodiment, states that are separated by A are verified together, which may save time. For example, states 0 and 1 are verified together, states 3 and 4 are verified together, etc. Note that it is not required that some adjacent states (e.g., states 2 and 3) be separated by a distance other than A. Also note that there may be a different number of data states. In some embodiments, the threshold voltages in state 0 are negative and the threshold voltages in the states 1-15 are positive. However, the threshold voltages in one or more of states 1-15 may be negative.

FIG. 8A depicts an example set of threshold voltage distributions for a four-state memory device in which each storage element stores two bits of data. A first threshold voltage distribution 700 is provided for erased (Erased-state) storage elements. Three threshold voltage distributions 702, 704 and 706 represent programmed states A, B and C, respectively. In one embodiment, the threshold voltages in the Erased-state are negative, and the threshold voltages in the A-, B- and C-states are positive.

Read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, verify reference voltages, Vva, Vvb, and Vvc are provided. When programming storage elements to the A-state, B-state or C-state, the system will test whether those storage elements have a threshold voltage greater than or equal to Vva, Vvb or Vvc, respectively. In one embodiment, "verify low" reference voltages, Vval, Vvbl, and Vvcl are provided. Similar "verify low" reference voltages could also be used in embodiments with a different number of states.

In full sequence programming, storage elements can be programmed from the Erased-state directly to any of the programmed states A, B or C. For example, a population of storage elements to be programmed may first be erased so that all storage elements in the population are in the Erased-state. A series of program pulses such as depicted in FIG. 8B is used to program storage elements directly into the A-, B- and C-states. While some storage elements are being programmed from the Erased-state to the A-state, other storage elements are being programmed from the Erased-state to the B-state and/or from the Erased-state to the C-state. Note that using a full sequence programming is not required.

One example of a slow programming mode uses low (offset) and high (target) verify levels for one or more data states. For example, VvaL and Vva are offset and target verify levels, respectively, for the A-state, and VvbL and Vvb are offset and target verify levels, respectively, for the B-state. During programming, when the threshold voltage of a storage element which is being programmed to the A-state as a target state (e.g., an A-state storage element) exceeds VvaL, its programming speed is slowed, such as by raising Vbl to a level, e.g., 0.6-0.8 V, which is between a nominal program or non-inhibit level, e.g., 0 V and a full inhibit level, e.g., 2-3 V. This provides greater accuracy by avoiding large step increases in threshold voltage. When the threshold voltage reaches Vva, the storage element is locked out from further programming. Similarly, when the threshold voltage of a B-state storage element exceeds VvbL, its programming speed is slowed, and when the threshold voltage reaches Vvb, the storage element is locked out from further programming. In one approach, a slow programming mode is not used for the highest state since some overshoot is typically acceptable. Instead, the slow programming mode can be used for the programmed states, above the erased state, and below the highest state.

Moreover, in the example programming techniques discussed, the threshold voltage of a storage element is raised as it is programmed to a target data state. However, programming techniques can be used in which the threshold voltage of a storage element is lowered as it is programmed to a target data state. Programming techniques which measure storage element current can be used as well. The concepts herein can be adapted to different programming techniques.

FIG. 8B depicts a series of program and verify pulses which are applied to a selected word line during a programming operation. A programming operation may include multiple programming iterations, where each iteration applies one or more program pulses (voltages) followed by one or more verify voltages, to a selected word line. In one possible approach, the program voltages are stepped up in successive iterations. Moreover, the program voltages may include a first portion which has a pass voltage (Vpass) level, e.g., 6-8 V, followed by a second portion at a program level, e.g., 12-25 V. For example, first, second, third and fourth program pulses 800, 802, 804 and 806 have program voltages of Vpgm1, Vpgm2, Vpgm3 and Vpgm4, respectively, and so forth. A set of one or more verify voltages may be provided after each program pulse. In some embodiments, a single verify pulse is used to verify memory cells being programmed to different states. For example, a single verify pulse Vverify may be used to verify whether memory cells that are targeted for the A-state have reached Vva, whether memory cells that are targeted for the B-state have reached Vba, and whether memory cells that are targeted for the C-state have reached Vvc. In some embodiments, there may be two or more verify pulses between the program pulses. For example, one pulse might be used to verify the A-state and the B-state, a second may be used to verify the C-state and a D-state, etc. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

In one embodiment, different voltages are applied between the gate and source of memory cells while reading or verifying memory cells. For example, in order to verify different threshold voltages during the same verify operation different voltages are applied between the gate and source of memory cells. As another example, in order to apply different amounts of compensation for cross-coupling effects different voltages are applied between the gate and source of memory cells. In one embodiment, a memory cell on one NAND string is tested to determine if its threshold voltage is at least at Vva at the same time that a memory cell on another NAND string is tested to determine if its threshold voltage is at least at Vvb. At this same time, a third memory cell on a third NAND string may be tested to determine whether its threshold voltage is above Vvc.

Applying Different Conditions to Different Selected Memory Cells

Figure 9A:
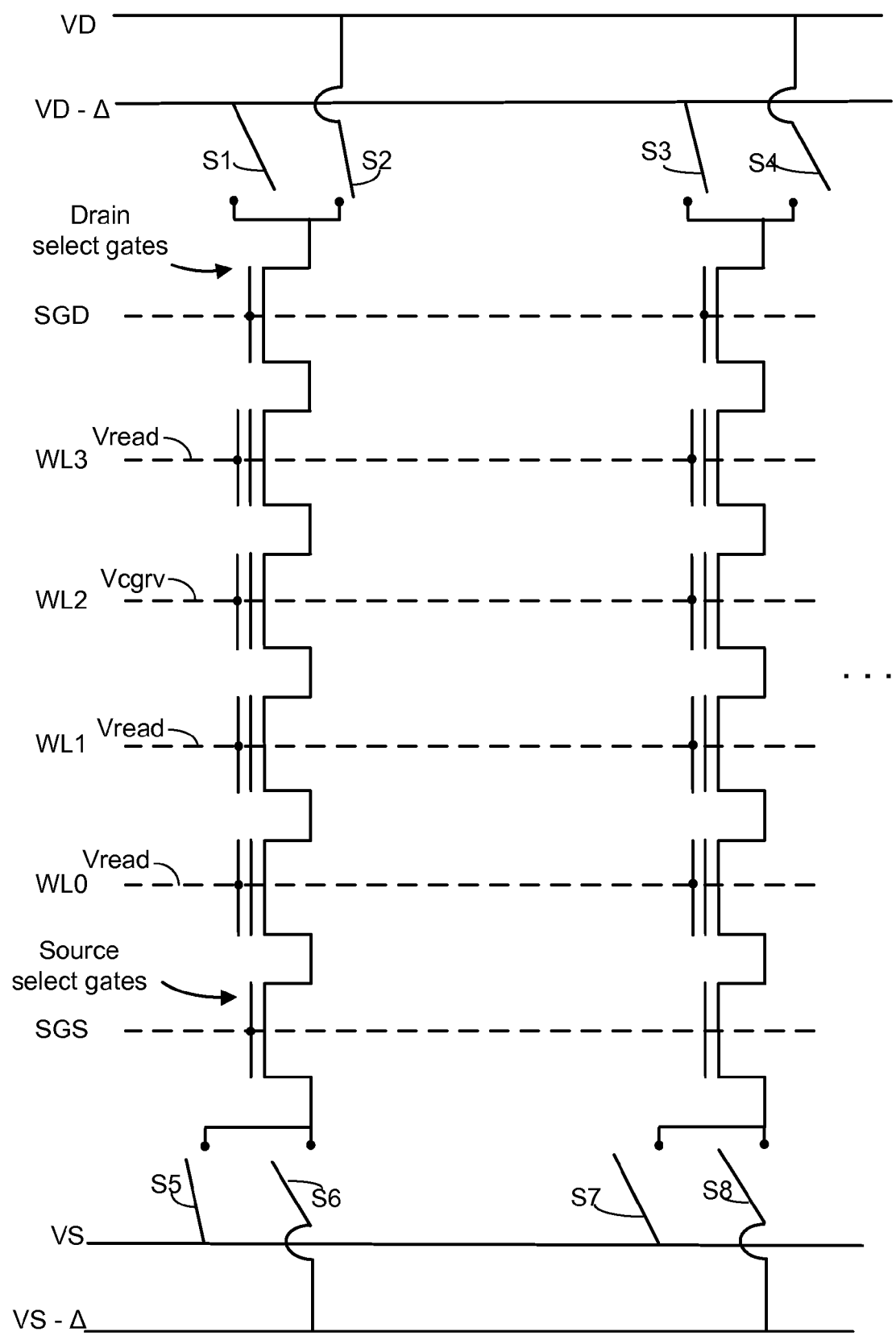
FIG. 9A is a schematic diagram of a circuit that is able to apply different gate-to-source voltages across a selected memory cell on different strings of memory cells.

FIG. 9A is a schematic diagram of a circuit that is able to apply different gate-to-source voltages across a selected memory cell on different strings of memory cells. The schematic will be used to explain principles of one embodiment. The voltage Vcgry may be applied to the selected word line (e.g., WL2), while Vread may be applied to unselected word lines. The circuit has switches S1-S8 for connecting voltages VD, VD−A, VS, and VS−A to the strings of memory cells. Note that there may be many more strings than two. Also note that in this example, the strings of memory cells are not connected by a common source line.

Switches S2 and S5 may be closed such that VD−VS appears across one string. Alternatively, switches 51 and S6 may be closed such that (VD−A)−(VS−A) or VD−VS appears across that string. Therefore, the Vds of the selected memory cell will be about the same with either switch configuration. However, Vgs will be Vcgry−VD for one and Vcgry−VD+Δ for the other. Therefore, Vgs can be altered without altering Vds. Switches S3, S4, S7, and S8 can be used in a similar manner for the other string of memory cells.

Therefore, a different Vgs can be applied to the strings while applying the same Vcgry to the selected word line. Consequently, two different threshold voltages can be tested for while applying the same Vcgrv to the selected word line.

Figure 9B:
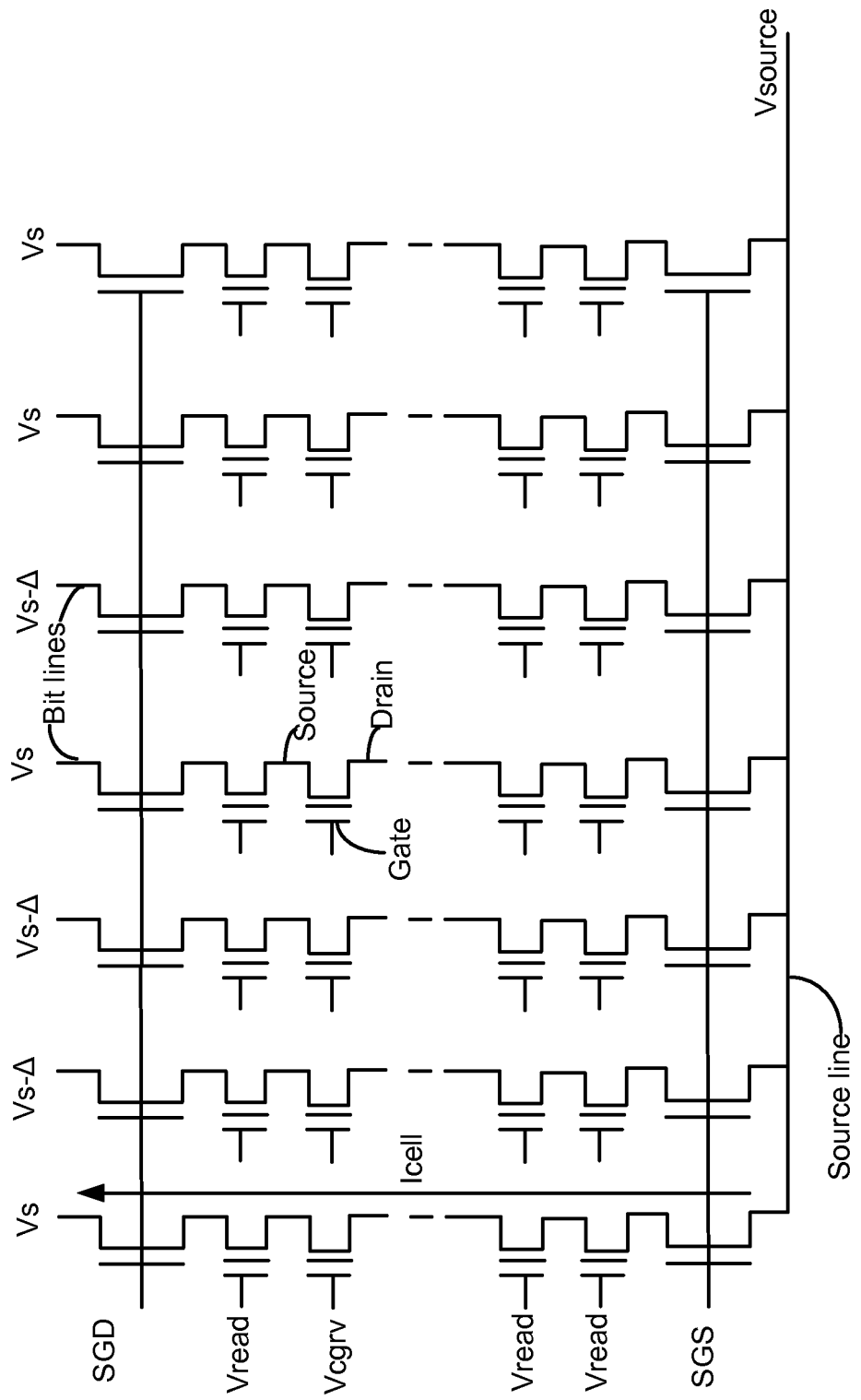
FIG. 9B is a schematic diagram of NAND strings that have different voltages applied across them during a read operation.

FIG. 9B is a schematic diagram of NAND strings that have different voltages applied across them during a read operation. This circuit may be used when verifying different threshold voltages for different memory cells on the same word line, for applying different amounts of cross coupling compensation to different memory cells on the same word line during a read or program verify, as examples. The circuit may have other uses that involve reading two different threshold voltages at the same time.

The NAND strings are electrically connected at one end by a common source line. At the other end, each NAND string is electrically connected to a separate bit line. The word lines that electrically connect gates of a row of memory cells are not shown so as to not obscure the diagram. The memory cells that are associated with the selected word line are selected for reading or verifying. That is, each of these memory cells is to have its threshold voltage compared to some reference voltage during a verify (or read) operation. Different memory cells may have their threshold voltages compared to at least two different reference voltages. For example, referring briefly to FIG. 8A, one memory cell has its threshold voltage compared to Vva, while another has its threshold voltage compared to Vvb. A third memory cell might have its threshold voltage compared to Vvc. If, for example, this is performed during the verify stage of programming the memory cells, then each memory cell can be verified at the same time. For example, referring to FIG. 8B, after each program pulse, a single verify signal (Vverify) is applied to the selected word line in order to test the threshold voltage of all the memory cells being programmed. Therefore, time can be saved in that fewer verify operations are used between program pulses. Furthermore, since fewer verify operations are required, power can be saved.

Referring again to FIG. 9B, a read reference voltage (e.g., Vcgrv) is applied to the selected word line while a read pass voltage (e.g., Vread) is applied to unselected word lines. Therefore, each of the selected memory cells has Vcgry applied to its gate. The read pass voltage (Vread) is a voltage level that should cause an unselected memory cell to turn on (e.g., to conduct a current) regardless of the state that it is programmed to. One group of memory cells have their bit lines biased to Vs and another group have their bit lines biased to Vs−Δ. For example, memory cells that are being tested for one threshold voltage have their bit lines biased to Vs, whereas memory cells that are being tested for a different threshold voltage have their bit lines biased to Vs−Δ. Note that still other memory cells could be tested for still another threshold voltage by applying still another voltage to their bit lines. In this embodiment, a voltage Vsource is applied to the common source line. The voltage Vsource is larger than the voltages applied to the bit lines. Therefore, the conduction current (Icell) flows from the source line to the bit line. In effect, the bottom of the memory cells functions as the drain and the top of the memory cells functions as the source. The gate, source and drain of one of the selected memory cells have been labeled. Note that a selected memory cell will turn on if its threshold voltage is equal to or less than the gate to source voltage. Also note, that as previously mentioned, for consistency in description the line the joins the NAND strings together at the bottom of FIG. 9B will be referred to as a common source line even though the bottom of the memory cells are functioning as a drain. In one embodiment, the Vt of the cell is measured depending on both Vgs and Vds of the voltage bias. Note that if Δ is relatively small, then Vds of memory cells on the bit lines having Vs applied will be very close to Vds of the bit lines having Vs−Δ applied.

Figure 9C:
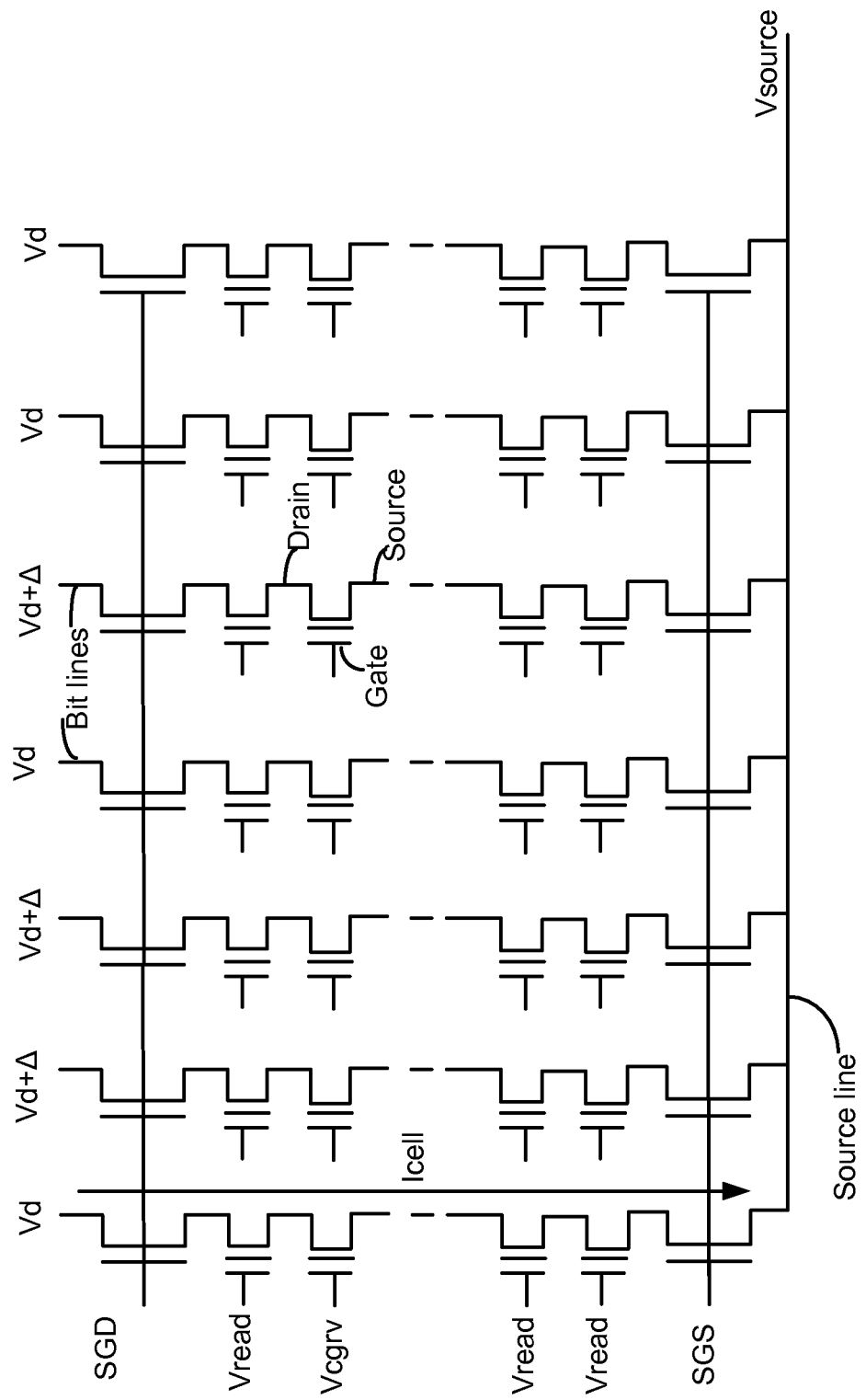
FIG. 9C is a schematic diagram of NAND strings that have different voltages applied across them during a verify (or read) operation.

FIG. 9C is a schematic diagram of NAND strings that have different voltages applied across them during a verify operation. This circuit may be used when verifying different threshold voltages for different memory cells on the same word line, for applying different amounts of cross coupling compensation to different memory cells on the same word line during a read or program verify, as examples. The circuit may have other uses that involve reading two different threshold voltages at the same time. The structure is similar to the one of FIG. 9B. However, the voltages applied to the bit lines are higher than the voltage applied to the common source line. Therefore, the top of the selected memory cell functions as the drain and the bottom of the selected memory cell functions as the source. The conduction current flows from the bit line to the source line in this embodiment. A read reference voltage (Vcgrv) is applied to the selected word line while a read pass voltage (Vread) is applied to unselected word lines. One of the selected memory cells has its gate, source, and drain labeled. Note that the drain and source are switched compared to FIG. 9B due to the way in which voltages are being applied across the NAND strings.

One group of memory cells have their bit lines biased to Vd, whereas another group of memory cell have their bit lines biased to Vd+Δ. For example, memory cells that are being tested for one threshold voltage have their bit lines biased to Vd, whereas memory cells that are being tested for a different threshold voltage have their bit lines biased to Vd+Δ. Note that in this example, each memory cell on the selected word line experiences the same gate to source voltage. That is, all selected memory cells have the same gate voltage and the NAND strings are joined by the common source line. However, their drain to source voltages may be different due to the different voltages applied to the bit lines. The Vt of the cell is measured depending on Vds of the voltage bias.

Note that a memory cell's threshold voltage may be a function of the drain voltage. For example, the phenomena referred to as drain induced barrier lowering (DIBL) may alter a field effect transistor's (FET) threshold voltage. For some devices, an increase in drain voltage decreases threshold voltage. For some devices, an increase in the drain voltage increases the depletion region which has the effect of lowering the threshold voltage.

In one embodiment, some bit lines have a voltage applied that causes little or no DIBL to the selected memory cell. Such memory cells will turn on if their threshold voltage is less than Vgs. However, other bit lines have a greater voltage applied thereto, which causes sufficient DIBL to effectively lower the threshold voltage of the selected memory cell. Therefore, those memory cells may turn on even if their actual threshold voltage is slightly less than Vgs.

The following example will be used to illustrate. Some memory cells may be tested to determine whether their threshold voltage is less than 3.0V and others may be tested to determine whether their threshold voltage is less than 3.5V. A voltage of 3.0V may be applied to the selected word line and a read pass voltage to unselected word lines. The common source line may be grounded. The bit lines of memory cells that are being tested for a threshold voltage of 3.0V are biased to a voltage that is intended to cause little or no DIBL. The bit lines of memory cells that may be being tested for a threshold voltage of 3.5V may be biased to a voltage that is intended to cause an amount of DIBL to lower the threshold voltage by about 0.5V, at least under the assumption that their threshold voltage without DIBL is near 3.5V. Therefore, the memory cells being tested for a threshold voltage of 3.5V will turn on if their threshold voltage is below 3.5V, but will not turn on if their threshold voltage is above 3.5V, given that 3.0V is applied to the selected word line. Note that other memory cells could be tested for still another threshold voltage by applying a different voltage to the bit line to cause a different shift in threshold voltage due to DIBL.

Figure 10:
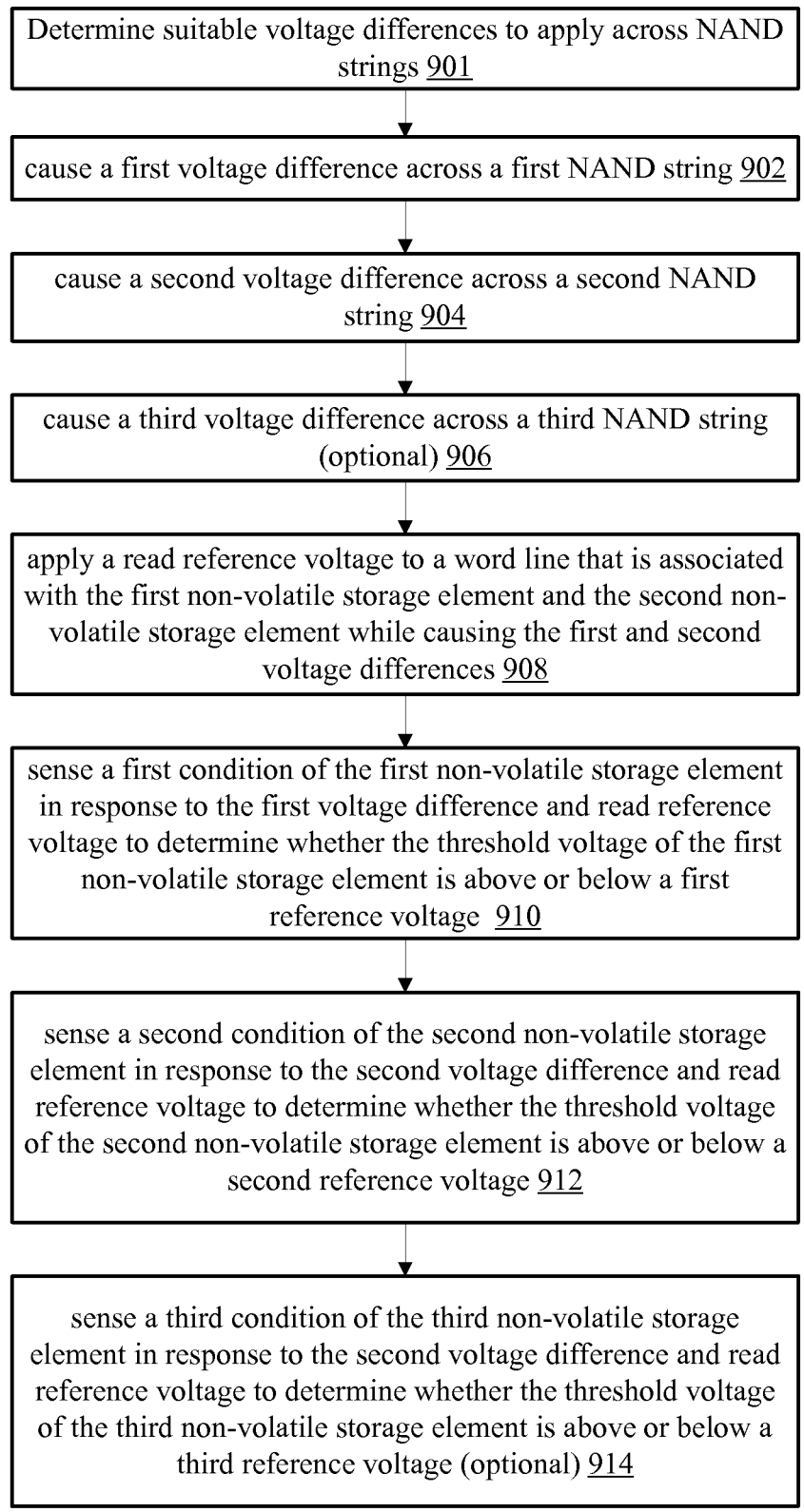
FIG. 10 is a flowchart of one embodiment of a process of sensing conditions of memory cells in different NAND strings by applying different voltages across different NAND strings.

FIG. 10 is a flowchart of one embodiment of a process of sensing conditions of memory cells in different NAND strings by applying different voltages across different NAND strings. Note that in one embodiment, the different voltages across the NAND strings cause a different Vgs for different memory cells being verified or read. Note that in another embodiment, the different voltages across the NAND strings cause a different Vds for different memory cells being verified or read. FIG. 10 will be discussed while referring to the example circuits of FIGS. 9B and 9C, as either of those circuits may be used. However, the process of FIG. 10 is not limited to those circuits.

In step 901, a suitable voltage to apply across is NAND string is determined. In one embodiment, this amounts to determining whether to apply Vs or Vs−Δ to a given bit line. In one embodiment, this amounts to determining whether to apply Vd or Vd+Δ to a given bit line. Note that three or more different voltages could be applied across the NAND strings. Further details of determining a suitable voltage difference are discussed below.

In step 902, a first voltage difference is caused across a first NAND string. For example, Vs is applied to the bit line while a voltage greater than Vs is applied to the source line. Therefore, the conduction current (if any) may flow from source line to bit line. As another example, Vd is applied to the bit line while a voltage less than Vd (e.g., ground) is applied to the source line. Therefore, the conduction current (if any) may flow from bit line to the source line. In one embodiment, the first NAND string has a memory cell that is being verified at a first threshold level. For example, a determination is being made whether its threshold voltage is greater than Vva.

In 904, a second voltage difference is caused across a second NAND string. For example, Vs−Δ is applied to the bit line while a voltage greater than Vs−Δ is applied to the source line. Since the source line is common for all bit lines, the source line voltage will be same as in step 902. As another example, Vd+Δ is applied to the bit line while a voltage less than Vd+Δ (e.g., ground) is applied to the source line. In one embodiment, the second NAND string has a memory cell that is being verified at a second threshold level. For example, a determination is being made whether its threshold voltage is greater than Vvb.

In optional step 906, a third voltage difference is caused across a third NAND string. For example, Vs−2Δ is applied to the bit line while a voltage greater than Vs−2Δ is applied to the source line. As another example, Vd+2Δ is applied to the bit line while a voltage less than Vd+2Δ (e.g., ground) is applied to the source line. In one embodiment, the third NAND string has a memory cell that is being verified at a third threshold level. For example, a determination is being made whether its threshold voltage is greater than Vvc.

Steps 902, 904, and 906 may be performed together. Note that there may be thousands of selected memory cells along the selected word line. Therefore, step 902 may be applied to many different NAND strings at the same time. Likewise, steps 904 and 906 (if performed) may be performed on many different NAND strings.

In step 908, a read reference voltage is applied to a selected word line while causing the first and second voltage differences. For example, Vcgry may be applied to the selected word line while Vsource is applied to the common source line and either Vs or Vs−Δ is applied to the bit line. Alternatively, Vcgry may be applied to the selected word line while Vsource is applied to the common source line and either Vd or Vd−Δ is applied to the bit line. Therefore, a single reference voltage may be applied to the gates of the selected memory cells.

In step 910, a first condition of the first non-volatile storage element is sensed in response to the first voltage difference and read voltage to determine whether the threshold voltage of the first non-volatile storage element is above or below a first reference voltage. For example, the conduction current of a memory cell is sensed to determine whether the threshold voltage is greater than Vva.

In step 912, a second condition of the second non-volatile storage element is sensed in response to the second voltage difference and read voltage to determine whether the threshold voltage of the second non-volatile storage element is above or below a second reference voltage. The second reference voltage may be different from the first reference voltage. For example, the conduction current of a memory cell is sensed to determine whether the threshold voltage is greater than Vvb. Note that it is not required that the first and second reference voltages are verify levels. For example, the first reference voltage might be Vva+Δ and the second reference voltage might be Vva−Δ. Also note that it is not required that the first and second reference voltages be different. For example, the process of FIG. 10 may be used to apply different amounts of cross-coupling compensation. In this case, the first and second reference voltages may be the same. For example, the process could test for whether the threshold voltage of two different memory cells is greater than Vva while applying a different amount of cross-coupling compensation to each the memory cells.

In optional step 914, a third condition of the third non-volatile storage element is sensed in response to the third voltage difference and read voltage to determine whether the threshold voltage of the third non-volatile storage element is above or below a third reference voltage. In one embodiment, the third reference voltage is different from both the first and second reference voltages. For example, the conduction current of a memory cell is sensed to determine whether the threshold voltage is greater than Vvc.

Figure 11A:
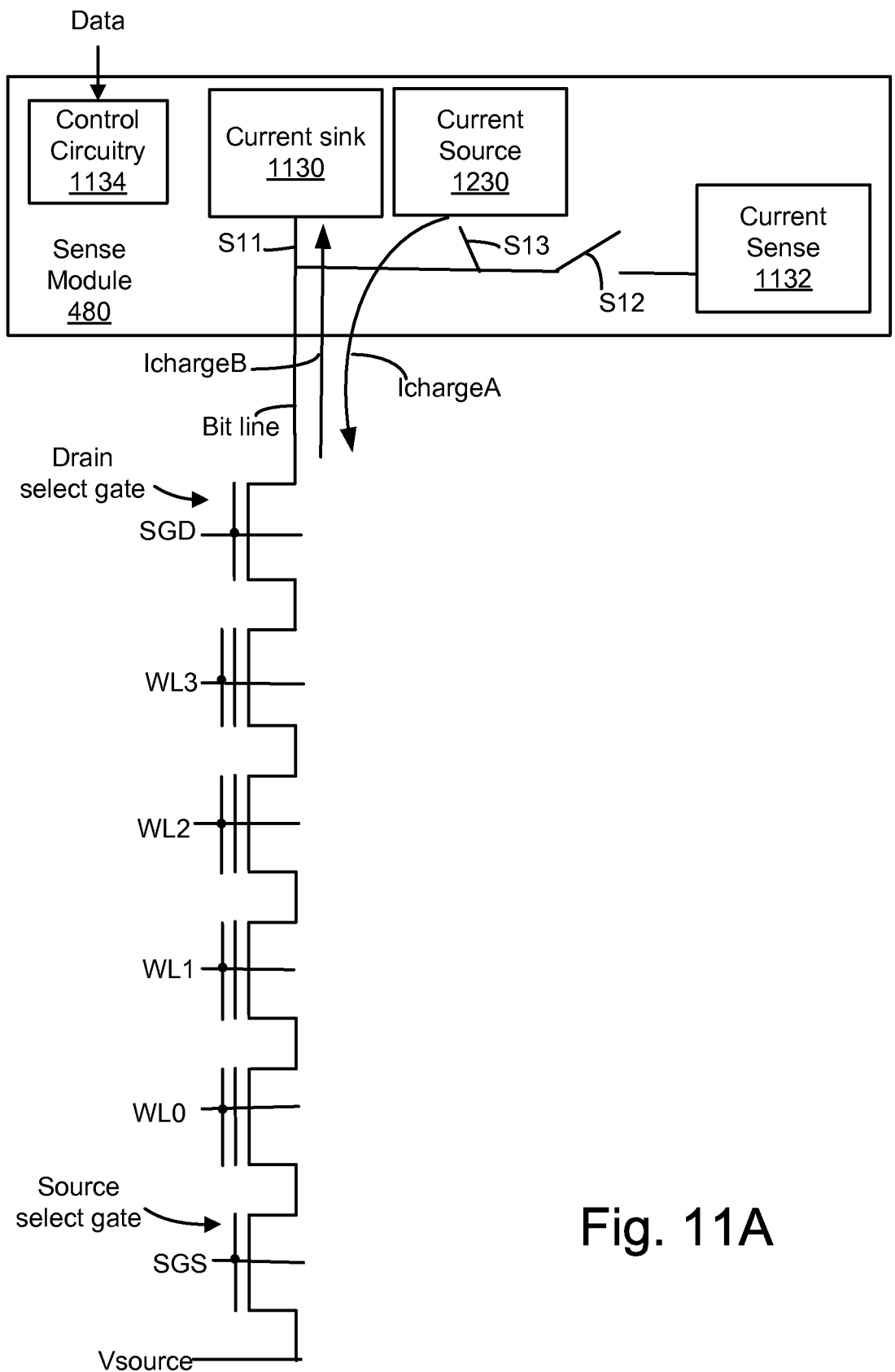
FIG. 11A is a block diagram of one embodiment of a sense module for charging a bit line to a voltage that is lower than the source line voltage.

FIG. 11A is a block diagram of one embodiment of a sense module 480 for charging a bit line to a voltage that is lower than the source line voltage. The sense module 480 may be used when implementing any of steps 902, 904, or 906 from FIG. 10. For example, the sense module 480 may be used to establish a certain voltage on the bit line. Another circuit (not depicted in FIG. 11A) may establish a certain voltage on the source line. Therefore, the sense module 480 may be used to create a certain voltage difference across a NAND string. The voltage on the bit line may be less than the source line voltage. The sense module 480 could be used to establish Vs and Vs−Δ for the example circuit of FIG. 9B.

Figure 11B:
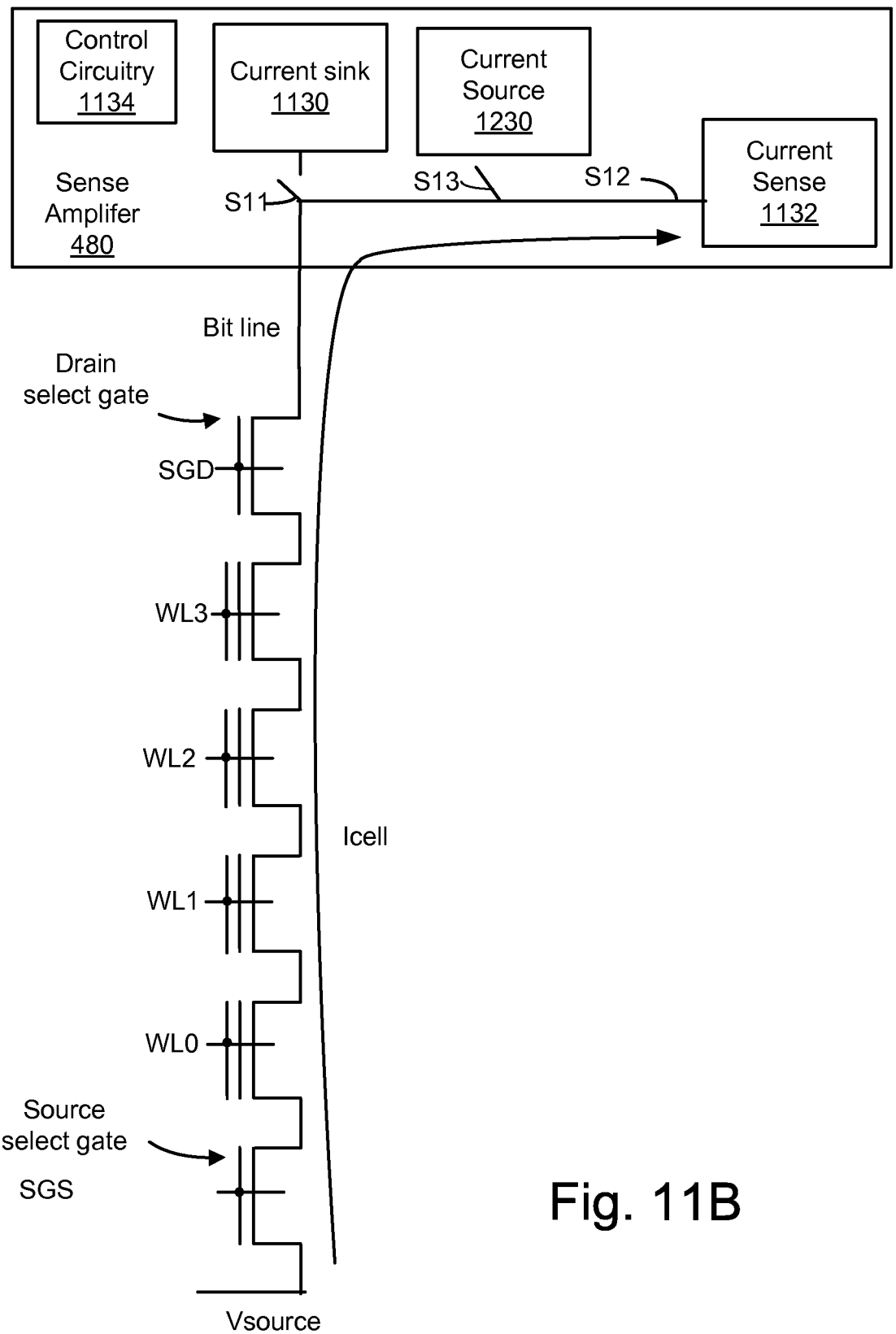
FIG. 11B is a block diagram the sense module of FIG. 11A showing the direction of current when sensing a memory cell's threshold voltage.
Figure 24:
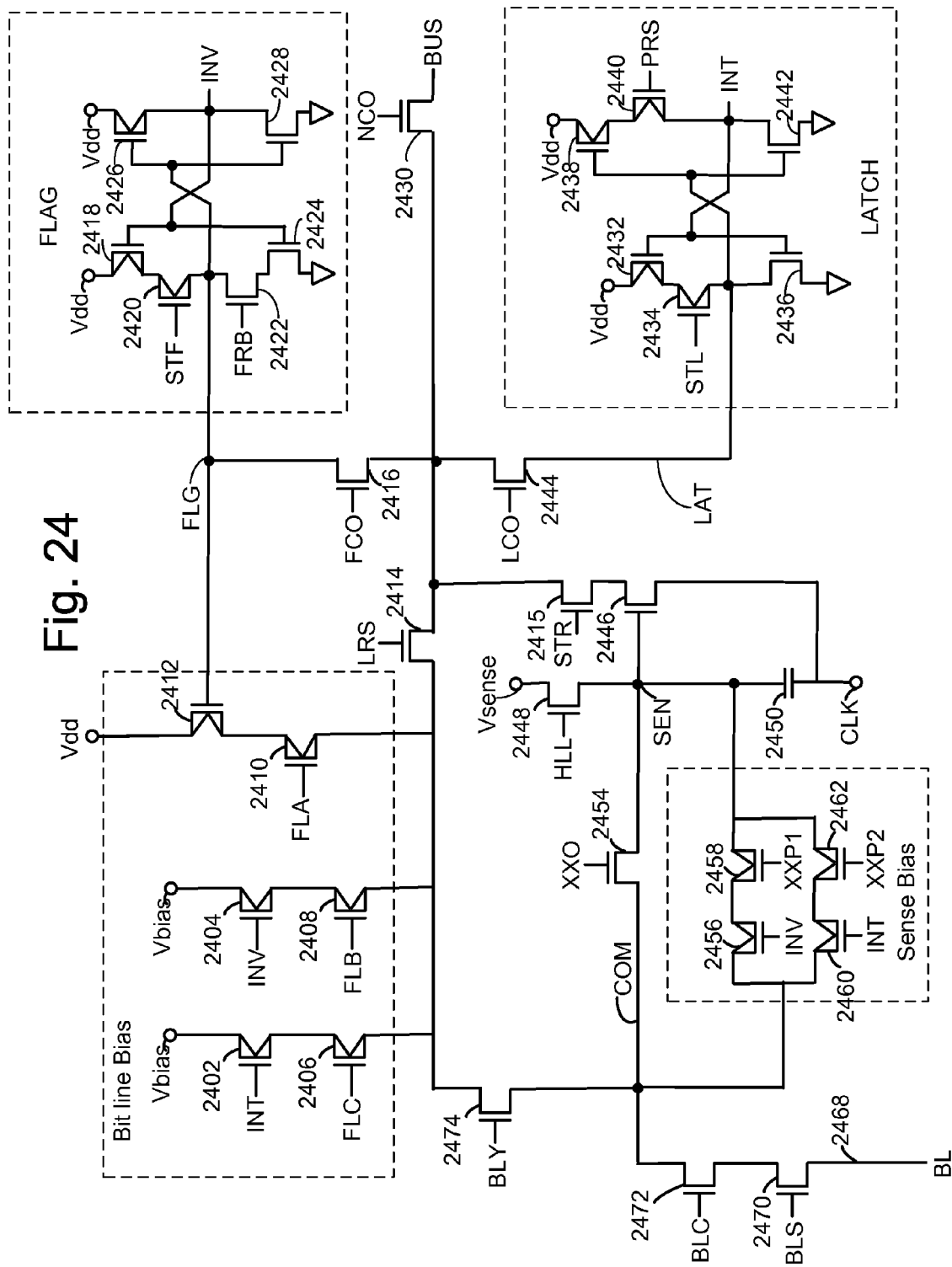
FIG. 24 depicts one embodiment of a sensing circuit.

The sense module 480 has a current sink 1130, current source 1230, current sense 1132, and control circuitry 1134. Current sink 1130 may be used for reverse sensing and may include 1 to n different bit line voltage setups to apply different voltages to the bit line. Current source 1230 may be used for forward sensing and may also include 1 to n different voltage setups to apply different voltages to the bit line. The control circuit 1134 controls switch S11 connects the current sink 1130 to the bit line. The control circuit 1134 controls switch S13 connects the current source 1230 to the bit line. The control circuit 1134 controls switch S12 to connect the current sense 1132 to the bit line. In one embodiment, the control circuitry 1134 connects the current sink 1130 to the bit line to sink IchargeB to reduce the voltage to a target voltage. The current sense is one implementation of sense circuitry 470 of the sense module of FIG. 6. The circuit of FIG. 24 provides further details. Other implementations are possible. FIG. 11B is a block diagram the sense module 480 of FIG. 11A showing the direction of current when sensing a memory cell's threshold voltage.

The control circuit 1134 receives data, which is used to determine what voltage level the bit line should be charged to. In one embodiment, the data is based on the reference level is being verified. For example, the data might indicate whether Vva, Vvb, Vvc or another reference level is being verified. In one embodiment, the data is based on the amount of cross-coupling compensation that is desired. For example, the data might indicate whether a low or high amount of compensation is desired. In one embodiment, the cross-coupling compensation is based on a neighbor memory cell's Vt. In one embodiment, the cross-coupling compensation is based on the state to which neighbor memory cell is being programmed. Therefore, the data may indicated the neighbor's actual or intended data state, which based on the Vt. Further details are discussed below. In one embodiment, the data is based on a previous reading of the memory cell being read. For example, the data could indicate whether the memory cell was previously determined to have a threshold voltage above/below a target Vt.

Figure 12A:
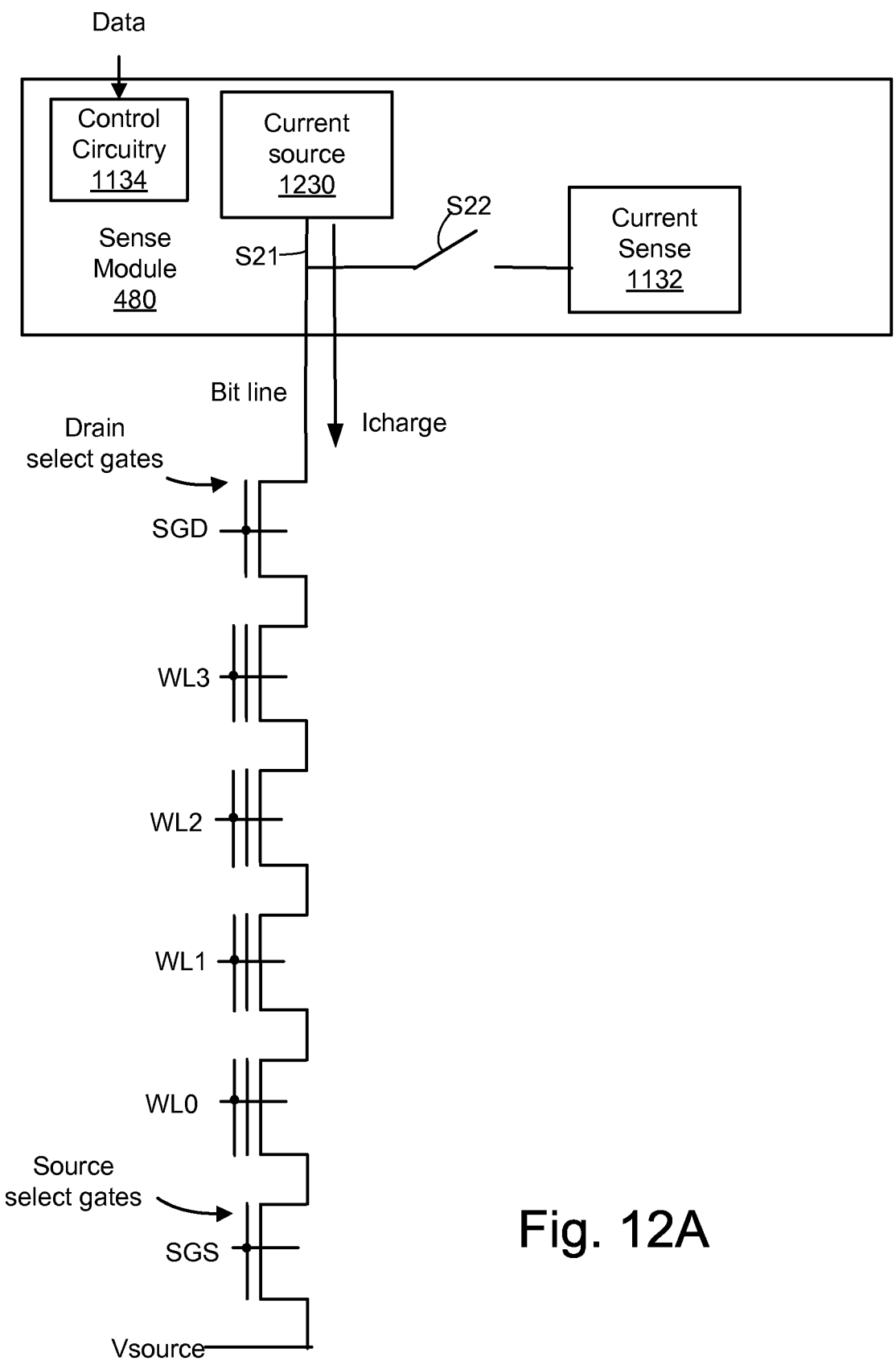
FIG. 12A is a block diagram of one embodiment of a sense module for charging a bit line to a voltage that is higher than the source line voltage.
Figure 12B:
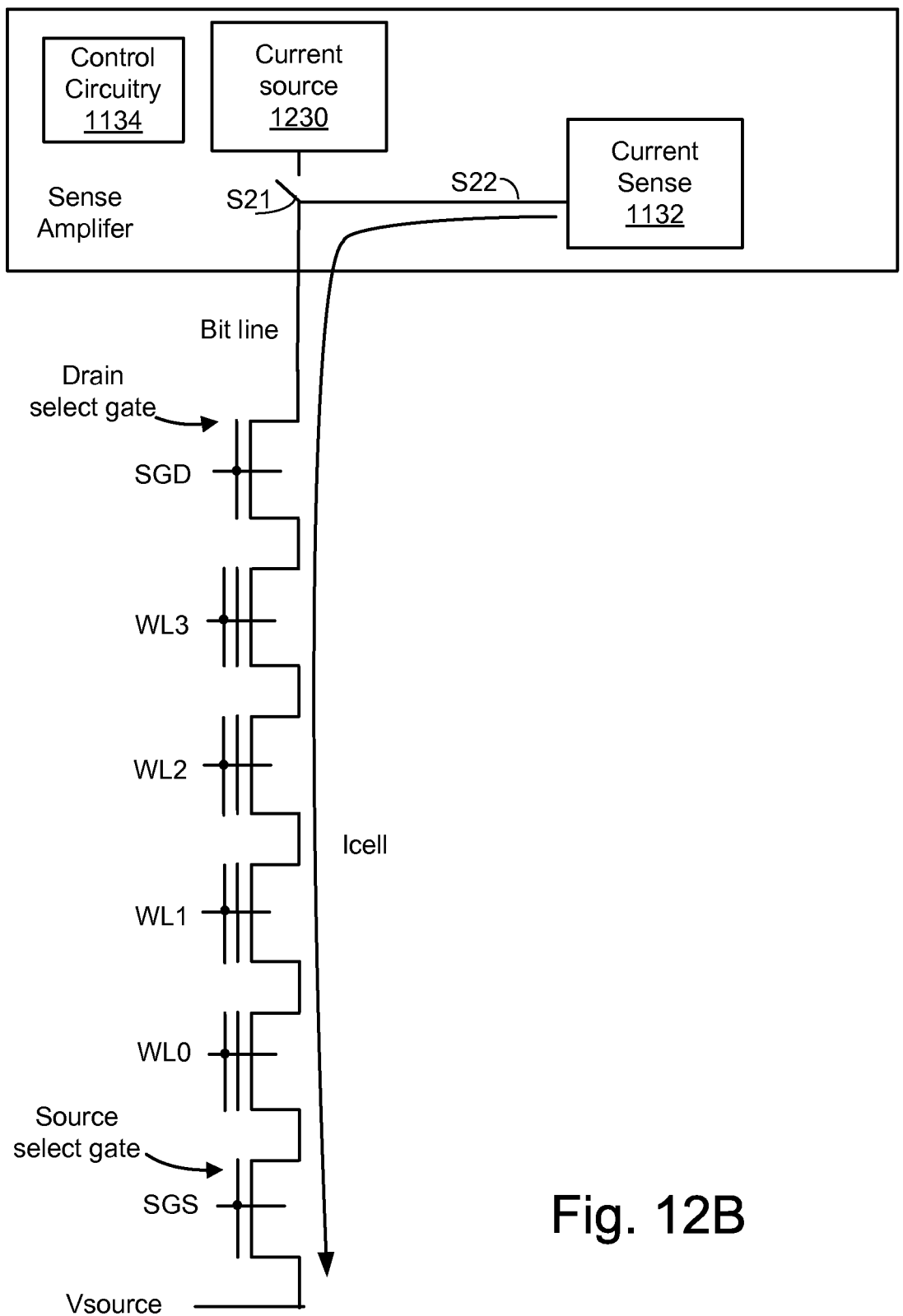
FIG. 12B is a block diagram the sense module of FIG. 12A showing the direction of current when sensing a memory cell's threshold voltage.

FIG. 12A is a block diagram of one embodiment of a sense module 480 for charging a bit line to a voltage that is higher than the source line voltage. The sense module 480 may be used when implementing any of steps 902, 904, or 906 from FIG. 10. For example, the sense module 480 may be used to create a certain voltage difference across a NAND string. The sense module 480 has a current source 1230, and current sense 1132. Switch S21 connects the current source 1230 to the bit line. Switch S22 connects the current sense 1132 to the bit line. FIG. 12B is a block diagram the sense module 480 of FIG. 12A showing the direction of current when sensing a memory cell's threshold voltage. As with the circuit of FIG. 11A, the control circuit 1134 receives data, which is used to determine to which voltage level the bit line should be charged. The sense module 480 could be used to establish Vd and Vd+Δ for the example circuit of FIG. 9C.

Figure 13A:
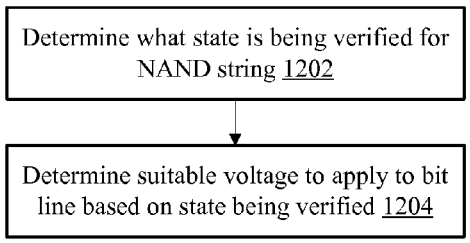
FIG. 13A is a flowchart of one embodiment of a process of determining a suitable voltage to apply across a NAND string based on the state being verified.

FIG. 13A is a flowchart of one embodiment of a process of determining a suitable voltage to apply across a NAND string based on the state being verified. The process is one embodiment of step 901 of FIG. 10. This process can be performed for every memory cell that is being verified. In step 1202, a determination is made as to which state is being verified. In one embodiment, a latch that is connected to the sense module 480 holds data that indicates what state the selected memory cell is being programmed to. This latch may maintain this value at least as long as the memory cell is being programmed such that its value can be used to determine the verify level. In one embodiment, the data from this latch is the data that is input to control circuitry 1134 of either FIG. 11A or 12A.

In step 1204, a suitable voltage is determined to apply to the bit line based on the state being verified. In one embodiment, the control circuitry 1134 determines the appropriate voltage to apply to the bit line. Note that in this embodiment it is assumed that all memory cells are connected by a common source line. Therefore, determining a voltage to apply to the bit line, in effect, determines a voltage to apply across the NAND strings. Further details of one embodiment of determining and controlling the bit line voltage are described below.

Figure 13B:
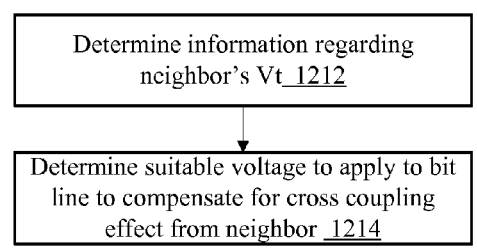
FIG. 13B is a flowchart of one embodiment of a process of determining a suitable voltage to apply across a NAND string to compensate for cross-coupling during read.

FIG. 13B is a flowchart of one embodiment of a process of determining a suitable voltage to apply across a NAND string to compensate for cross-coupling during read. The process is one embodiment of step 901 of FIG. 10. In this embodiment, the determination is based on the threshold voltage of a neighbor memory cell. This process can be performed for every memory cell that is being read. In step 1212, a determination is made as to the threshold voltage or state of the neighbor memory cell. In one embodiment, the neighbor memory cell is read to gain some information about its Vt. It is not required to know the exact state of the neighbor memory cell. Further details are discussed below. In one embodiment, some indication of the neighbor's threshold voltage is the data that is input to control circuitry 1134 of either FIG. 11A or 12A.

In step 1214, a suitable voltage is determined to apply to the bit line to compensate for cross-coupling due to the neighbor's Vt. In one embodiment, the control circuitry 1134 determines the appropriate voltage to apply to the bit line. For example, the input data might be whether the neighbor's threshold voltage is "high" or "low." If it is high, then a first voltage is to be applied to the bit line to achieve a first amount of compensation for cross-coupling. If it is low, then a second voltage is to be applied to the bit line to achieve a second amount of compensation for cross-coupling.

Figure 13C:
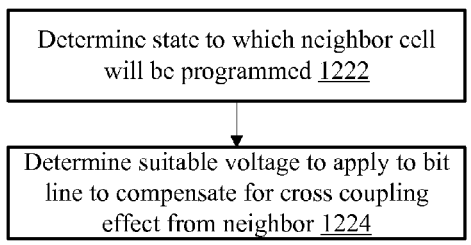
FIG. 13C is a flowchart of one embodiment of a process of determining a suitable voltage to apply across a NAND string to compensate for cross-coupling during programming.

FIG. 13C is a flowchart of one embodiment of a process of determining a suitable voltage to apply across a NAND string to compensate for cross-coupling during programming. The process is one embodiment of step 901 of FIG. 10. In this embodiment, the determination is based on the threshold voltage to which a neighbor memory cell will be programmed. This process can be performed for every memory cell that is being programmed. In step 1224, a determination is made as to the state to which the neighbor memory cell will be programmed. In one embodiment, there is a latch that holds data that indicates the intended state to which the neighbor will be programmed. In one embodiment, the data from this latch is the data that is input to control circuitry 1134 of either FIG. 11A or 12A.

In step 1224, a suitable voltage is determined to apply to the bit line to compensate for cross-coupling due to the later programming of the neighbor. In one embodiment, the control circuitry 1134 determines the appropriate voltage to apply to the bit line. For example, the input data might be whether the neighbor's threshold voltage will be "high" or "low." If it will be high, then a first voltage is to be applied to the bit line to achieve a first amount of compensation for cross-coupling. If the neighbor's threshold voltage will be will be low, then a second voltage is to be applied to the bit line to achieve a second amount of compensation for cross-coupling.

Figure 13D:
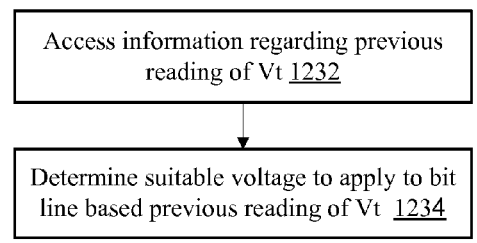
FIG. 13D is a flowchart of one embodiment of a process of determining a suitable voltage to apply across a NAND string based on a previous threshold voltage of the memory cell.

FIG. 13D is a flowchart of one embodiment of a process of determining a suitable voltage to apply across a NAND string based on a previous determination relating to the threshold voltage of the memory cell. This may be used to perform a binary search to locate the threshold voltage with any desired accuracy. Performing a binary search will be discussed more fully below. The process of FIG. 13D is one embodiment of step 901 of FIG. 10. This process can be performed for every memory cell that is being read. In step 1232, information regarding a previous reading of the threshold voltage of the selected memory cell is accessed. For example, a latch may hold a value that indicates the result of a previous comparison of the conduction current of the selected memory cell with a reference current. If the reference current is selected to test for a target Vt, then the value in the latch indicates whether the selected memory cell's threshold voltage is above or below a target Vt. In one embodiment, the data from this latch is the data that is input to control circuitry 1134 of either FIG. 11A or 12A.

In step 1234, a suitable voltage to apply to the bit line is determined based on the previous reading for the Vt. For example, assume that the previous reading determined whether the threshold voltage was above or below a target Vt. One voltage to apply to the bit line might be able to test for the target threshold voltage+Δ. Another voltage to apply to the bit line might be able to test for the target threshold voltage−Δ. If the previous reading indicated that the threshold voltage was below the target, then a voltage is applied to test for the target threshold voltage−Δ. If the previous reading indicated that the threshold voltage was above the target, then a voltage is applied to test for the target threshold voltage+Δ.

Figure 14A:
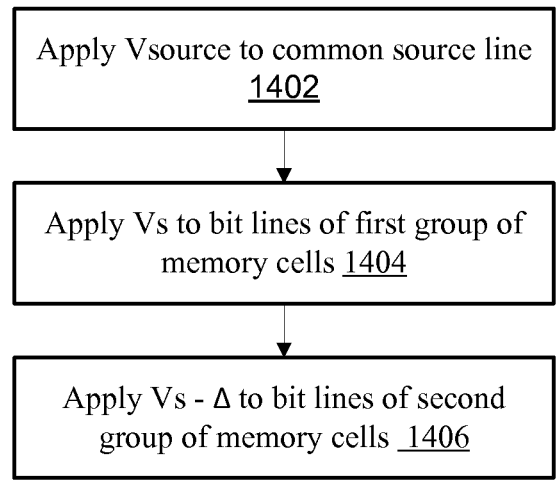
FIG. 14A is a flowchart of one embodiment of a process for establishing different voltages across NAND that causes different Vgs for selected memory cells on different NAND strings.

FIG. 14A is a flowchart of one embodiment of a process for establishing different voltages across NAND strings. FIG. 14A is one implementation of steps 902-904 of FIG. 10. FIG. 14A is an embodiment in which different Vgs are used for different NAND strings. For example, different threshold voltages could be sensed by applying different Vgs to different memory cells. In one embodiment, different Vgs and Vds are applied to sense different threshold voltages. Alternatively, different amounts of cross-coupling could be provided by applying different Vgs to different memory cells. In one embodiment, different Vgs and Vds are applied to provide different amounts of cross-coupling. The circuitry of FIG. 11A may be used when implementing the process of FIG. 14.

In step 1402, a voltage is applied to a common source line. For example, referring to FIG. 11A, the voltage Vsource is applied to the source line. An example, level for Vsource is 2.5V. Note that Vdd may be a lower voltage such as 1.6V.

In step 1404, Vs is applied to bit lines of a first group of memory cells. The first group may include memory cells whose threshold voltage is being compared to a first voltage level. The first group may include memory cells for which a first amount of cross-coupling compensation is desired. As an example, Vs might be 2.1V if Vsource is 2.5V. To establish Vs, the control circuitry 1134 may close first close switch S13 to connect the current source 1230 to the bit line. Then, the control circuitry 1134 closes switch S11 to connect the current sink 1130 to the bit line to achieve the target voltage. The control circuitry 1134 may determine when the bit line is at Vs and may disconnect the current sink 1130 from the bit line to hold the bit line at Vs.

In step 1406, Vs−Δ is applied to bit lines associated with a second group of memory cells. The second group may include memory cells whose threshold voltage is being compared to a second voltage level. The second group may include memory cells for which a second amount of cross-coupling compensation is desired. As an example, Vs−Δ might be 2.1V if Vsource is 2.5V. To establish Vs−Δ, the control circuitry 1134 may close first close switch S13 to connect the current source 1230 to the bit line. Then, the control circuitry 1134 closes switch S11 to connect the current sink 1130 to the bit line to achieve the target voltage. The control circuitry 1134 may determine when the bit line is at Vs−Δ and may disconnect the current sink 1130 from the bit line to hold the bit line at Vs−Δ. Note that steps 1404 and 1406 may be performed together.

Figure 14B:
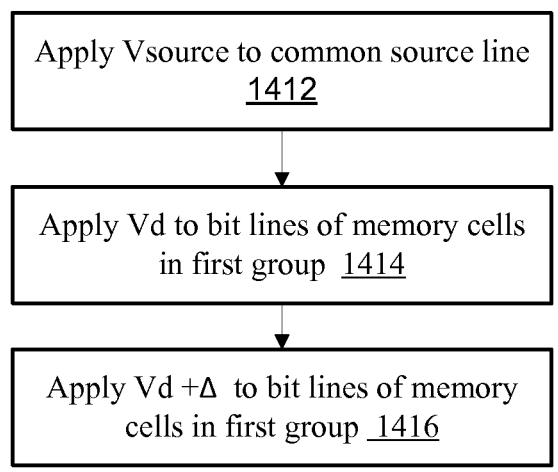
FIG. 14B is a flowchart of one embodiment of a process for establishing different voltages across NAND strings that causes different Vds for selected memory cells on different NAND strings.

FIG. 14B is a flowchart of one embodiment of a process for establishing different voltages across NAND strings. FIG. 14B is one implementation of steps 902-904 of FIG. 10. FIG. 14B is an embodiment in which a different Vds is used for different NAND strings. For example, different threshold voltages could be sensed. Alternatively, different amounts of cross-coupling could be provided. The process of FIG. 14B may use the circuit of FIG. 12A, although that is not required. The process of FIG. 14B may be performed simultaneously on all NAND strings having a memory cell being verified or read. In one embodiment, the different Vds causes a different amount of DIBL.

In step 1412, a voltage is applied to a common source line. For example, referring to FIG. 11A, the voltage Vsource is applied to the source line. An example, level for Vsource is 1.2V. Note that Vdd may be a higher voltage such as 2.5V.

In step 1414, Vd is applied to bit lines of a first group of memory cells. The first group may include memory cells whose threshold voltage is being compared to a first voltage level. The first group may include memory cells for which a first amount of cross-coupling compensation is desired. As an example, Vd might be 1.6V if Vsource is 1.2V. In this example, Vds will be about 0.4V. To establish Vd, the control circuitry 1134 may close switch S21 to connect the current source 1230 to the bit line. The control circuitry 1134 may determine when the bit line is at Vd and may disconnect the current source 1230 from the bit line to hold the bit line at Vd.

In step 1416, Vd+Δ is applied to bit lines associated with a second group of memory cells. The second group may include memory cells whose threshold voltage is being compared to a second voltage level. The second group may include memory cells for which a second amount of cross-coupling compensation is desired. The voltage Vd+Δ causes a sufficient amount of DIBL to alter (e.g., lower) the threshold voltage of the memory cells by the difference between the first and second voltage levels. As an example, Vd+Δ may be about 2.0V with Vsource being 1.2V. Therefore, Vds may be about 0.8V. To establish Vd+Δ, the control circuitry 1134 may close switch S21 to connect the current source 1230 to the bit line. The control circuitry 1134 may determine when the bit line is at Vd+Δ and may disconnect the current source 1230 from the bit line to hold the bit line at Vd+Δ. Note that steps 1414 and 1416 may be performed together.

Figure 15:
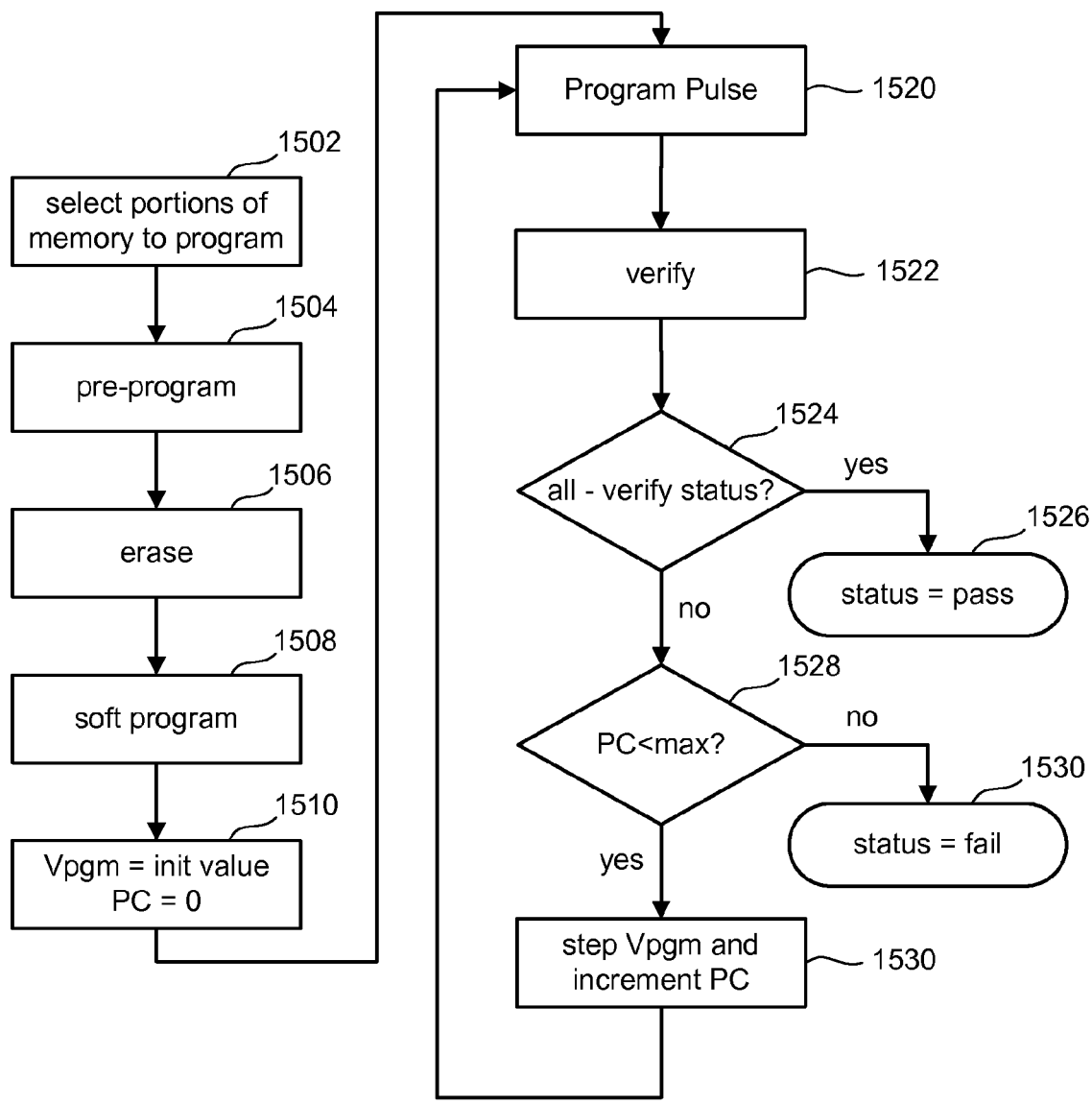
FIG. 15 is a flowchart describing one embodiment of a programming process, which includes one or more verification steps.

FIG. 15 is a flowchart describing one embodiment of a programming process, which includes one or more verification steps. Embodiments disclosed herein can speed up the programming by verifying multiple states during a single verification operation. In step 1502, the portion of the memory to be programmed is selected. In one implementation, this can be one or more write units appropriate to the memory structure. One example of a write unit is referred to as a page. In other embodiments, other units and/or structures can also be used. In step 1504, a pre-programming process is sometimes used wherein the addressed memory cells are given non-data dependent programming to level out storage element wear and provide a more uniform starting point for the subsequent erase. In step 1506, an erase process is performed, as appropriate for the type of storage element being used. One example of a suitable smart erase process is described in U.S. Pat. No. 5,095,344, incorporated herein by reference in its entirety. Step 1508 includes a soft programming process designed to put the threshold voltages of erased memory cells into a more uniform starting range for the actual write phase. In one embodiment, if any of the memory cells fail to verify during erase (or during soft programming), they can be mapped out of the logical address space. At this point the memory is ready for the data conditional programming phase.

In step 1510, the program voltage (Vpgm) is set to an initial value. For example, in some embodiments, the staircase wave form of FIG. 7b is used and step 1510 includes setting the initial pulse. Also, in step 1510, a program counter (PC) is initialized to zero. In step 1520, a program pulse is applied. For example, one iteration of step 1520 could include applying program pulse 800 of FIG. 8B.

In step 1522, a verification process is performed. The verification process may verify more than one state at a time. Referring to FIG. 8A, in one embodiment, some memory cells that are being programmed to the A-state are verified for the Vva level, while other memory cells that are being programmed to the B-state are verified for the VvB level. In one embodiment, the verification is a concurrent coarse/fine verify. Referring to FIG. 8A, some memory cells that are being programmed to the A-state are verified for the VvaL level, while others that are being programmed to the A-state are verified for the Vva level. During the initial programming steps in which the memory cell's threshold is well below the final level (Vva), course programming is applied. However, after the memory cell's threshold voltage reaches VvaL, fine programming is used. Thus, while some memory cells are being verified for coarse programming, other memory cells are being verified for fine programming. Note that with course/fine programming, some memory cells are being verified for one state (e.g., A-state), while others are being verified for another state (e.g., B-state). Note that when a particular memory cell has been verified as being programmed to its intended state, it may be locked out from further programming. More details of step 1522 are described below. In some embodiments, VvaL and Vva (see, for example, FIG. 8a) can be sensed at the same time. Likewise, VvbL and Vvb, etc. may be sensed together.

In step 1524, it is determined whether all of the memory cells have verified that their threshold voltages are at the final target voltage for that memory cell. If so, the programming process is completed successfully (status=pass) in step 1526. If all of the memory cells are not all verified, then it is determined whether the program counter (PC) is less than a maximum value such as 20. If the program counter (PC) is not less than max (step 1528), then the program process has failed (step 1530). If the program counter (PC) is less than a maximum value (e.g., 20), then the program counter (PC) is incremented by 1 and the program voltage is stepped up to the next pulse in step 1530. Subsequent to step 1530, the process loops back to step 1520 and the next program pulse is applied to the memory cells.

Figure 16A:
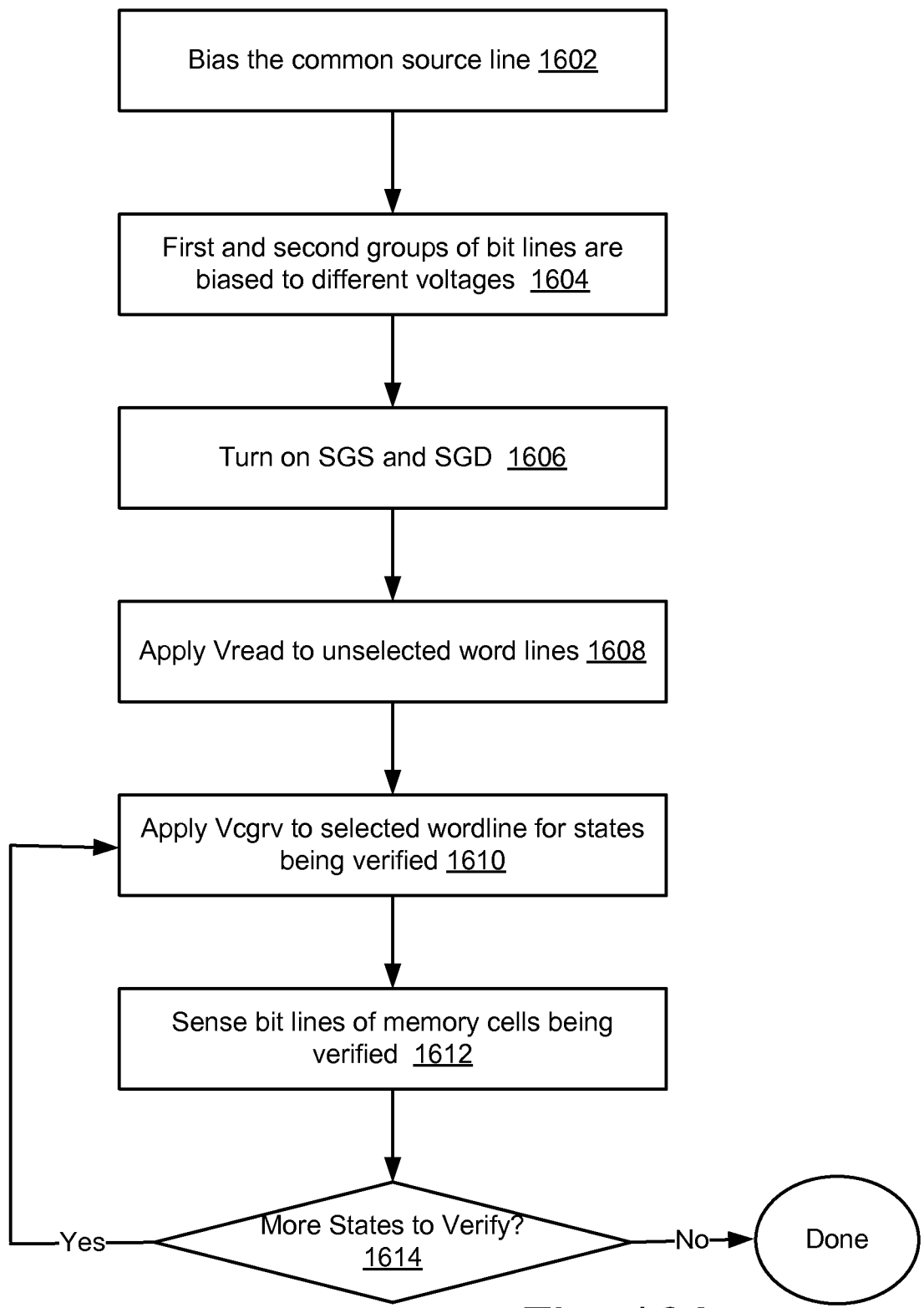
FIG. 16A is a flowchart of one embodiment of a process of verifying memory cells during a programming operation.
Figure 16B:
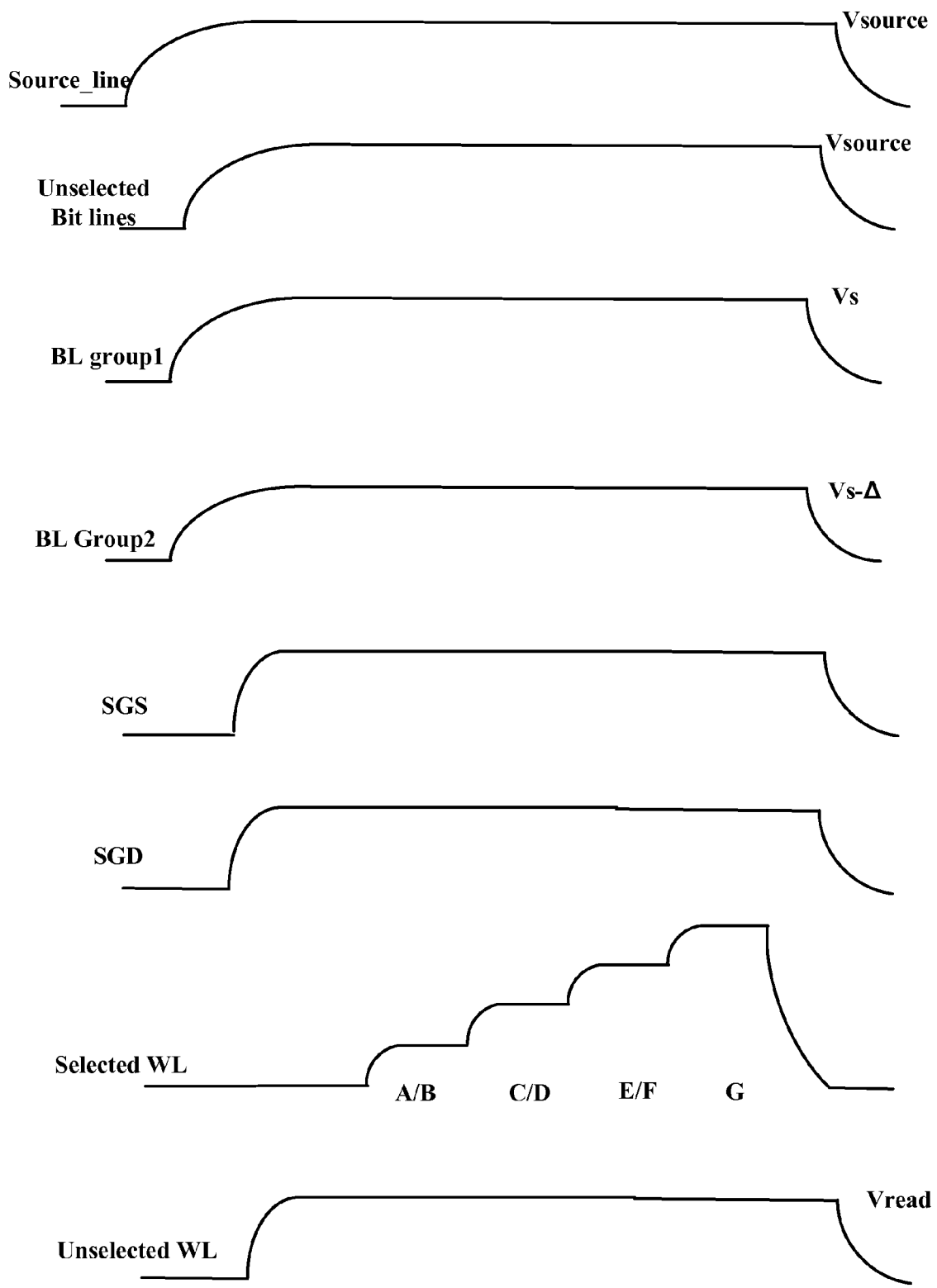
FIG. 16B is a timing diagram showing one embodiment of voltages applied to word line and bit lines during the verify process of FIG. 16A.

FIG. 16A is a flowchart of one embodiment of a process of verifying memory cells during a programming operation. In this process reverse sensing is used. The process is one implementation of step 1522 of the programming process of FIG. 15. Therefore, the process may be applied once during each iteration of the programming process. FIG. 16B is a timing diagram showing one embodiment of voltages applied to word line and bit lines during the verify process of FIG. 16A. Note that the voltage applied to the selected word line is modified during the process. For example, the voltage is raised to level "A/B" in order to verify the A-state and the B-state, then the voltage is raised to level "C/D" in order to verify the C-state and the D-state, etc. Further details are discussed below.

In step 1602, the common source line is biased to Vsource. As an example, the source line is biased to 2.5V.

In step 1604, first and second bit lines are biased to different voltages. The first group contains bit lines that are to have Vs applied to the bit line. The second group contains bit lines that are to have Vs−Δ applied to the bit line. There may also be a third group that contains bit lines that are to have Vs applied. For example, bit lines for memory cells being programmed to the A-, C-, E-, and G-state may be put into the first group. Bit lines for memory cells being programmed to the B-, D-, and F-state may be put into the second group. Bit lines for memory cells that are to stay erased may be put into the third group. In one embodiment, one of the bit lines from the first group (e.g., the A-state) and one of the bit lines from the second group (e.g., the B-state) may be being verified at a time. During step 1604, all the bit lines in the first group may be biased to Vs, all of the bit lines in the second group may be biased to Vs−Δ, and all of the bit lines in the third group may be biased to Vsource.

In step 1606, voltages are applied to the source side select gate (SGS) and the drain side select gate (SGD). As an example, SGS and SGD are biased to Vsource+Vt, where threshold voltage is the threshold voltage of the SGS transistor.

In step 1608, Vread is applied to unselected word lines. In step 1610, a suitable read voltage is applied to the selected word line. Referring to FIG. 16B, the voltage on the selected word line may be raised to the level labeled "A/B" in order to verify the A-state and the B-state. This level will create a Vgs that is suitable to verify the memory cells being programmed to the A-state, as well as a Vgs that is suitable to verify the memory cells being programmed to the B-state.

In step 1612, the bit lines of memory cells to be verified are sensed. If the threshold voltage of a memory cell being verified is below its target state it should turn on and conduct a sizeable current, which may be detected. For example, the current sense 1132 of FIG. 11B may determine whether or not the memory cell conducts a sizeable current based on Icell. Note that other sensing techniques could be used.

If there are more states to verify (step 1614), then the process returns to step 1610. In step 1610, the voltage on the selected word line is again set to the level that is appropriate for the states being verified. For example, the voltage may be changed to the level labeled "C/D" in FIG. 16B to verify memory cells being programmed to the C-state and the D-state. This level on the selected word line will create a Vgs that is suitable to verify the memory cells being programmed to the C-state, as well as a Vgs that is suitable to verify the memory cells being programmed to the D-state. The cells targeted to C-state may have different bitline bias compared with the cells targeted to D states.

When all states are verified, the process completes. Note that it is not an absolute requirement that all states be verified. For example, early in the programming process it might not be necessary to verify the highest states. Therefore, the process could end without raising the selected word line voltage to the levels "E/F" and "G." Likewise, later in the programming process it might not be necessary to verify the lowest states. Therefore, the process could skip raising the selected word line voltage to the levels "A/B." Note that for any memory cell that is verified to have reached its intended state, programming may be locked out such that it is not affected by further programming pulses.

Note that while FIG. 16A was described in connection with the example waveforms of FIG. 16B, the process is not limited to those waveforms. For example, there could be more or fewer than eight states. Also, instead of verifying two states at a time, three or more states could be verified with each iteration of the process.

Also note that while step 1604 contemplates biasing bit lines that are verified by applying different voltages to the selected word line, this is not required. For example, when verifying the A-state and the B-state, it is not required that the bit lines for the other states are biased to Vs and Vs+Δ. Instead, those bit lines could be biased to Vsource. Then, after verifying the A-state and the B-state, a different set of bias conditions could be applied to the bit lines to verify the C-state and the D-state.

Figure 17A:
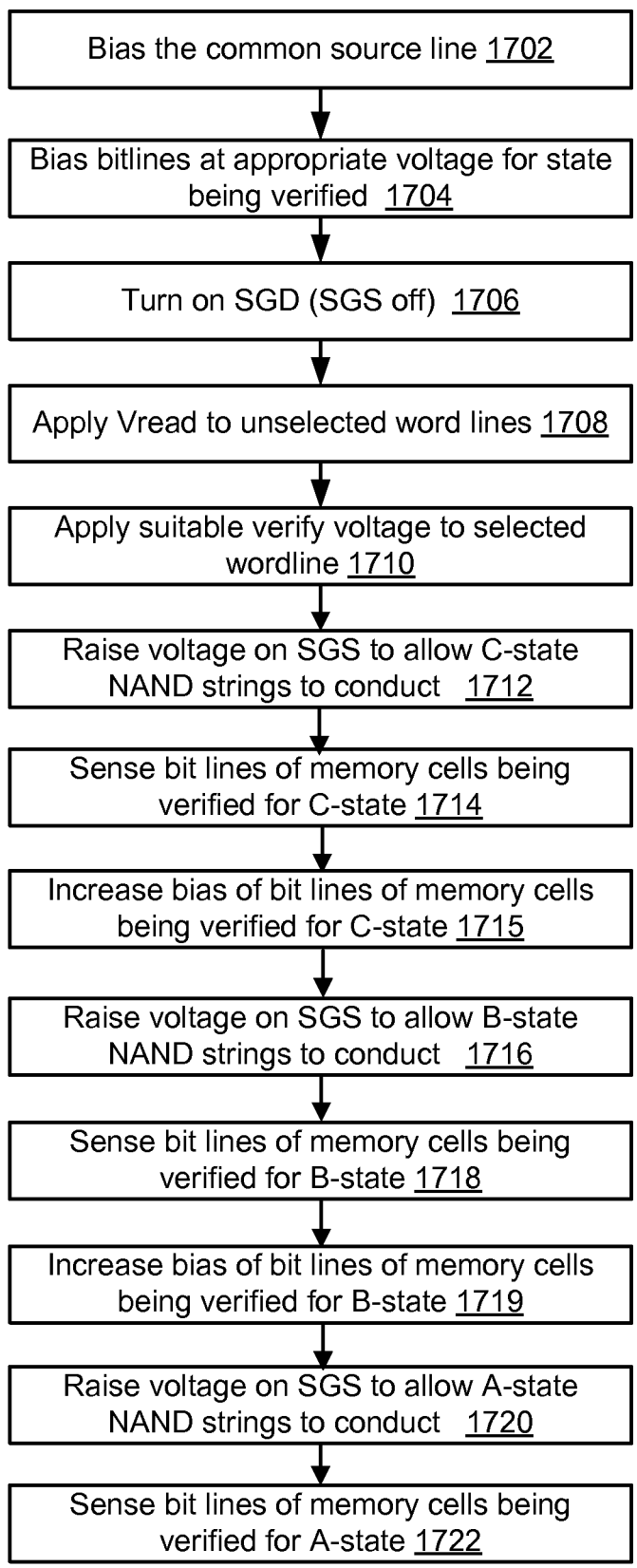
FIG. 17A is a flowchart of one embodiment of a process of verifying memory cells during a programming operation.

FIG. 17A is a flowchart of one embodiment of a process of verifying memory cells during a programming operation.

Figure 17B:
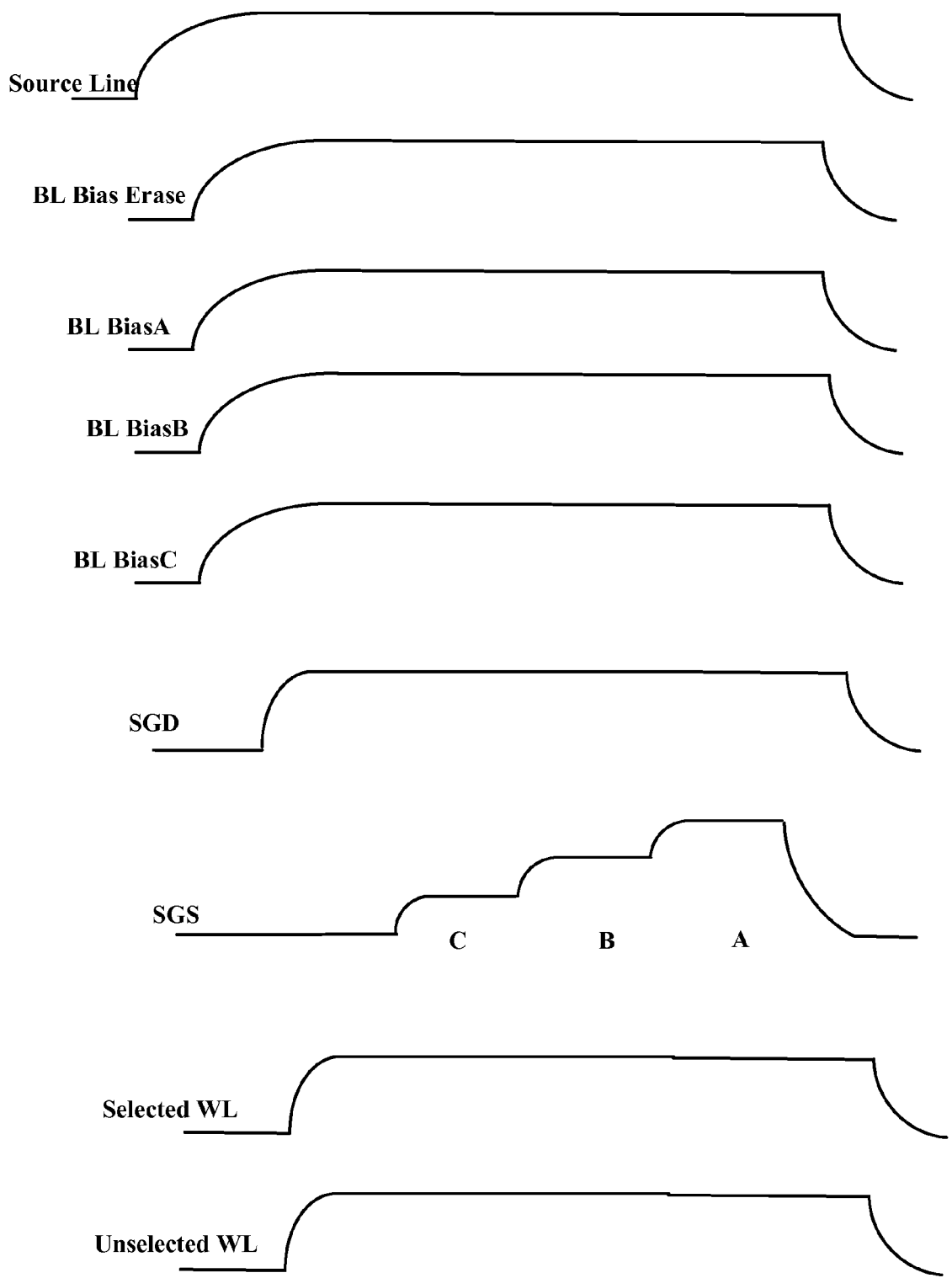
FIG. 17B is a timing diagram showing one embodiment of voltages applied to word line and bit lines during the verify process of FIG. 17A.

This is one implementation of reverse sensing. The process is one implementation of step 1522 of the programming process of FIG. 15. Therefore, the process may be applied once during each iteration of the programming process. FIG. 17B is a timing diagram showing one embodiment of voltages applied to word line and bit lines during the verify process of FIG. 17A. Referring to FIG. 17B, note that to verify different states, the voltage applied to SGS is changed from the level labeled "C", then to "B", then to "A" in order to verify the C-state, then the B-state, then the A-state. Other levels could be used to verify other states. This process different from the one of FIG. 16A in that rather than altering the voltage on the selected word line, the voltage on SGS is altered.

FIG. 16A described simultaneous verify of only two states each time (out of e.g., eight states). A reason for simultaneously verifying only two states and not four states or all eight states is for reducing the risk of cell punch-through, which may occur due to large bias condition differences that may result in large Vds voltage difference over the cell. In one embodiment, the drain side voltage is controlled in order to overcome the cell punch-through problem, which may allow simultaneously verifying more states. FIG. 17A is a flowchart of one embodiment of a process that controls the drain side voltage to avoid cell punch-through.

Figure 18A:
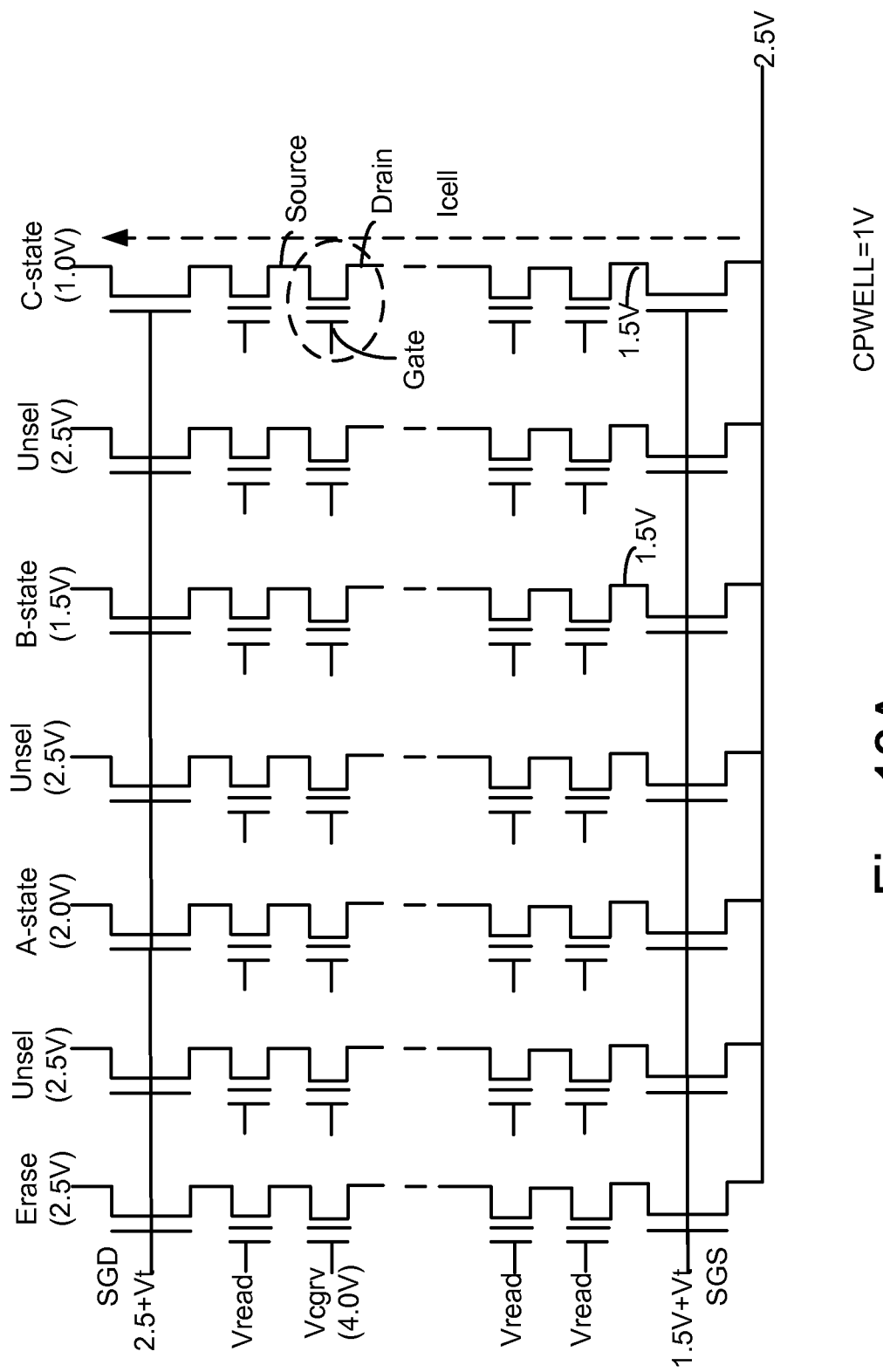
FIG. 18A is a diagram of several NAND strings showing example voltages applied when verifying the C-state in the process of FIG. 17A.
Figure 18B:
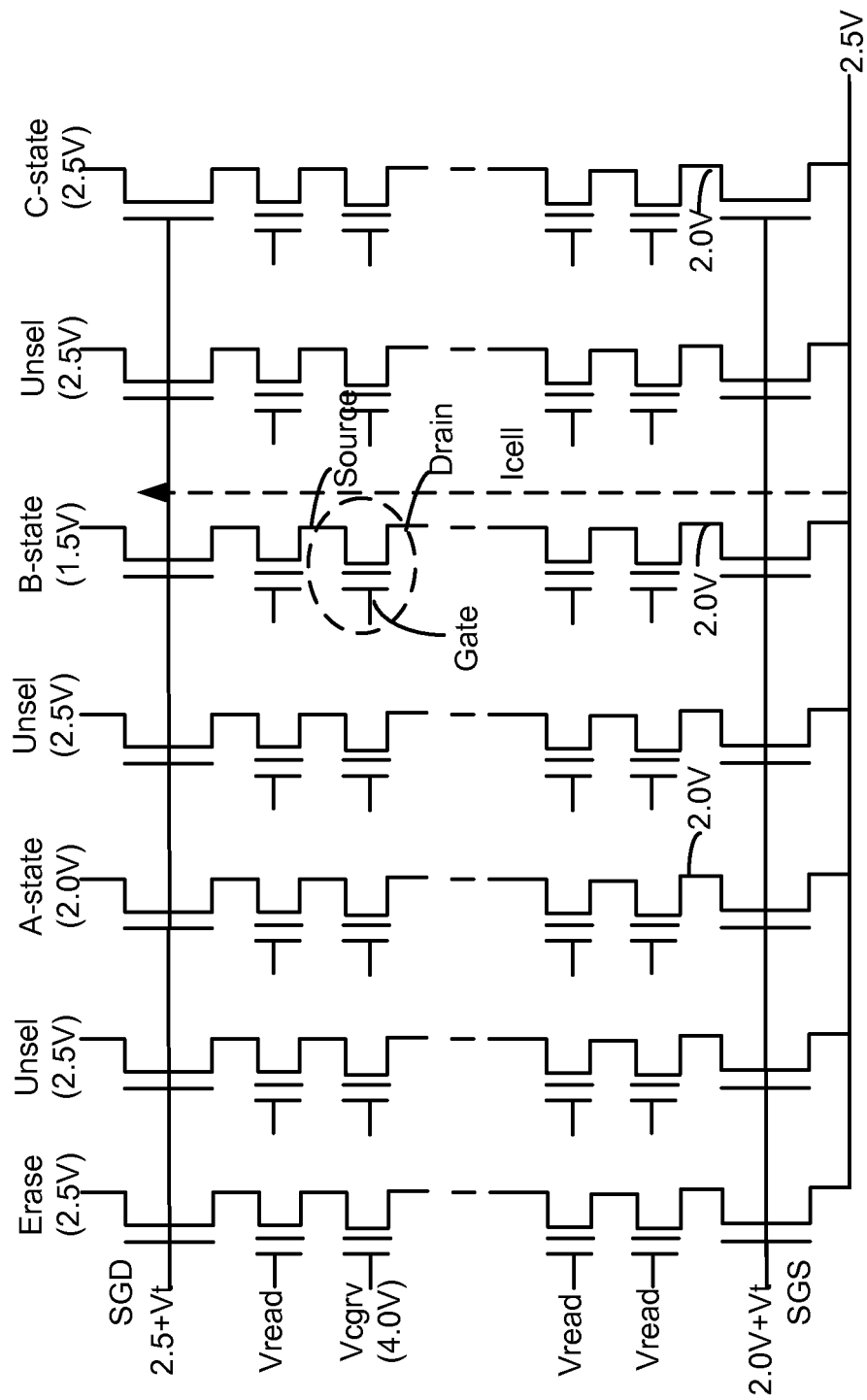
FIG. 18B is a diagram of several NAND strings showing example voltages applied when verifying the B-state in the process of FIG. 17A.
Figure 18C:
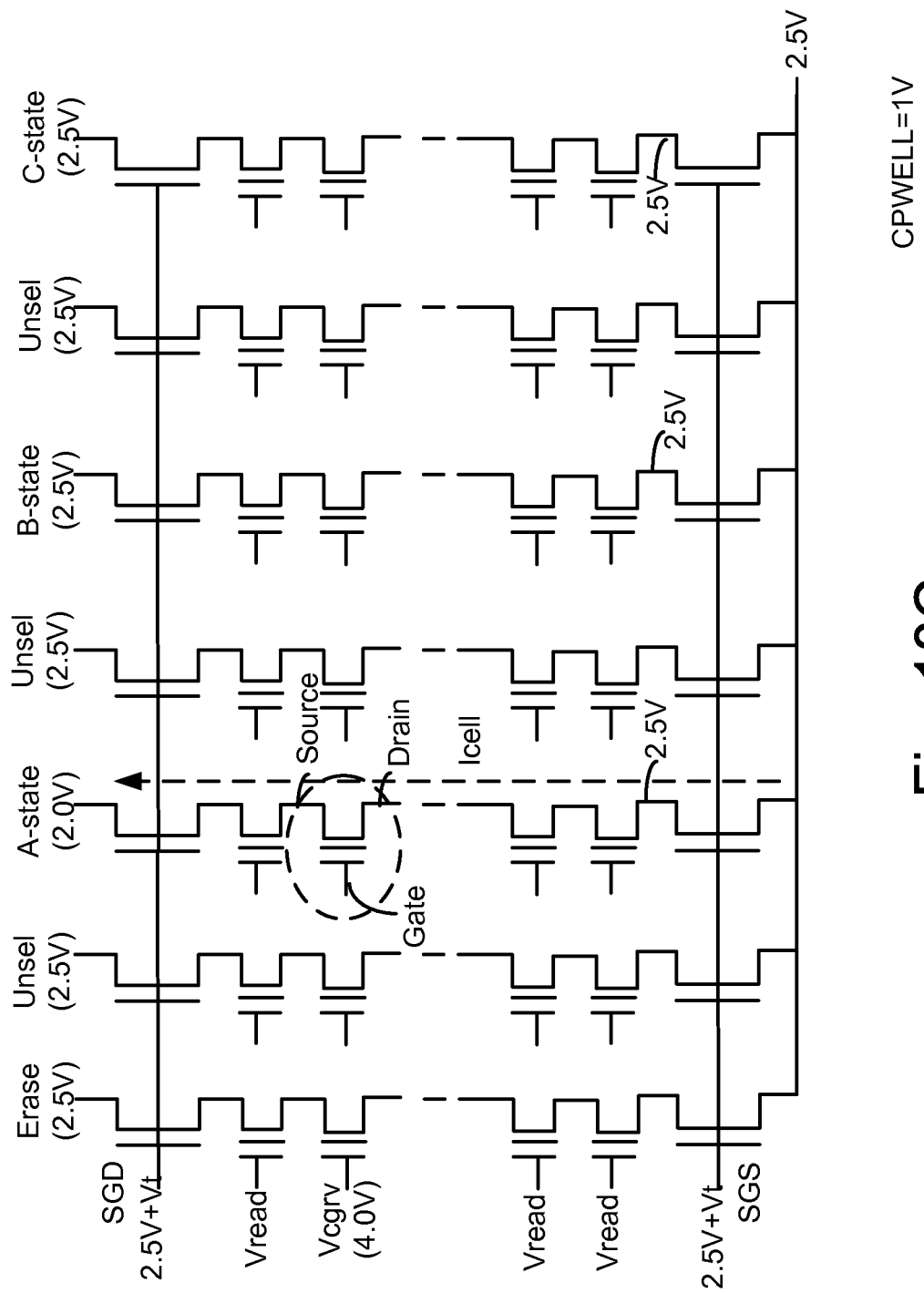
FIG. 18C is a diagram of several NAND strings showing example voltages applied when verifying the A-state in the process of FIG. 17A.

When discussing FIGS. 17A and 17B, reference will be made to FIGS. 18A, 18B, and 18C. FIG. 18A is a diagram of several NAND strings showing example voltages applied when verifying the C-state in the process of FIG. 17A. FIG. 18B is a diagram of several NAND strings showing example voltages applied when verifying the B-state in the process of FIG. 17A. FIG. 18C is a diagram of several NAND strings showing example voltages applied when verifying the A-state in the process of FIG. 17A.

In the process of FIG. 17A, the voltage applied to the source side select line (SGS) is used to control the drain side voltage to avoid the punch-through. In this case, all states (e.g., A, B, C in the example of FIG. 17B) may be verified simultaneously. Therefore, only a single voltage is applied to the selected WL (see FIG. 17B). All states may be verified almost simultaneously because SGS is ramped up gradually. Therefore, this method may be referred to as "pseudo-simultaneous multi state verify". Note that for some memory devices, SGS may have a shorter RC delay than that of the word line; therefore, voltage changes to SGS will be faster than voltages changes to the word line.

In step 1702, the common source line is biased to Vsource. As an example, the source line is biased to 2.5V. In step 1704, bit lines are biased at an appropriate voltage for the states to be verified. For example, bit lines for the erase state, A-state, B-state, and C-state each receive a different bias. In one embodiment, the bit lines for the erase state receive the highest bias, A-state the next highest bias, B-state the next highest bias, and C-state receive the lowest bias. For example, bit lines for the erase state are biased to 2.5V, bit lines for the A-state are biased to 2.0V, bit lines for the B-state are biased to 1.5V, and bit lines for the C-state are biased to 1.0V.

In one embodiment, the bit line verify is performed on an even bit line/odd bit line basis. For example, during one performance of process of FIG. 17A only the odd bit lines are verified. In this case, the even bit lines may have the same voltage as the bit lines having memory cells that are to stay erased. For example, Vsource (e.g., 2.5) may be applied to these "unselected" bit lines. After verifying memory cells on the odd bit lines, the process of FIG. 17A may then be repeated to verify memory cells on the even bit lines.

In step 1706, a voltage is applied to the drain side select gate (SGD). As an example, SGD is biased to Vsource+Vt, where threshold voltage is the threshold voltage of the SGD transistor. Note that at this time, SGS is held at a relatively low value such as ground. This low value prevents the NAND strings from conducting a current. In step 1708, Vread may be applied to unselected word lines. In step 1710, a suitable read (or verify) voltage is applied to the selected word line. The read voltage should be sufficient such to verify the memory cells being verified for the C-state. For example, if the threshold voltage for the C-state is 3.0V, then 4.0V may be applied to the selected word line. Recall that 1.0V was applied to the bit lines for memory cells being programmed to the C-state in this example. Therefore, Vgs for the C-state memory cells will be 3.0V. Note that Vgs for memory cells being verified for the A-state and B-state may be high enough for those memory cells to turn on. However, because the signal applied to SGS is low at this time, none of the NAND strings conduct a current. Referring to FIG. 17B, note that the voltage applied to the selected word line is not required to change in order to verify different states.

In step 1712, the source side select gate is raised to a level that is sufficient to allow NAND strings having a memory cell being verified for the C-state to conduct. Referring to FIG. 17B, SGS is raised to level "C". As an example, level C may be 1.5V+Vt, where threshold voltage is the threshold voltage of the SGS transistor. Raising SGS to level C allows NAND strings that have a memory cell being verified for the C-state to conduct. However, NAND strings that have a memory cell being verified for either the B- or A-state will not conduct a current. Referring to FIG. 18A, with SGS at 1.5V+threshold voltage (of the SGS transistor), the source of the SGS transistor that is lightly on should be about 1.5V. Therefore, note that the bottom of the NAND string labeled C-state is at 1.5V and the top is at 1.0V. Therefore, Vds for the memory cell is about 0.5V. However, note that for the NAND string labeled B-state that there is 1.5V at each end of the NAND string. Therefore, the memory cell on the selected word line should not conduct a strong current even if its threshold voltage is below Vgs.

In step 1714, the bit lines of memory cells being programmed to the C-state are sensed. If the threshold voltage of a memory cell being verified is below its target state it should turn on and conduct a sizeable current, which may be detected. For example, the current sense 1132 of FIG. 11B may determine whether or not the memory cell conducts a sizeable current based on Icell. Note that other sensing techniques could be used.

In step 1715, the voltage of the bit lines of memory cells being verified for the C-state may be raised. For example, the bit line voltage is raised to 2.5V. This may help to prevent punch-through conduction during later steps of the process. As another alternative, the bit lines may be floated.

In step 1716, the voltage applied to SGS is raised to a level that is sufficient to allow conduction of NAND strings having a memory cell being verified for the B-state. Referring to FIG. 17B, SGS is raised to level "B." As an example, the voltage applied to SGS is raised to 2.0V+Vt, where threshold voltage is the threshold voltage of the SGS transistors. Referring to FIG. 18B, the voltage at the source of the SGS transistors on the NAND strings labeled A-, B-, and C-state are all at about 2.0V. This should not be sufficient to allow conduction of current on the NAND string labeled A-state, as 2.0V is also applied to the bit line. However, the NAND strings labeled B-state should be able to conduct a current. Note that because the bit lines of memory cells being programmed to the C-state were raised to 2.5V (or have been floated), there should not be a conduction current for those NAND strings.

In step 1718, the bit lines of memory cells being programmed to the B-state are sensed. If the threshold voltage of a memory cell being verified is below its target state it should turn on and conduct a sizeable current, which may be detected. For example, the current sense 1132 of FIG. 11B may determine whether or not the memory cell conducts a sizeable current based on Icell. Note that other sensing techniques could be used.

In step 1719, the voltage of the bit lines of memory cells being verified for the B-state may be raised. For example, the bit line voltage is raised to 2.5V. This may help to prevent punch-through conduction during later steps of the process. As another alternative, the bit lines may be floated.

In step 1720, the voltage applied to SGS is raised to a level that is sufficient to allow conduction of NAND strings having a memory cell being verified for the A-state. Referring to FIG. 17B, SGS is raised to level "A." As an example, the voltage applied to SGS is raised to 2.5V+Vt, where Vt is the threshold voltage of the SGS transistors. Referring to FIG. 18C, the voltage at the source of the SGS transistors on the NAND strings labeled A-, B-, and C-state are all at about 2.5V. This should be sufficient to allow conduction of current on the NAND string labeled A-state, as only 2.0V is applied to its NAND string. However, because the bit lines of memory cells being programmed to the B- and C-states were raised to 2.5V (or have been floated), there should not be a conduction current for those NAND strings.

In step 1722, the bit lines of memory cells being programmed to the A-state are sensed. If the threshold voltage of a memory cell being verified is below its target state it should turn on and conduct a sizeable current, which may be detected. The possible conduction current (Icell) is shown as a dashed line. For example, the current sense 1132 of FIG. 11B may determine whether or not the memory cell conducts a sizeable current based on Icell. Note that other sensing techniques could be used. At this point all states are verified and process completes. Note that for any memory cell that is verified to have reached its intended state, programming may be locked out such that it is not affected by further programming pulses.

Figure 19:
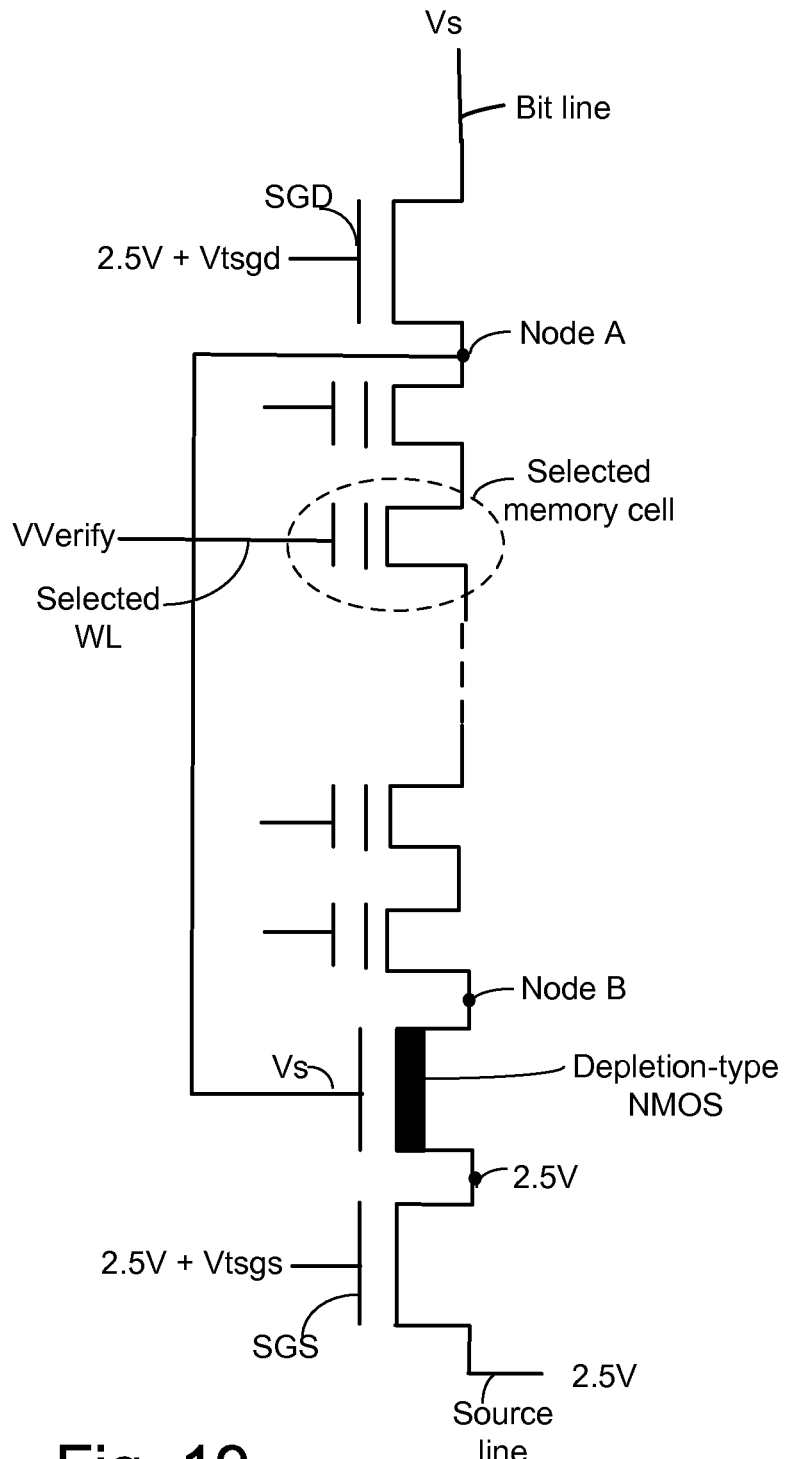
FIG. 19 is a diagram of one embodiment of a NAND string that has a transistor to help control Vds when performing reverse sensing.

FIG. 19 is a diagram of one embodiment of a NAND string that has a transistor to help control Vds when performing reverse sensing. The circuit of FIG. 19 may reduce or eliminate punch-through conduction when verifying different reference levels at the same time. The circuit of FIG. 19 may be used with the process of FIG. 16A and the timing diagrams of FIG. 16B. For example, in FIG. 16B the voltages to SGS and SGS are ramped up once during sensing of all of the states. This is in contrast to the technique depicted in FIGS. 17A and 17B in which SGS is ramped to different voltages during sensing of different states. In some embodiments, the circuit of FIG. 19 is used to simultaneously verify more than two states without risk of punch-through conduction. In one embodiment, all states are simultaneously verified.

The NAND string in FIG. 19 includes a depletion type NMOS transistor with its gate connected to the SGD transistor. Specifically, the gate of the depletion type NMOS transistor is connected to the drain of the SGD transistor. In this example, Vs is applied to the bit line and 2.5V is applied to the source line. Transistor SGD has 2.5V+Vtsgd applied to its gate (Vtsgd is the threshold voltage of transistor SGD). Transistor SGS has 2.5V+Vtsgs applied to its gate (Vtsgs is the threshold voltage of transistor SGS). This may result in node A being about Vs and node B being about Vs−Vth NMOS, where Vth NMOS is the threshold voltage of the NMOS transistor. If the threshold voltage of the NMOS transistor is about −0.5V, then node B will be about Vs+0.5V. Therefore, the voltage across the NAND string will be about 0.5V above the voltage of the bit line. Note that if the voltage of the bit line where Vs+Δ, then the voltage at node B would be about Vs+Δ+0.5V. Again, the voltage across the NAND string will be about 0.5V. Also note that this means that Vds of the memory cell that is selected for verify may be about 0.5V. Keeping Vds at a relatively low value may prevent punch through conduction.

Applying Different Amounts of Cross-Coupling Compensation

Sensing schemes disclosed herein for verifying multiple states can be used for cross-coupling compensation during programming or reading. Cross-coupling compensation can be used to compensate for shifts in the apparent charge stored on a floating gate which can occur because of the coupling of an electric field based on the charge stored in adjacent floating gates. This floating gate to floating gate coupling phenomena is described in U.S. Pat. No. 5,867,429, which is incorporated herein by reference in its entirety. The floating gate to floating gate coupling phenomena occurs most pronouncedly between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

In one embodiment, during a read operation, the bit line of each memory cell along the selected word line is biased according to the read Vt of the memory cell on a neighboring word line or according to the estimated state of the neighboring cell given its read Vt. Note that the actual state to which the neighboring cell was programmed may not be known. Also, the induced cross-coupling by the neighboring cell may be a function of its present threshold voltage and not of its programmed state. In one embodiment, during programming, the bit line of each memory cell along the selected word line is biased according to the intended state of the memory cell on the neighboring word line.

Figure 20:
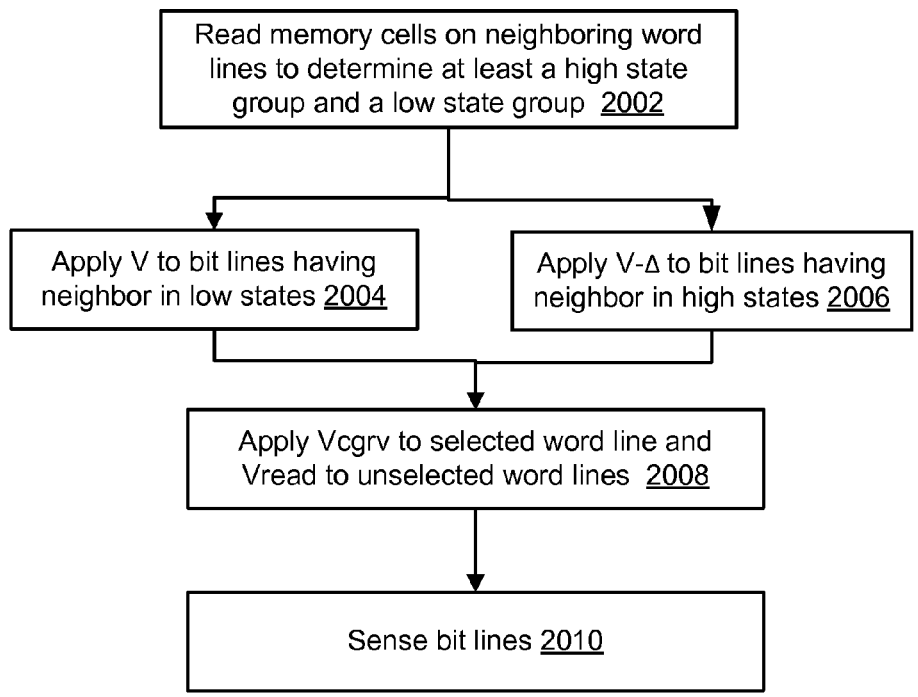
FIG. 20 depicts a flowchart of one embodiment of a process of applying cross-coupling compensation during reading.

FIG. 20 depicts a flowchart of one embodiment of a process of applying cross-coupling compensation during reading. In general, the process compensates for the effects that the state of the memory cell on a neighboring word line has when reading a selected memory cell. The process may employ sensing techniques that apply different voltages to different bit lines. For example, the process of FIG. 10, 14A, or 14B may be used. In some embodiments, reverse sensing is used. For example, the memory cell current may flow in the direction depicted in FIG. 9B. In some embodiments, forward sensing is used. For example, the memory cell current may flow in the direction depicted in FIG. 9C.

In the following description the term "target word line" refers to the word line having memory cells that are ultimately to be read. The target word line may also be referred to as WLn. In step 2002, the memory cells on a word line that neighbors the target word line are read to determine at least a high threshold voltage group and a low threshold voltage group. For example, the memory cells on WLn+1 are read to determine at least a high threshold voltage group and a low threshold voltage group. For example, memory cells in the erased state or A-state may be considered low threshold voltage group and those in either the B-state or C-state may be considered to be high threshold voltage group. It is not required that the exact state of each memory cell be determined. For example, a single read may be performed to determine whether the threshold voltage is above or below Vrb (see FIG. 8A). Note that the memory cells may be programmed to more than four states. Also note that if desired the memory cells could be placed into more than two groups based on their threshold voltages. For example, there may be a high, medium, and low threshold voltage group.

In steps 2004 and 2006, appropriate voltages are applied to bit lines to compensate for the effect of the neighbor memory cell's threshold voltage when the selected memory cell is read. For example, if the neighbor memory cell is in the low threshold voltage group, then Vs might be applied to the bit line. On the other hand, if the neighbor memory cell is in the high threshold voltage group, then Vs−Δ might be applied to the bit line. Memory cells having Vs−Δ applied to them may experience an apparent upward shift of their threshold voltage by Δ during read. Therefore, Δ may be chosen based on the expected shift due to cross-coupling due to the neighbor memory cell having a high Vt. In one embodiment, Vd and Vd+Δ are applied to the bit lines.

In step 2008, Vcgry is applied to the selected word line and Vread is applied to the unselected word lines. The voltage Vcgry may be selected to create a Vgs for selected memory cells that is suitable to test for a target Vt. For example, Vgs may be Vcgrv−Vs for memory cells having a neighbor with a low Vt. In this case, Vcgry−Vs might equal a threshold voltage that is being tested for. The Vgs for memory cells having a neighbor with a high threshold voltage may be Vcgry−(Vs−Δ). This Vgs may also test whether the threshold voltage of the selected memory cell is approximately the target Vt, given the compensation for the cross-coupling effect.

In step 2010, the bit lines are sensed to determine whether the selected memory cells have a threshold voltage that is above/below the target Vt. The process may be repeated for other target threshold voltages. However, the initial step of determining the states of the neighbors need not be repeated.

In one embodiment, cross-coupling compensation is performed during programming. For example, WLs may be programmed one after another such that WLn+1 is programmed after WLn. In one embodiment, prior to programming a block of memory cells they are erased. Therefore, during programming of target memory cells on WLn, the memory cells in WLn+1 are erased. Consequently, when WLn+1 is programmed, the read threshold voltage of cells in WLn may be shifted up as a function of the threshold voltage of the neighboring cells in WLn+1. In order to compensate for this voltage shift, the verify level used when programming a target memory cell on WLn can be adjusted based on the intended state of the neighboring cells in WLn+1 (which is indicative to their threshold voltage after they will be programmed). For example, if the neighboring memory cell on WLn+1 is going to remain in the erase state, then a "nominal" verify level "V" is used when verifying the target memory cell on WLn during its programming. On the other hand, if the neighboring memory cell on WLn+1 is going to be programmed to another states (e.g., the A-, B-, or C-state), then a verify level of V-Vs may be applied to the bit line during verify of the target memory cell. The voltage Vs is a value that should compensate for expected cross coupling induced apparent threshold voltage shift due to the later programming of the neighbor memory cells. Therefore, the voltage that is applied to the bit line may be a function of the state to which the neighbor memory cell will be programmed.

Reading Soft Bits

Figure 21:
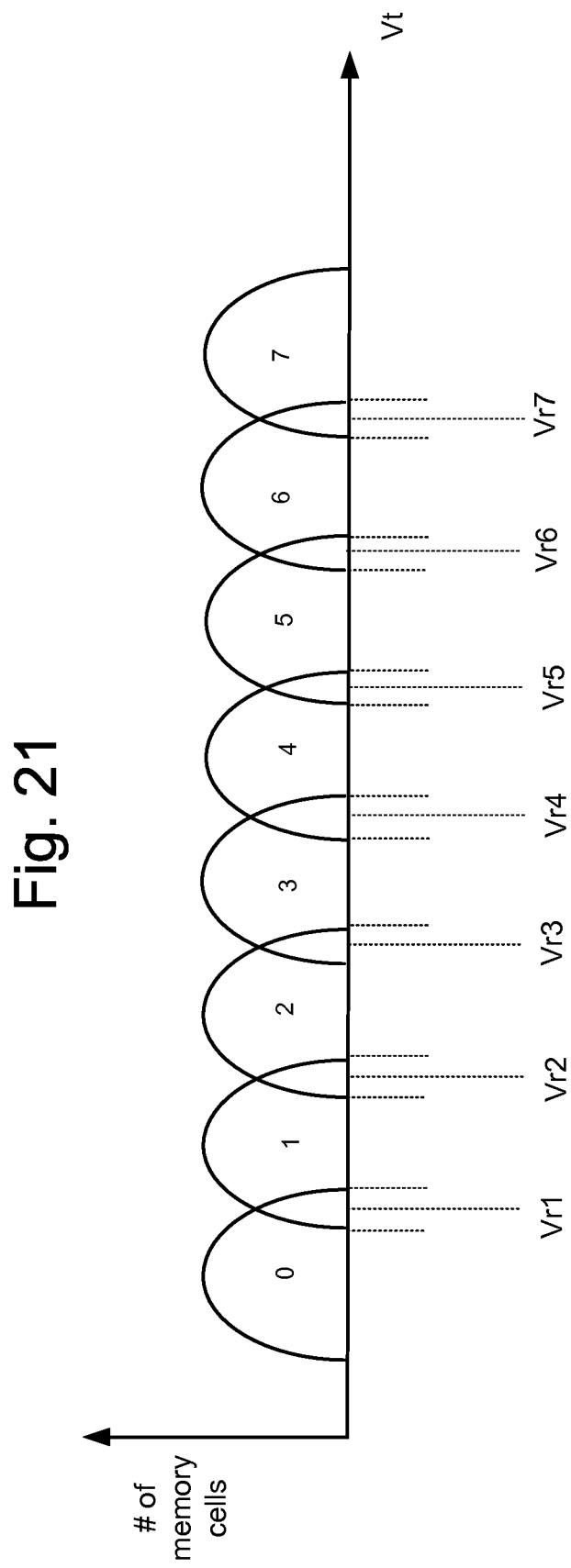
FIG. 21 depicts memory cell threshold voltage distributions.

In one embodiment, soft bits are read by reading simultaneously at different threshold voltages. Reading soft bits can be used to boost ECC error correction capability. FIG. 21 depicts memory cell threshold voltage distributions and will be used to help discuss reading soft bits. FIG. 21 shows eight threshold voltage distributions. Adjacent threshold voltage distributions overlap each other. In order to determine the programmed state of each cell, the voltage window may be divided into eight voltage bands, which can be done using seven reading thresholds Vr1,Vr2, . . . Vr7. If higher reading resolution is desired in order to boost up ECC error correction capability, then additional readings can be performed near the voltage bands edges. In the example shown in FIG. 21, additional reads are performed at locations +Δ and −Δ from the first locations (Vr1,Vr2, . . . Vr7). Therefore, measurements at 21 different threshold voltages are gathered. The additional reading thresholds may be used for determining whether a cell's threshold voltage is close to the voltage band edge or not. This information may be used for assigning a reliability estimate to the read cell's bits, which can be used by a "soft" ECC decoder. Further details of using soft bits are described in Published U.S. Patent Application 2008/0244338, titled "Soft Bit Data Transmission for Error Correction Control in Non-volatile Memory," filed on Mar. 31, 2007, which is hereby incorporated herein by reference for all purposes.

In one embodiment, first seven sense operations are done at read thresholds Vr1,Vr2, . . . ,Vr7. These first seven sense operations may be performed sequentially with each sense operation reading at one of the voltages. Then, seven additional sense operations may be performed with each individual sense operation sensing at two different threshold voltages. For example, one sense operation senses at Vr1+Δ and at Vr1−Δ, then another senses at Vr2+Δ and at Vr2×Δ, and so on. Various techniques disclosed herein may be used to simultaneously sense the two different threshold voltages. This reduces the number of sense operations that are used.

Figure 22:
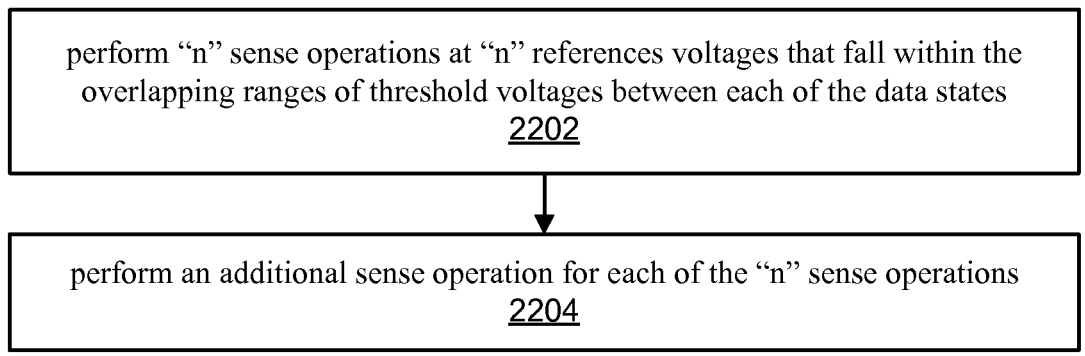
FIG. 22 is a flowchart of one embodiment of a process of reading soft bits.

FIG. 22 is a flowchart of one embodiment of a process of reading soft bits. In step 2202, "n" sense operations are performed at "n" references voltages. For example, seven sense operations are performed at locations (Vr1,Vr2, . . . Vr7). These initial locations may fall within the overlapping ranges of threshold voltages between each of the data states. For example, V1 falls in the range where states 0 and 1 overlap. Step 2202 determines whether the threshold voltage of each non-volatile storage element is greater or less than each of the "n" references voltages. This is one implementation of determining a suitable voltage to apply to each bit line based on a previous reading of a threshold voltage for the memory cell on the bit line (see FIG. 13D).

In step 2204, an additional sense operation is performed for each of the "n" sense operations. Each of the additional sense operations includes simultaneously sensing a first group of non-volatile storage elements in the subset that have a threshold voltage greater than the "nth" reference voltage at a first offset voltage from the "nth" reference voltage while sensing a second group of non-volatile storage elements in the subset having a threshold voltage less than the "nth" reference voltage at a second offset voltage from the "nth" reference voltage. For example, memory cells that have a threshold voltage greater than Vr1 are sensed at Vr1+Δ while memory cells that have a threshold voltage greater than Vr1 are sensed at Vr1−Δ. This is repeated for the other seven locations (Vr2, Vr3, . . . Vr7). Note that each of these sense operations in step 2204 simultaneously senses two different threshold voltages.

In one embodiment, sensing at the first offset voltage from the "nth" reference voltage includes applying a first voltage difference across NAND strings having non-volatile storage elements in the first group and sensing first conditions of non-volatile storage elements in the first group to determine whether the threshold voltages of non-volatile storage elements in the first group is above or below the first offset from the "nth" reference voltage. Furthermore, sensing at the second offset voltage from the "nth" reference voltage includes applying a second drain-to-source voltage difference across NAND strings having non-volatile storage elements in the second group and sensing second conditions of non-volatile storage elements in the second group to determine whether the threshold voltages of non-volatile storage elements in the second group is above or below the second offset from the "nth" reference voltage.

In one embodiment, sensing at the first offset voltage from the "nth" reference voltage includes applying a first gate-to-source voltage difference to non-volatile storage elements in the first group and sensing first conditions of non-volatile storage elements in the first group in response to the first gate-to-source voltage difference to determine whether the threshold voltages of non-volatile storage elements in the first group is above or below the first offset from the "nth" reference voltage. Furthermore, sensing at the second offset voltage from the "nth" reference voltage includes applying a second gate-to-source voltage difference to non-volatile storage elements in the second group and sensing second conditions of non-volatile storage elements in the second group in response to the second gate-to-source voltage difference to determine whether the threshold voltages of non-volatile storage elements in the second group is above or below the second offset from the "nth" reference voltage.

In one embodiment, sensing at the first offset voltage from the "nth" reference voltage includes applying a first drain-to-source voltage difference to non-volatile storage elements in the first group and sensing first conditions of non-volatile storage elements in the first group in response to the first drain-to-source voltage difference to determine whether the threshold voltages of non-volatile storage elements in the first group is above or below the first offset from the "nth" reference voltage. Furthermore, sensing at the second offset voltage from the "nth" reference voltage includes applying a second drain-to-source voltage difference to non-volatile storage elements in the second group and sensing second conditions of non-volatile storage elements in the second group in response to the second drain-to-source voltage difference to determine whether the threshold voltages of non-volatile storage elements in the second group is above or below the second offset from the "nth" reference voltage.

Performing a Binary Search

Figure 23A:
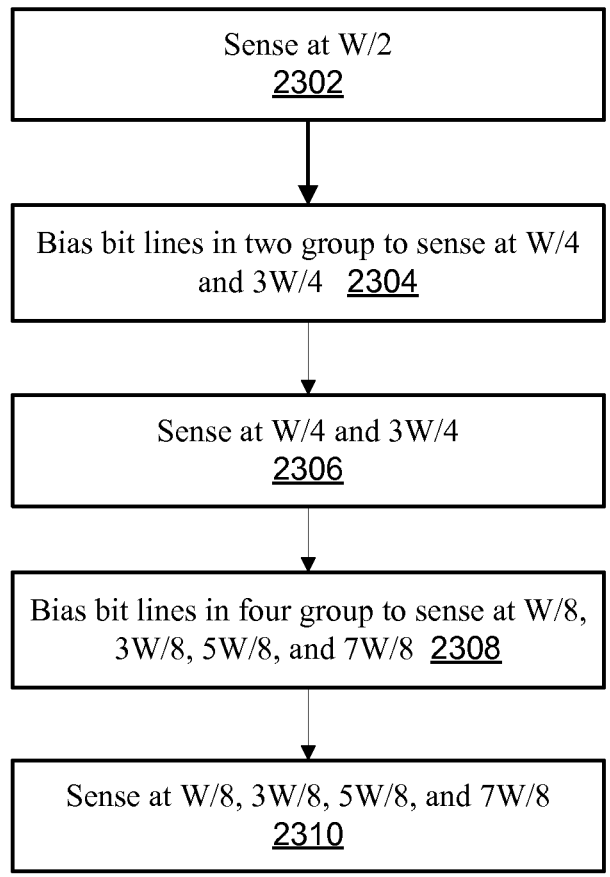
FIG. 23A is a flowchart of one embodiment of a process of performing a binary search.
Figure 23B:
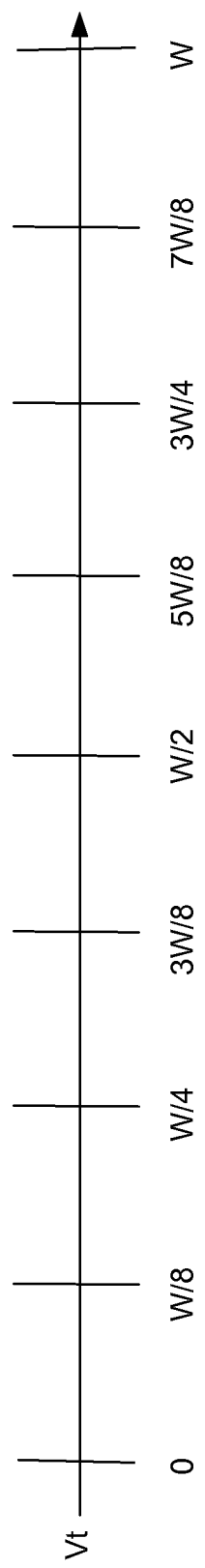
FIG. 23B is an example window over which the search of the process of FIG. 23A may be performed.

In one embodiment, a binary search for the threshold voltages of memory cells is efficiently performed by sensing for more than one threshold voltage at a time. FIG. 23A is a flowchart of one embodiment of a process of performing a binary search. The search efficiently determines the threshold voltages of many memory cells along a selected word line. The search takes place over a window of threshold voltages "W," which can be any interval. FIG. 23B depicts an example range "W," which will be referred to when discussing FIG. 23A. Referring to FIG. 21, W might include all states 0-7. Alternatively, W might range from about Vr1 to Vr3 or some other small range.

In step 2302, sensing is performed at the midpoint of the window, which will be referred to as "W/2." This step may involve applying a read voltage to the selected word line while applying the same conditions to all of the selected bit lines.

In step 2304, bit lines are biased at one of two different levels to sense at W/4 and 3W/4. If a memory cell had a threshold voltage below W/2, then it is sensed at W/4. If a memory cell had a threshold voltage above W/2, then it is sensed at 3W/4. Note that step 2304 applies a voltage to the bit line that was determined based on a previous reading of the threshold voltage of the memory cell. In one embodiment, the different bit line bias conditions cause a different Vgs for different memory cells to allow testing for different threshold voltages. In one embodiment, the different bit line bias conditions cause a different Vds for different memory cells to allow testing for different threshold voltages. In one embodiment, the different bit line bias conditions cause different voltages across different NAND strings to allow testing for different threshold voltages.

In step 2306, sensing is performed at W/4 and 3W/4. In step 2306, both levels (W/4 and 3W/4) are tested for with the same operation. For example, a read voltage may be applied to the selected word line while different bias conditions are applied to the two groups of bit lines. That is, for one group of memory cells are determination is made whether their threshold voltage is above/below W/4 and for a second group of memory cells are determination is made whether their threshold voltage is above/below 3W/4. These determinations may be made at the same time. For example, the determinations may be made by sensing some condition of the bit lines after applying the read voltage to the selected word line.

In step 2308, bit lines are biased at one of four different levels to sense at W/8, 3W/8, 5W/8, and 7W/8. If a memory cell had a threshold voltage below W/4, then it is sensed at W/4. If a memory cell had a threshold voltage between W/4 and W/2, then it is sensed at 3W/8. If a memory cell had a threshold voltage between W/2 and 3W/4, then it is sensed at 5W/8. If a memory cell had a threshold voltage above 3W/4, then it is sensed at 7W/8. Therefore, a binary search is performed for the threshold voltage of each memory cell. Note that step 2308 applies a voltage to the bit line that was determined based on a previous reading of the threshold voltage of the memory cell.

In one embodiment, the different bit line bias conditions cause a different Vgs for different memory cells to allow testing for different threshold voltages. In one embodiment, the different bit line bias conditions cause a different Vds for different memory cells to allow testing for different threshold voltages. In one embodiment, the different bit line bias conditions cause different voltages across different NAND strings to allow testing for different threshold voltages. Note that it is not required that all four conditions be tested for at the same time. Instead two conditions could be tested for at a time. For example, W/8 and 3W/8 could be tested for in one operation and 5W/8 and 7W/8 could be tested for in another operation.

In step 2310, sensing is performed at W/8, 3W/8, 5W/8, and 7W/8. That is, for one group of memory cells are determination is made whether their threshold voltage is above/below W/8, for a second group of memory cells are determination is made whether their threshold voltage is above/below 3W/8, for a third group of memory cells are determination is made whether their threshold voltage is above/below 5W/8, and for a fourth group of memory cells are determination is made whether their threshold voltage is above/below 7W/8. These determinations may be made at the same time. For example, the determinations may be made by sensing some condition of the bit lines after applying a read voltage to the selected word line. The search can continue in a similar manner to determine the threshold voltage at a finer level of granularity.

Example Sense Circuit

FIG. 24 depicts one embodiment of a sensing circuit which may be used both for biasing a bit line and sensing a condition of the bit line to determine the threshold voltage of a selected memory cell on the bit line. The sensing circuit can perform "reverse sensing," in which the selected memory cell current flows from the source line to the bit line. The sensing circuit is able to bias the bit line to several different voltages. A large number of sense circuits, e.g., 64K sense circuits in a plane, typically receive common control signals unless otherwise indicated, and access one or more common power supplies. Regarding the power supply, the transistor gate voltages in the sense circuit may be provided by global circuits at the edge of large group of sense circuits.

A separate copy of the sense circuit can be provided for each bit line, for every other bit line, or otherwise. However, by operating sense circuits associated with different bit lines in a different manner, different bit line biases can be established. Therefore, different sense circuit can test for different threshold voltages at the same time. As another example, different sense circuits can provide different amounts of cross-coupling compensation to different memory cells on a selected word line. One or more control circuits can communicate commands to each sense circuit to configure them, as well as to exchange data, such as read and write data.

The sense circuit can provide three different voltages to a bit line. For example, the sense circuit can pre-charge the bit line to one of three different voltages prior to sensing a condition of the bit line to read or verify the selected memory cell. Referring briefly to FIG. 9B, the sense amplifier could provide Vs, Vs–Δ, and a third voltage for unselected bit lines. For example, the sense amplifier could provide 2.1, 1.5, and 2.5V to the bit line, respectively. It will be appreciated that modifications can be made to the sense amplifier to provide additional voltages to bit lines. Therefore, with suitable modifications, four different voltages can be provided to the bit lines as depicted in FIG. 18A.

The transistors in the sense circuits herein may include nMOSFETs (nMOSs) and pMOSFETs (pMOSs), for instance. Briefly, the sense circuit includes bit line bias transistors, which help to establish the three different voltages on the bit line 2468. The sense circuit also includes sense bias transistors connected to a sense node (SEN). The sense bias transistors provide two different paths for sensing the bit line 2468. The sense circuit includes FLAG transistors that input a signal FLG and output INV. The sense circuit includes LATCH transistors that input a signal LAT and output INT. Details will be described below.

A bit line 2468 is connected to the sense circuit. The bit line 2468 communicates with a BLS transistor 2470 and a BLC (bit line clamp) transistor 2472, which is coupled to a COM path. The BLS transistor 2472 may be a high-voltage transistor which can isolate the sense circuit, which may include low voltage transistors, from high voltages of the memory array. During sensing, BLS transistor 2472 is conductive. In one embodiment, the BLC transistor 2472 can clamp a voltage on the bit line 2468 by control its gate voltage and supply of a sufficiently high voltage such as Vdd on the drain of the transistor.

In one embodiment, a reference voltage is applied to the control gate of a memory cell being read. If the reference voltage is greater than the threshold voltage of the memory cell, then the memory cell will turn on and conduct current between its source and drain. If the reference voltage is not greater than the threshold voltage of the memory cell, then the memory cell will not turn on and will not conduct current between its source and drain. In many implementations, the on/off may be a continuous transition so that the memory cell will conduct different currents in response to different control gate voltages. If the memory cell is on and conducting current, the conducted current will cause the voltage on node SEN to change, effectively altering the voltage across capacitor 2450. If the voltage on node SEN changes to a predetermined level during a predetermined sensing period, then sense amplifier reports that the memory cell turned on in response to the control gate voltage.

The sense circuit contains sense bias transistors 2456, 2458, 2460, and 2462, which connect the bit line 2468 to the sense node SEN. Sense transistors 2456 and 2460 are connected to the bit line through transistors 2472 and 2470. Sense transistors 2458 and 2462 are connected to SEN. Sense bias transistors 2456 and 2458 provide one path between transistor 2472 and SEN. Sense bias transistors 2460 and 2462 provide a second path between transistor 2472 and SEN. The sense node (SEN) is connected to sense capacitor 2450, which is connected to a CLK signal. Signals INV, INT, XXP1, and XXP2 are applied to the gates of the sense transistors to control sensing. Further details are discussed below in connection with FIGS. 26A and 26B.

The sense node (SEN) is connected to the COM path (and hence to BLC transistor 2472) via transistor 2454, which has signal XXO applied to its gate. The sense node (SEN) is also connected to transistor 2448, which has signal HHL applied to its gate. Transistor 2448 is connected to Vsense, which is a voltage that SEN is set to just prior to sensing. For example, Vsense could be ground. Sense node SEN is connected to the node BUS, which outputs a value indicative of whether the memory cell turned on. Specifically, SEN node is connected to the gate of transistor 2446. Transistor 2446 is connected to BUS through transistors 2145 and 2430. Therefore, signal STR may be applied to transistor 2415 and signal NCO may be applied to transistor 2430 to connect/disconnect SEN from BUS.

The sense circuit includes bit line bias transistors 2402, 2404, 2406, 2408, 2412, and 2412. Briefly, these transistors are used to bias the bit line to one of three different voltages. These transistors are controlled by signals INT, INV, FLA, FLB, FLC, and FLG. The signals INT and INV, are input from the output of FLAG and LATCH, respectively. Signals FLA, FLB, and FLC correspond to which of the three voltages that the bit line is to be biased. In one embodiment, control circuitry generates FLA, FLB, and FLC. Further details are discussed below.

As mentioned, FLAG inputs FLG and outputs INV. In one embodiment, the initial value for INV is established by establishing a signal on BUS and turning on transistors 2430 and 2416 in order to establish FLG. Note that transistor 2430 is controlled by NCO and transistor 2416 is controlled by FCO. Signals STF and FRB are applied to transistors 2420 and 2422 to generate INV from FLG. Note the INV may be the opposite of FLG.

As mentioned, LATCH inputs LAT and outputs INT. In one embodiment, the initial value for INT is established by establishing a signal on BUS and turning on transistors 2430 and 2444 to establish LAT. Note that transistor 2444 is controlled by LCO. Signals STL and PRS may be used to generate INT from LAT.

Figure 25A:
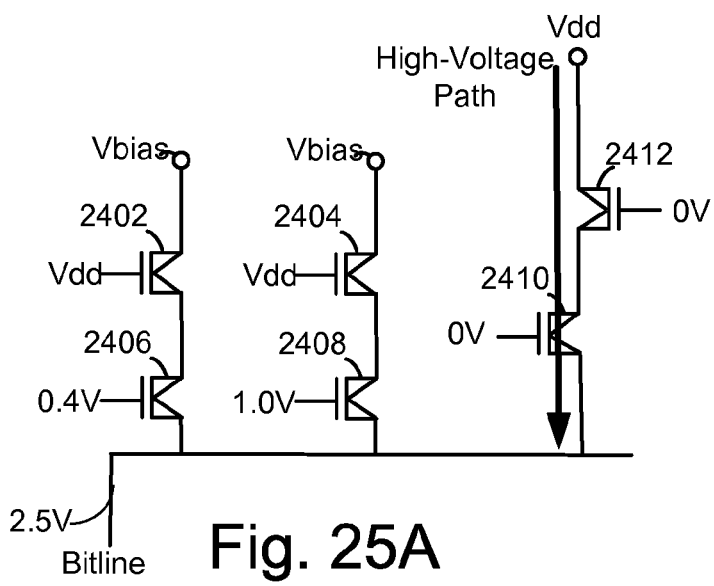
FIG. 25A, FIG. 25B, and FIG. 25C depict details of operation of bit line bias transistors of FIG. 24 for a reverse sensing embodiment.
Figure 25B:
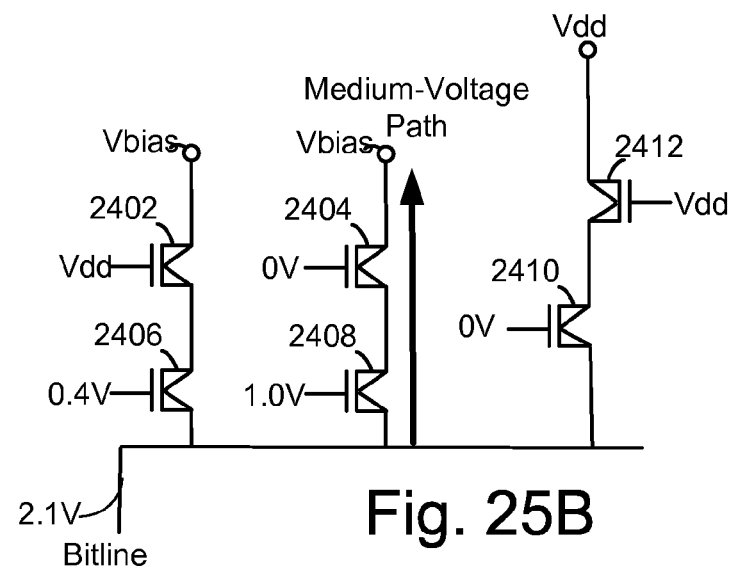
Figure 25C:
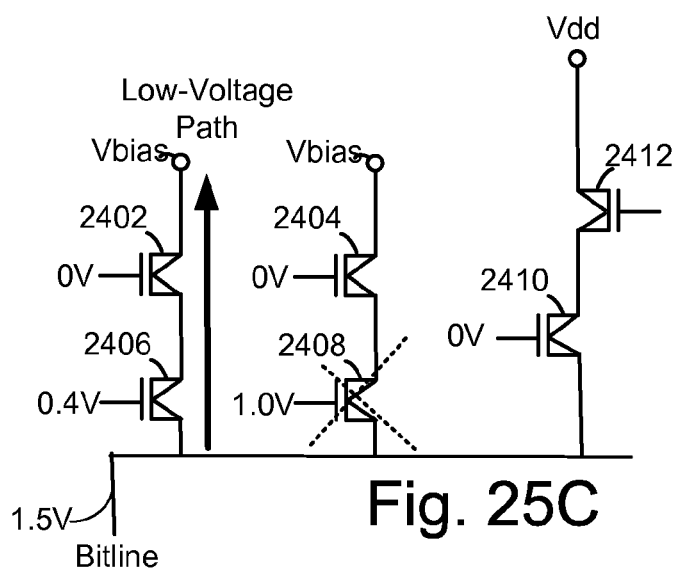

FIGS. 25A, 25B, and 25C depict details of operation of the bit line bias transistors of FIG. 24 for a reverse sensing embodiment. FIGS. 25A, 25B, and 25C show voltages applied to gates of the bit line bias transistors to establish the proper voltage on the bit lines prior to sensing the memory cell. Each of FIGS. 25A, 25B, and 25C depicts operation for biasing the bit line to a different level. FIG. 25A shows operation for biasing the bit line to the highest voltage. FIG. 25A depicts transistors 2410 and 2412 supplying a bias current to the bit line, which may be charged to Vdd (e.g., 2.5V). Note that Vbias may be a lower voltage such as ground. FIG. 25B shows operation for biasing the bit line to a medium voltage. FIG. 25B depicts transistors 2404 and 2408 sinking a bias current from the bit line, which may be charged to a medium voltage (e.g., 2.1V). Note that the charging current flows from the bit line to power source (Vbias). FIG. 25C shows operation for biasing the bit line to a low voltage. FIG. 25C depicts transistors 2404 and 2406 sinking a bias current from the bit line, which may be charged to a low voltage (e.g., 1.5V). Note that the charging current flows from the bit line to power source (Vbias). As examples, the high voltage might be used for biasing unselected bit lines, the medium voltage could be Vs (see FIG. 9B), and the low voltage could be Vs−Δ. Many other possibilities exist. Note that transistors 2402, 2404, 2406, and 2408 are one embodiment of the current sink 1130 of FIGS. 11A and 11B. Note that transistors 2410 and 2412 are one embodiment of the current source 1230 of FIGS. 11A and 11B. Also note that transistors 2474, 2472 and 2470 from FIG. 24 are not depicted between the sense bias transistors and the bit line to simplify the drawing.

The table below provides example values for FLG, INV, LAT, and INT for operation in FIGS. 25A, 25B and 25C. Recall from the discussion of FIG. 24 that signals INV and INT are generated by FLAG and LATCH based on FLG and LAT. Therefore, these are signals that are generated internally in the sense circuit. In one embodiment, a value of 0 for these signals corresponds to 0V and a value of 1 corresponds to Vdd or 2.5V.

TABLE I

| Bit line Voltage | FLG | INV | LAT | INT |
|---|---|---|---|---|
| High (e.g., Vdd or 2.5 V) | 0 | 1 | 0 | 1 |
| Medium (e.g., 2.1 V) | 1 | 0 | 0 | 1 |
| Low (e.g., 1.6 V) | 1 | 0 | 1 | 0 |

The sense transistors also have signals FLA, FLB, and FLC applied to gates of transistors 2410, 2408, and 2406, respectively. These signals may be common to many sense circuits. The timing for these signals are depicted in the timing diagram in FIG. 27, which will be discussed below. In one embodiment, the values for these signals are as follows. The signal FLA may have a value of 0V when active. In one embodiment, FLB has a value of 2.1V−Vth of transistor 2408. The Vth of transistor 2408 may be about 1.1V. Thus, FLB may be 2.1V−1.1V=1.0V. In one embodiment, FLC has a value of 1.5V−Vth of transistor 2406. The Vth of transistor 2406 may be about 1.1V. Thus, FLC may be 1.5V−1.1V=0.4V.

Operation of FIG. 25A will now be discussed beginning with the high voltage path of transistors 2410 and 2412. Note that all of the transistors in FIG. 25A are p-channel devices, and therefore turn on when a low voltage is applied to their gate. Also note that from FIG. 24, the signal FLG may be applied to the gate of transistor 2412. From the table, FLG=0, INV=Vdd, and INT=Vdd for high voltage operation. When FLG=0, transistor 2412 will turn. Signal FLA may be applied to the gate of transistor 2410. In one embodiment, FLA has a value of 0 when active. Therefore, signal FLA will turn on transistor 2410. Consequently, the bit line is connected to Vdd through transistors 2410 and 2412.

In order to prevent the medium and low voltage paths from conducting, Vdd may be applied to transistors 2402 and 2404. Recall that INT may be applied to the gate of transistor 2402 and INV may be applied to the gate of transistor 2404. Because, INT and INV are both Vdd, Vdd may be applied to the gates of transistors 2402 and 2404. Therefore, transistors 2402 and 2404 will not conduct.

Operation with respect to FIG. 25B will now be discussed. From the table, FLG=Vdd, INV=0, and INT=Vdd for the medium voltage case. Since FLG may have a value of Vdd, transistor 2412 will be off. Therefore, conduction is prevented on the high voltage path.

Operation of the medium voltage path is as follows for FIG. 25B. Note that the bit line may be initially charged to about 2.5V. In one embodiment, the bit line is initially charged to 2.5V by using the high-voltage path. The sense bias transistors 2404 and 2408 may then be used to reduce the voltage on the bit line. Transistor 2404 will be on because INV causes 0V on the gate of transistor 2404. FLB, which may be about 1V, is applied to transistor 2408. Therefore, transistor 2408 will conduct as long as the bit line voltage is above 2.1V (recall Vth of transistor 2408 is about 1.1V). Consequently, transistors 2408 and 2404 reduce the bit line voltage until it reaches about 2.1V.

Operation of the low voltage path for FIG. 25B is as follows. Transistor 2402 has Vdd applied to its gate as a result of INT being high. Therefore, transistor 2402 will not conduct, which prevents the low voltage path from controlling the bit line voltage.

Operation with respect to FIG. 25C will now be discussed. From the table, FLG=Vdd, INV=0, and INT=0 for the low voltage case. Since FLG may have a value of Vdd, transistor 2412 will be off. Therefore, conduction is prevented along the high voltage path.

Operation of the low voltage path is as follows for FIG. 25C. As previously mentioned, the bit line may be initially charged to about 2.5V. For operation in FIG. 25C, transistor 2402 is on because INT causes 0V to the gate of transistor 2402. Signal FLC, which may be about 0.4V, is applied to the gate of transistor 2406. Therefore, transistor 2406 will conduct as long as the bit line voltage is above 1.5V (recall that the Vth of transistor 2406 is about 1.1V). Consequently, transistors 2402 and 2406 reduce the bit line voltage until it reaches about 1.5V.

Operation of the medium voltage path is as follows for FIG. 25C. Transistor 2408 will have 1.0V applied to its gate as a result of signal FLB. Therefore, transistor 2408 can conduct a current if the bit line is above 2.1V. However, after the bit line drops below 2.1V, transistor 2408 turns off. Therefore, transistor 2408 may assist some in discharging the bit line, but will not impact the ability of transistor 2406 to control the bit line voltage. Also note that transistor 2404 may conduct because INV, which is applied to its gate is 0V.

Figure 26A:
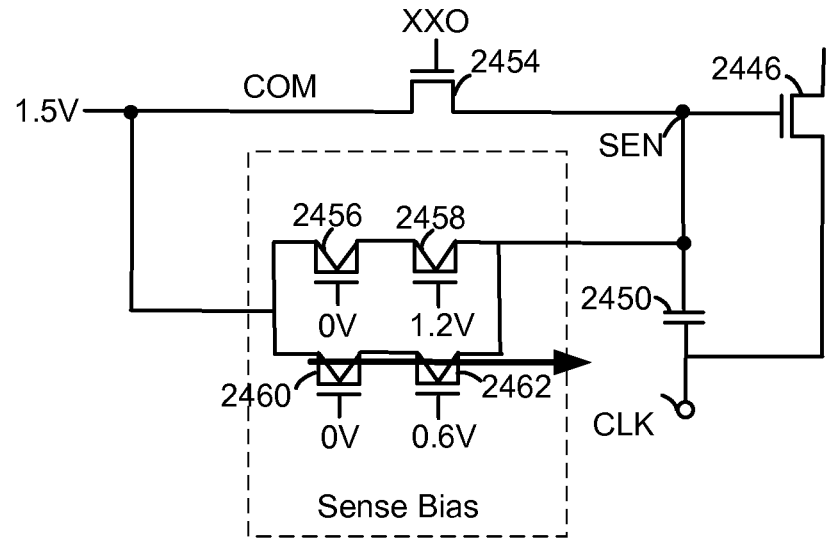
FIG. 26A and FIG. 26B depict voltages applied to sense bias transistors of FIG. 24 for a reverse sensing embodiment.
Figure 26B:
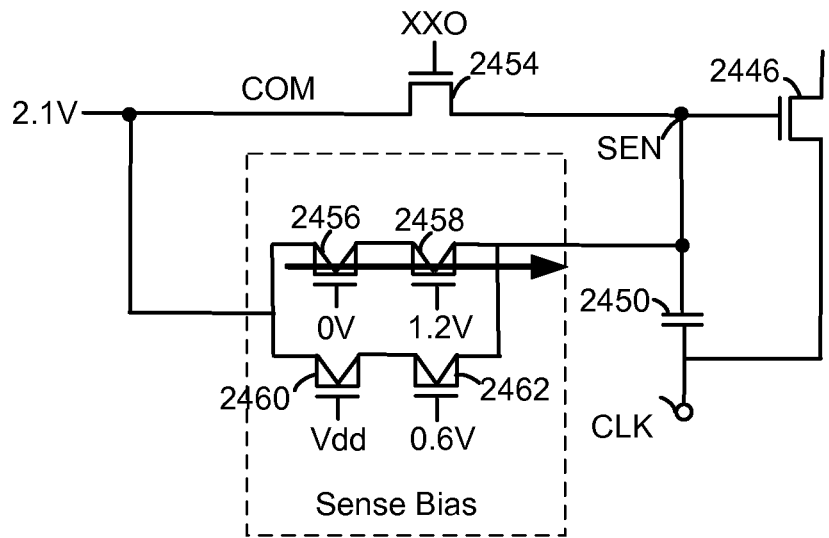

FIGS. 26A and 26B depict voltages applied to sense bias transistors of FIG. 24 during sensing. FIG. 26A depicts operation for the low voltage case. For example, after the bit line bias transistors have been used to establish 1.5V on the bit line, the sense bias transistors are used to sense some condition of the bit line. FIG. 26B depicts operation for the medium voltage case. For example, after the bit line bias transistors have been used to establish 2.1V on the bit line, the sense bias transistors are used to sense some condition of the bit line. The circuits of FIGS. 26A and 26B are one implementation of the current sense 1132 of FIG. 11B.

Referring briefly to FIG. 24, the signal INV is applied to transistor 2456 and the signal INT is applied to transistor 2460. The signal XXP1 is applied to transistor 2458, and signal XXP2 is applied to transistor 2462. Signals XXP1 and XXP2 may be signals that are common to many sense circuits. In one embodiment, XXP1 is about FLB+200 mV or about 1.2V. In one embodiment, XXP2 is about FLC+200 mV or about 0.6V. Example timing of those signals is depicted in the timing diagram of FIG. 27, which will be discussed below. Values for INV and INT are depicted in table I above.

Operation of the circuit of FIG. 26A is as follows. The bit line was biased to about 1.5V by the bit line bias transistors for this case. Voltages to the gates of the transistors are based on values for INV, INT, XXP1 and XXP2. In general, transistors 2460 and 2462 will conduct to connect the bit line to SEN. Transistor 2458 should be off because its gate is only about 0.3V below the bit line voltage. Therefore, its gate is not low enough to turn on transistor 2458. Note that XX0 at the gate of transistor 2454 is low such that the COM path is not connected to SEN.

Operation of the circuit of FIG. 26B is as follows. The bit line was biased to about 2.1V by the bit line bias transistors for this case. Voltages to the gates of the transistors are based on values for INV, INT, XXP1 and XXP2. Voltages are similar to the case of FIG. 26A, except now Vdd is applied to the gate of transistor 2460. In general, transistors 2456 and 2458 will conduct to connect the bit line to SEN. Transistor 2460 should be off because its gate is at Vdd. Note that XX0 at the gate of transistor 2454 is low such that the COM path is not connected to SEN.

Note that for the high-voltage case sensing may not be desired. For example, unselected bit lines might be charged to the high voltage. As previously mentioned, both INV and INT may be high (e.g., Vdd) for the high voltage case. Since INV is at the gate of transistor 2456 and INT is at the gate of transistor 2460, both sense bias paths will be shut off. Therefore, SEN is not affected by the bit line.

Figure 27:
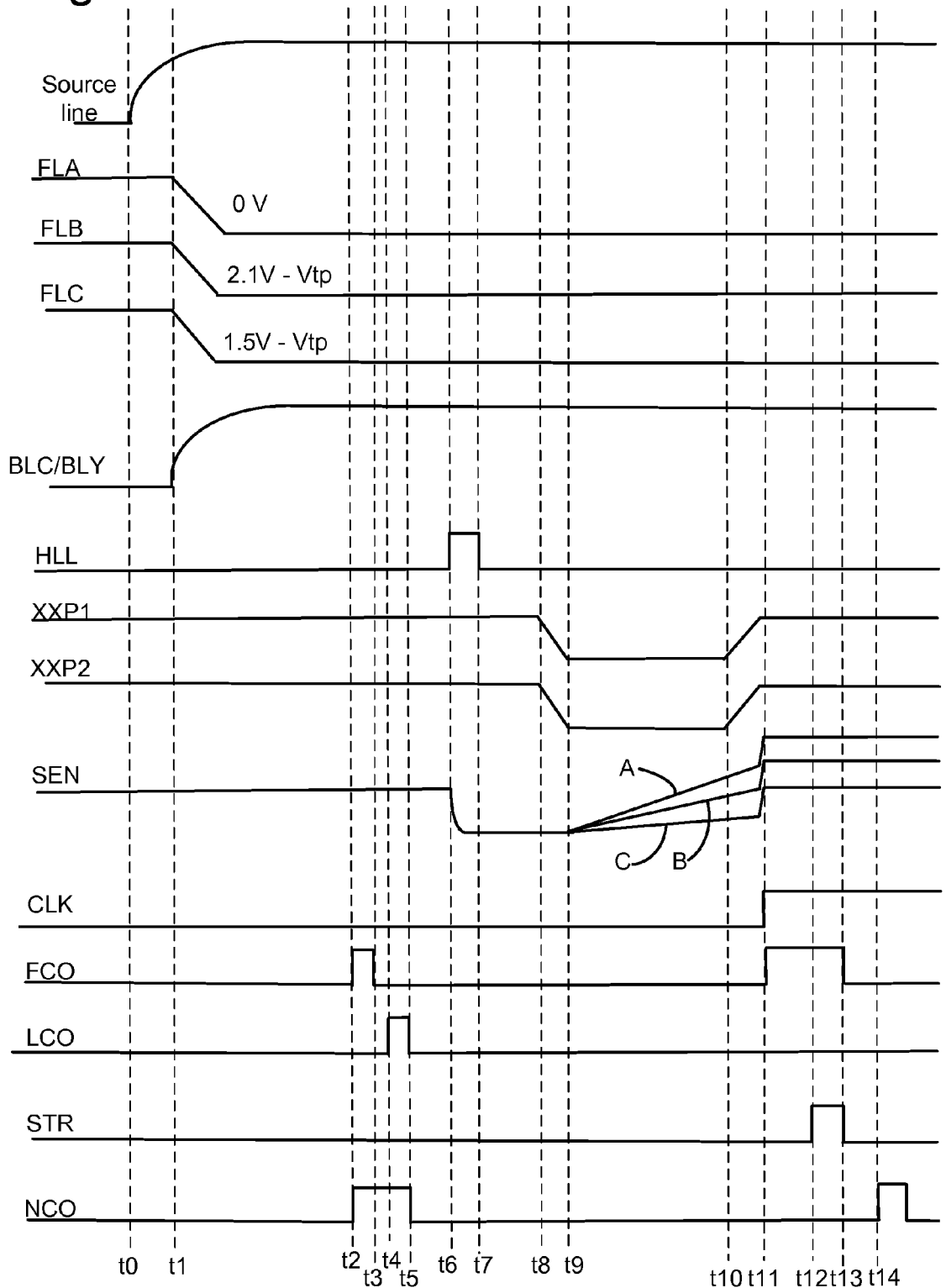
FIG. 27 depicts a timing diagram for signals associated with the sensing circuit of FIG. 24.

FIG. 27 depicts a timing diagram associated with signals in the sensing circuit of FIG. 24. Time points t0-t14 are depicted. The time lines are not to scale. Prior to t0, SEN may have a high value that is a result of a previous sense operation. The SEN node will be reset just prior to the sense operation (at t6). Therefore, the initial value of SEN is not critical. Initially, BLC and BLY may be low such that the bit line is not connected to the sense circuit. Initially, FLA, FLB, and FLC may be high such that the high-, medium-, and low-voltage paths (see FIGS. 25A-25C) are off. At time t0, the voltage Vsource is applied to the source line.

Bit Line Pre-Charge Phase

At time t1, the signals BLC and BLY are raised to high, which turn on transistors 2472 and 2474 respectively. Therefore, the bit line 2466 is connected to the bit line bias transistors, as well as other elements in the sense circuit. Also at time t1, the signals FLA, FLB, and FLC go low. This allows the high-, medium-, and low-voltage paths to be on/off depending on the values for FLG, INV, and INT. Initially, the value for FLG may be low, which turns on transistor 2412. Therefore, the high-voltage path may be conductive at this time. However, at this time INV and INT may be high such that the medium- and low-voltage paths will be off. This allows the bit line to pre-charge through the high-voltage path to Vdd (e.g., 2.5V).

Next, initial values for FLG, LAT, INT and INV are established. Table I depicts example values for that may be used to help establish the high-, medium-, and low-voltage on the bit line. At time t2, the signal FCO briefly goes high until time t3. The signal NCO may also go high at this time. This allows a signal from the BUS to set FLG. At time t4, the signal LCO briefly goes high until time t5. The signal NCO may also be high at this time. This allows a signal from the BUS to set LAT. As previously discussed, INV and INT are generated by FLAG and LATCH based on FLG and LAT, respectively.

The values for FLG, INV, and INT are applied to gates of the bit line bias transistors, as depicted in FIG. 24. Operation of the bit line bias transistors has already been described in connection with FIGS. 25A-25C. The bit line voltage is allowed to stabilize until t6.

Sensing Phase

Signal HLL goes high from time t6 until time t7. This briefly turns on the HLL transistor 2448 to establish an initial voltage at SEN at the beginning of a sense operation. In one embodiment, SEN is pulled to ground.

Signals XXP1 and XXP2 begin to go low at time t8. By time t9, signals XXP1 and) XXP2 are low. Recall that signals XXP1 and XXP2 are input to sense bias transistors 2458 and 2462, respectively. By this time, INV and INT will be established for the desired bit line voltage condition. Therefore, operation of the sense bias transistors is as described in connection with FIGS. 26A and 26B.

At time t9, the sense node (SEN) begins to react based on a condition of the bit line. As previously discussed the bit line will conduct a current whose magnitude depends, at least in part, on the threshold voltage of the selected memory cell. The conduction current (if any) travels in the direction depicted in FIGS. 9B and 11B. Therefore, the conduction current may charge the capacitor 2450 at the sense node SEN. As a result, the voltage SEN may increase as the capacitor 2450 charges as a result of the conduction current in the bit line.

The SEN node is depicted as rising at three different rates. The rate of increase may depend in part on the difference in voltage between the bit line and SEN. Therefore, in general, the rate of increase may be faster for the medium-voltage bit line case than for the low-voltage bit line case. The rate of increase may also depend in part on the magnitude of the memory cell conduction current. The lines labeled A and B correspond to the cases where the memory cell conduction current is high. Line A corresponds to the medium-voltage bit line case. Line B corresponds to the low-voltage bit line case. Therefore, line A goes up at a higher rate than line B. The line labeled C corresponds to the cases where the memory cell conduction current is low. Only one line (C) is depicted for the low conduction current cases; however, there may be some difference in the rate of increase depending on the bit line voltage.

At time t10, signals XXP1 and XXP2 begin to go high again to stop the cap 2450 from charging up further. By time t11, signals XXP1 and XXP2 are again high. At time t11, CLK and FCO go high. Note when CLK goes high, that the voltage at SEN may be affected by CLK (see FIG. 24). The SEN voltage may not be high enough to trigger the set of the latches, thus CLK step up will boost the level of SEN voltage for latching.

Latch Phase

The strobe signal STR is brought high between time t12 and t13. Because FCO is on, the voltage from SEN is inversely passed to FLG through STR and FCO. The value of FLG may be stored in FLAG latch. At time t11 FCO is brought back low. Note that LCO could also be brought high to pass the signal from SEN to LAT. This value may then be stored in LATCH.

Read Out Phase

Finally, in a read out phase at t14, the control signal NCO at the transfer gate 2430 allows the signal SEN to be read out to the readout BUS. The cell passed either A or B state will be latched into FLAG. The data may be sorted out when the data is shifted out through NCO to a logic processor. The data may be selected based on the program data stored in the data latches outside of the sense amplifier. For example, if it is A state program data, the FLG latch data high is an indication that the cell threshold voltage passed state A. If the data is B state program data, the FLG latch data high is a indication that the cell passed state B.

One embodiment is a method for operating non-volatile storage that includes a plurality of NAND strings of non-volatile storage elements. The method includes causing a first voltage difference across a first NAND string of the plurality of NAND strings that includes a first non-volatile storage element and causing a second voltage difference across a second NAND string of the plurality of NAND strings that include a second non-volatile storage element. The second voltage difference is different from the first voltage difference. The second voltage difference is caused at the same time that the first voltage difference is caused. A read voltage is applied to a word line that is associated with the first non-volatile storage element and the second non-volatile storage element while causing the first and second voltage differences. A first condition of the first non-volatile storage element is sensed in response to the first voltage difference and read voltage to determine whether the threshold voltage of the first non-volatile storage element is above or below a first reference voltage. A second condition of the second non-volatile storage element is sensed in response to the second voltage difference and read voltage to determine whether the threshold voltage of the second non-volatile storage element is above or below a second reference voltage. In one embodiment, the first reference voltage is different from the second reference voltage. In one embodiment, the first reference voltage is the same as the second reference voltage.

Figure 28A:
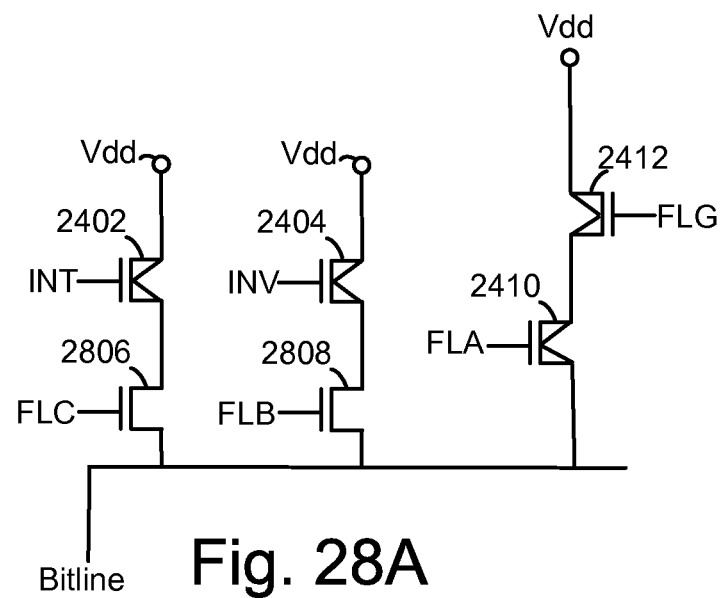
FIG. 28A depicts bit line bias transistors for a forward sensing embodiment.

With some slight modifications, the sense circuit of FIG. 24 may be used for forward sensing. FIG. 28A depicts one embodiment of a circuit that can be used in place of the bit line bias transistors in FIG. 24. The circuit of FIG. 28A is different in that p-channel transistors 2406 and 2408 are replaced with n-channel transistors 2806 and 2808. Also, Vdd (e.g., 2.5V) is supplied to all transistors 2402, 2404, and 2412, as opposed to supplying Vbias to transistors 2402 and 2404. Operation is similar to the reverse sensing embodiment described with respect to FIGS. 25A-25C. However, the paths that provide the low- and medium bit line voltages are switched. As with the reverse sensing embodiment, FLG is applied to the gate of transistor 2412, FLA is applied to the gate of transistor 2410, FLB is applied to the gate of transistor 2808, and FLA is applied to the gate of transistor 2806. However, the signals FLA, FLB and FLC are different than in the reverse sensing embodiment.

FIG. 29 depicts a timing diagram of one embodiment of signals for forwarding sensing, including signals FLA, FLB, and FLC. In one embodiment, the values for FLA, FLB, and FLC are as follows. The signal FLA may have a value of 0V when active. In one embodiment, FLB has a value of 1.5V+ Vtn of transistor 2808. The Vtn of transistor 2408 may be about 0.6V. Thus, FLB may be 1.5V+0.6V=2.1V. In one embodiment, FLC has a value of 2.1V+Vtn of transistor 2806. The Vtn of transistor 2406 may be about 0.6V. Thus, FLC may be 2.1V+0.6V=2.7V.

TABLE II

| Bit line Voltage | FLG | INV | LAT | INT |
|---|---|---|---|---|
| High (e.g., Vdd or 2.5 V) | 0 | 1 | 0 | 1 |
| Medium (e.g., 2.1 V) | 1 | 0 | 1 | 0 |
| Low (e.g., 1.5 V) | 1 | 0 | 0 | 1 |

Referring again to FIG. 28A, the signals from Table II may be used in the forward sensing embodiment. These signals are similar to those in Table I, but with the medium- and low-voltage cases switched. Thus, to bias the bit line to the highest voltage, FLG may be 0V, while INT and INV may both be Vdd. When signal FLA is 0V, the bit line may be charged to Vdd (e.g., 2.5V) due to transistors 2410 and 2412 being on. Because INT and INV are both Vdd conduction along the other paths is prevented.

From Table II, FLG=Vdd, INV=0, and INT=Vdd for the low voltage case. Since FLG is Vdd, transistor 2412 will be off. Therefore, conduction is prevented on the high voltage path. Transistor 2404 will be on because INV causes 0V on the gate of transistor 2404. FLB, which may be about 2.1V, is applied to transistor 2808. Therefore, transistor 2808 will conduct until the bit line voltage reaches 1.5V. Consequently, transistors 2808 and 2404 increase the bit line voltage until it reaches about 1.5V. Since, INT=Vdd for the low-voltage case, transistor 2402 will be off.

From Table II, FLG=Vdd, INV=0, and INT=0 for the medium-voltage case. Since FLG may have a value of Vdd, transistor 2412 will be off. Transistor 2402 is on because INT causes 0V to the gate of transistor 2402. Signal FLC, which may be about 2.7V, is applied to the gate of transistor 2806. Therefore, transistor 2806 will conduct until the bit line voltage reaches 2.1V. Consequently, transistors 2402 and 2806 increase the bit line voltage until it reaches about 2.1V. Note that transistor 2404 may conduct because INV, which is applied to its gate is 0V. Transistor 2408 will have 2.1V applied to its gate as a result of signal FLB. Therefore, transistor 2808 can conduct a current until the bit line reaches 1.5V. However, after the bit line reaches 1.5V, transistor 2808 turns off. Therefore, transistor 2808 may assist some in charging the bit line, but will not impact the ability of transistor 2806 to control the bit line voltage.

Figure 28B:
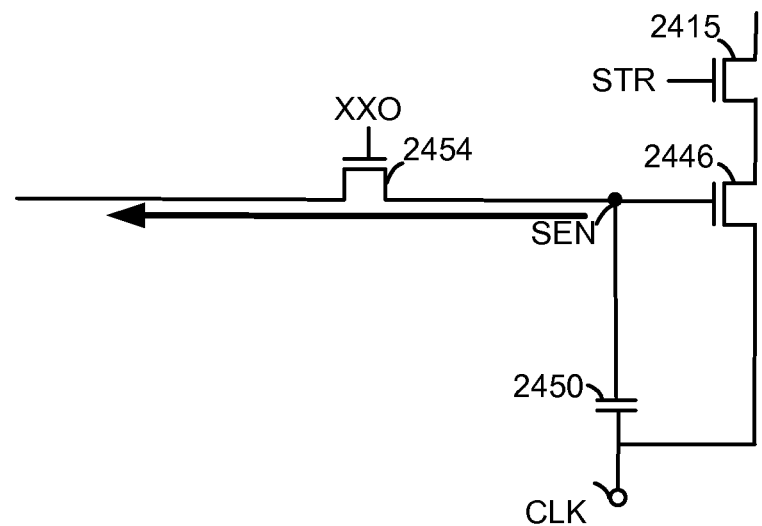
FIG. 28B depicts sense bias transistors for a forward sensing embodiment.

FIG. 28B depicts one embodiment of a circuit of sense transistors for forward sensing. Sensing is performed through transistor 2454 for forward sensing. For forward sensing, current flows from the sense node (SEN) to the bit line in the direction depicted by the arrow. Thus, the sense bias transistors 2456, 2458, 2460, and 2462 of FIG. 24 are not required for forward sensing.

FIG. 29 depicts a timing diagram of signals for one embodiment of forward sensing. The signals refer to those in FIG. 24, as modified by replacing the bit line bias transistors with the circuit of FIG. 28A. Prior to t0, SEN may have a high value that may be a result of resetting the SEN node to that value. Initially, BLC and BLY may be low such that the bit line is not connected to the sense circuit. Initially, FLA may be high and FLB and FLC may be low such that the high-, medium-, and low-voltage paths (see FIG. 28A) are off. At time t0, the voltage Vsource is applied to the source line In one embodiment, Vsource equals Vdd.

Bit Line Pre-Charge Phase

At time t1, the signals BLC and BLY are raised to high, which turn on transistors 2472 and 2474 respectively. Therefore, the bit line 2466 is connected to the bit line bias transistors, as well as other elements in the sense circuit. Also at time t1, the signal FLA begins to transition to low (e.g., 0V), and FLB and FLC begin to transition to high (e.g., 2.1V and 2.7V respectively). This allows the high-, medium-, and low-voltage paths to be on/off depending on the values for FLG, INV, and INT.

Next, initial values for FLG, LAT, INT and INV are established. Table II depicts example values for that may be used to help establish the high-, medium-, and low-voltage on the bit line for forward sensing. At time t2, the signal FCO briefly goes high until time t3. This allows a signal from the BUS to set FLG. The values for FLG, INV, and INT are applied to gates of the bit line bias transistors, as depicted in FIG. 28A. Operation of the bit line bias transistors has already been described in connection with FIG. 28A.

First Sensing Phase

Signal HLL goes high from time t4 until time t5. This briefly turns on the HLL transistor 2448 to establish an initial voltage at SEN at the beginning of a sense operation. In one embodiment, Vsense is a high voltage to raise SEN to a high voltage.

Signal XX0 begins to go high at time t5 and returns to low by time t6. In one embodiment, XX0 is raised to FLB+200 mV. When XX0 is high, the sense node (SEN) is connected to the bit line. At time t5, the sense node (SEN) begins to react based on a condition of the bit line. As previously discussed, the bit line will conduct a current whose magnitude depends, at least in part, on the threshold voltage of the selected memory cell. The conduction current (if any) travels in the forward direction depicted in FIGS. 9C and 12B. Therefore, the conduction current may discharge the capacitor 2450 at the sense node SEN (see FIG. 28B). As a result, the voltage SEN may decrease as the capacitor 2450 discharges as a result of the conduction current in the bit line.

The SEN node is depicted as falling at three different rates. The rate of decrease may depend in part on the difference in voltage between the bit line and SEN. Therefore, in general, the rate of decrease may be faster for the medium-voltage bit line case than for the low-voltage bit line case. The rate of decrease may also depend in part on the magnitude of the memory cell conduction current. The lines labeled A and B correspond to the cases where the memory cell conduction current is high. Line A corresponds to the low-voltage bit line case. Line B corresponds to the medium-voltage bit line case. Therefore, line A goes down at a faster rate than line B. The line labeled C corresponds to the cases where the memory cell conduction current is low. Only one line (C) is depicted for the low conduction current cases; however, there may be some difference in the rate of increase depending on the bit line voltage.

Latch Phase

By time t6, signal XX0 is down to low again to stop the capacitor 2450 from discharging further. At time t7, CLK and FCO go high. The CLK signal couples up the SEN node such that a SEN voltage of certain level will turn on transistor 2446 in order to differentiate non-conducting memory cells from conducting memory cells.

The strobe signal STR is brought high between time t8 and t9. Because FCO is on, the voltage from SEN is inversely passed to FLG through STR and FCO. The value of FLG may be stored in FLAG latch. At time t9 FCO and CLK are brought back low.

Second Sensing Phase

Signal HLL goes high again from time t9 until time t10. This briefly turns on the HLL transistor 2448 to re-establish an initial voltage at SEN at the beginning of a sense operation. In one embodiment, Vsense is a high voltage to raise SEN to a high voltage.

Signal XX0 begins to go high at time t10 and returns to low by time t11. In one embodiment, XX0 is raised to FLC+200 mV. At time t10, the sense node (SEN) begins to react based on a condition of the bit line. By time t11, signal XX0 is down to low again to stop the capacitor 2450 from discharging further.

Latch Phase

At time t12, CLK and LCO go high. The strobe signal STR is brought high between time t12 and t13. Because LCO is on, the voltage from SEN is inversely passed to LATCH through STR and LCO. The value of LAT may be stored in LATCH latch. At time t13 LCO and CLK are brought back low.

Read Out Phase

Similar to the timing diagram of FIG. 27, there may be a readout phase in which NCO is brought high. The control signal NCO at the transfer gate 2430 allows the signal SEN to be read out to the readout BUS.

One embodiment is a method for operating non-volatile storage that includes the following. A first voltage is established on a common source line that is electrically connected to a plurality of NAND strings of non-volatile storage elements that are programmed to at least four states. A second voltage, which is lower than the first voltage, is established on a first bit line that is associated with a first NAND string of the plurality of NAND strings, the first NAND string includes a first non-volatile storage element. A third voltage, which is lower than the first voltage, is established on a second bit line that is associated with a second NAND string of the plurality of NAND strings. The second voltage is different from the first voltage. The second NAND string includes a second non-volatile storage element. A fourth voltage is established on a word line that is associated with the plurality of NAND strings. The fourth voltage is established while the second voltage and the third voltage are established on the first and second bit lines. A first condition of the first non-volatile storage element is sensed in response to establishing the fourth voltage on the word line to determine whether the threshold voltage of the first non-volatile storage element is above or below a first reference voltage. A second condition of the second non-volatile storage element is sensed in response to establishing the fourth voltage on the word line to determine whether the threshold voltage of the second non-volatile storage element is above or below a second reference voltage. In one embodiment, the first reference voltage is different from the second reference voltage. In one embodiment, the first reference voltage is the same as the second reference voltage.

One embodiment is method for operating non-volatile storage that includes a plurality of NAND strings of non-volatile storage elements. The method includes the following. A determination of whether the threshold voltage of a first non-volatile storage element that is associated with a first NAND string of the plurality of NAND strings is above or below a first reference voltage within a voltage range is made. A determination of whether the threshold voltage of a second non-volatile storage element that is associated with a second NAND string of the plurality of NAND strings is above or below the first reference voltage is made. A determination of a first voltage difference to apply across the first NAND string based on the threshold voltage of the first non-volatile storage element is made. A determination of second voltage difference to apply across the second NAND string based on the threshold voltage of the second non-volatile storage element is made. The first voltage difference is different than the second voltage difference. The first voltage difference is caused across the first NAND string while causing the second voltage difference across the second NAND string. A read voltage is applied to a word line that is associated with the first non-volatile storage element and the second non-volatile storage element while causing the first and second voltage differences. A first condition of the first non-volatile storage element is sensed in response to the first voltage difference and read voltage to determine whether the threshold voltage of the first non-volatile storage element is above or below a second reference voltage within the voltage range. A second condition of the second non-volatile storage element is sensed in response to the second voltage difference and read voltage to determine whether the threshold voltage of the second non-volatile storage element is above or below a third reference voltage within the voltage range, the third reference voltage is different from the second reference voltage.

One embodiment is a method for operating non-volatile storage that includes a plurality of NAND strings of non-volatile storage elements that are programmed to "n+1" data states. Each data state corresponding to a range of threshold voltages; adjacent data states have overlapping ranges of threshold voltages. The non-volatile storage elements each have a gate and a source. The method includes performing "n" sense operations at "n" references voltages that fall within the overlapping ranges of threshold voltages between each of the data states to determine whether the threshold voltage of each non-volatile storage element in a subset of the non-volatile storage elements is greater or less than each of the "n" references voltages. An additional sense operation is performed for each of the "n" sense operations. Each of the additional sense operations includes simultaneously sensing a first group of non-volatile storage elements in the subset having a threshold voltage greater than the "nth" reference voltage at a first offset voltage from the "nth" reference voltage while sensing a second group of non-volatile storage elements in the subset having a threshold voltage less than the "nth" reference voltage at a second offset voltage from the "nth" reference voltage. The first and second offsets are different. Sensing is performed at the first offset voltage from the "nth" reference voltage, which includes applying a first gate-to-source voltage difference to non-volatile storage elements in the first group and sensing first conditions of non-volatile storage elements in the first group in response to the first gate-to-source voltage difference to determine whether the threshold voltages of non-volatile storage elements in the first group is above or below the first offset from the "nth" reference voltage. Sensing is performed at the second offset voltage from the "nth" reference voltage, which includes applying a second gate-to-source voltage difference to non-volatile storage elements in the second group and sensing second conditions of non-volatile storage elements in the second group in response to the second gate-to-source voltage difference to determine whether the threshold voltages of non-volatile storage elements in the second group is above or below the second offset from the "nth" reference voltage.

One embodiment includes non-volatile storage device that includes a plurality of NAND strings of non-volatile storage elements. The NAND strings include a first NAND string having a first non-volatile storage element and a second NAND string having a second non-volatile storage element. The non-volatile storage device includes a plurality of word lines associated with the plurality of NAND strings and one or more managing circuits in communication with the non-volatile storage elements. The one or more managing circuits cause a first voltage difference across the first NAND string. The one or more managing circuits cause a second voltage difference across the second NAND string. The second voltage difference is different from the first voltage difference. The second voltage difference is caused at the same time that the first voltage difference is caused. The one or more managing circuits apply a read voltage to a first of the word lines while causing the first and second voltage differences. The one or more managing circuits sense a first condition of the first non-volatile storage element in response to the first voltage difference and read voltage to determine whether the threshold voltage of the first non-volatile storage element is above or below a first reference voltage. The one or more managing circuits sense a second condition of the second non-volatile storage element in response to the second voltage difference and read voltage to determine whether the threshold voltage of the second non-volatile storage element is above or below a second reference voltage. In one embodiment, the first reference voltage is different from the second reference voltage. In one embodiment, the first reference voltage is the same as the second reference voltage.

One embodiment is a non-volatile storage device including a plurality of NAND strings of non-volatile storage elements. The NAND strings include a first NAND string having a first non-volatile storage element and a second NAND string having a second non-volatile storage element. The non-volatile storage device further includes a plurality of bit lines, a first of the bit lines is associated with the first NAND string, a second of the bit lines is associated with a second of the NAND strings. The non-volatile storage device further includes a plurality of word lines associated with the plurality of NAND strings and a common source line that is electrically connected to the plurality of NAND strings. The non-volatile storage device further includes one or more managing circuits in communication with the non-volatile storage elements. The one or more managing circuits establish a first voltage on the common source line. The one or more managing circuits establish a second voltage on the first bit line, the one or more managing circuits establish a third voltage on the second bit line. The second voltage is different from the third condition. The second voltage is less than the first voltage. The third voltage is less than the first voltage. The one or more managing circuits establish a fourth voltage on a selected word line. The fourth voltage is established while the second voltage and the third voltage are established on the first and second bit lines. The one or more managing circuits sense a first condition of the first non-volatile storage element in response to establishing the fourth voltage on the selected word line to determine whether the threshold voltage of the first non-volatile storage element is above or below a first reference voltage. The one or more managing circuits sense a second condition of the second non-volatile storage element in response to establishing the fourth voltage on the selected word line to determine whether the threshold voltage of the second non-volatile storage element is above or below a second reference voltage. In one embodiment, the first reference voltage is different from the second reference voltage. In one embodiment, the first reference voltage is the same as the second reference voltage.

One embodiment is a non-volatile storage device including a plurality of NAND strings of non-volatile storage elements. The NAND strings include a first NAND string having a first non-volatile storage element and a second NAND string having a second non-volatile storage element. The non-volatile storage device further includes a plurality of word lines associated with the plurality of NAND strings. The non-volatile storage device further includes one or more managing circuits in communication with the non-volatile storage elements. The one or more managing circuits determine whether the threshold voltage of the first non-volatile storage element is above or below a first reference voltage within a voltage range. The one or more managing circuits determine whether the threshold voltage of the second non-volatile storage element is above or below the first reference voltage. The one or more managing circuits determine a first voltage difference to apply across the first NAND string based on the threshold voltage of the first non-volatile storage element. The one or more managing circuits determine a second voltage difference to apply across the second NAND string based on the threshold voltage of the second non-volatile storage element, the first voltage difference is different than the second voltage difference, the one or more managing circuits cause the first voltage difference across the first NAND string while causing the second voltage difference across the second NAND string. The one or more managing circuits apply a read voltage to a selected word line that is associated with the first non-volatile storage element and with the second non-volatile storage element while causing the first and second voltage differences. The one or more managing circuits sense a first condition of the first non-volatile storage element in response to the first voltage difference and read voltage to determine whether the threshold voltage of the first non-volatile storage element is above or below a second reference voltage within the voltage range, the one or more managing circuits sense a second condition of the second non-volatile storage element in response to the second voltage difference and read voltage to determine whether the threshold voltage of the second non-volatile storage element is above or below a third reference voltage within the voltage range, the third reference voltage is different from the second reference voltage.

One embodiment includes a non-volatile storage device including a plurality of NAND strings of non-volatile storage elements. The NAND strings include a first NAND string having a first non-volatile storage element and a second NAND string having a second non-volatile storage element, the non-volatile storage elements each having a gate and a source. The non-volatile storage device includes a plurality of word lines associated with the plurality of NAND strings and one or more managing circuits in communication with the non-volatile storage elements. The one or more managing circuits program the non-volatile storage elements to "n+1" data states, each data state corresponding to a range of threshold voltages, adjacent data states having overlapping ranges of threshold voltages. The one or more managing circuits perform "n" sense operations at "n" references voltages that fall within the overlapping ranges of threshold voltages between each of the data states to determine whether the threshold voltage of each non-volatile storage element in a subset of the non-volatile storage elements is greater or less than each of the "n" references voltages. The one or more managing circuits perform an additional sense operation for each of the "n" sense operations. Each of the additional sense operations includes simultaneously sensing a first group of non-volatile storage elements in the subset having a threshold voltage greater than the "nth" reference voltage at a first offset voltage from the "nth" reference voltage while sensing a second group of non-volatile storage elements in the subset having a threshold voltage less than the "nth" reference voltage at a second offset voltage from the "nth" reference voltage. The first and second offsets are different. The one or more managing circuits sense at the first offset voltage from the "nth" reference voltage includes applying a first gate-to-source voltage difference to non-volatile storage elements in the first group and sensing first conditions of non-volatile storage elements in the first group in response to the first gate-to-source voltage difference to determine whether the threshold voltages of non-volatile storage elements in the first group is above or below the first offset from the "nth" reference voltage. The one or more managing circuits sense at the second offset voltage from the "nth" reference voltage, which includes applying a second gate-to-source voltage difference to non-volatile storage elements in the second group and sensing second conditions of non-volatile storage elements in the second group in response to the second gate-to-source voltage difference to determine whether the threshold voltages of non-volatile storage elements in the second group is above or below the second offset from the "nth" reference voltage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage that includes a plurality of NAND strings of non-volatile storage elements, the method comprising:

sensing threshold voltages of selected non-volatile storage elements associated with the NAND strings at a midpoint of a window (W/2);

biasing a first group of bit lines associated with the NAND strings at a first voltage;

biasing a second group of bit lines associated with the NAND strings at a second voltage that is different from the first, the first group of bit lines correspond to ones for which a selected non-volatile storage device had a threshold voltage below W/2 when sensing at the midpoint, the second group of bit lines correspond to ones for which a selected non-volatile storage device had a threshold voltage above W/2 when sensing at the midpoint;

applying a read compare voltage to a selected word line associated with the NAND strings while biasing the first group of bit lines and the second group of bit lines;

determining whether threshold voltages of selected non-volatile storage elements associated with the first group of bit lines are above or below a threshold voltage associated with a point one quarter of the way into the window (W/4) in response to applying the read compare voltage; and determining whether threshold voltages of selected non-volatile storage elements associated with the second group of bit lines are above or below a threshold voltage associated with a point three quarters of the way into the window (3W/4) in response to applying the read compare voltage.

2. The method of claim 1, wherein the biasing the first group of bit lines associated with the NAND strings at the first voltage and the biasing the second group of bit lines associated with the NAND strings at the second voltage comprises:

creating a different Vgs for selected non-volatile storage elements associated with the first group of bit lines than the a Vgs for selected non-volatile storage elements associated with the second group of bit lines.

3. The method of claim 1, wherein the biasing the first group of bit lines associated with the NAND strings at the first voltage and the biasing the second group of bit lines associated with the NAND strings at the second voltage comprises:

creating a different Vds for selected non-volatile storage elements associated with the first group of bit lines than the a Vds for selected non-volatile storage elements associated with the second group of bit lines.

4. The method of claim 1, wherein the biasing the first group of bit lines associated with the NAND strings at the first voltage and the biasing the second group of bit lines associated with the NAND strings at the second voltage comprises:

creating a first voltage across NAND strings associated with the first group of bit lines; and creating a second voltage across NAND strings associated with the second group of bit lines, the second voltage is different from the first voltage.

5. The method of claim 1, further comprising:
applying a voltage to a common source line associated with the plurality of NAND strings of non-volatile storage elements while biasing the first group of bit lines, while biasing the second group of bit lines, and while applying the read compare voltage.

6. The method of claim 1, further comprising:
simultaneously biasing bit lines at four different voltage levels based on results of the determining whether threshold voltages of selected non-volatile storage elements associated with the first group of bit lines are above or below a threshold voltage associated with a point one quarter of the way into the window (W/4) in response to applying the read compare voltage and the determining whether threshold voltages of selected non-volatile storage elements associated with the second group of bit lines are above or below a threshold voltage associated with a point three quarters of the way into the window (3W/4) in response to applying the read compare voltage.

7. The method of claim 1, further comprising:
biasing a third group of bit lines associated with the NAND strings at a third voltage;
biasing a fourth group of bit lines associated with the NAND strings at a fourth voltage that is different from the third, the third group of bit lines correspond to ones for which a selected non-volatile storage device had a threshold voltage below W/4, the fourth group of bit lines correspond to ones for which a selected non-volatile storage device had a threshold voltage above W/4;
applying a read compare voltage to the selected word line while biasing the third group of bit lines and the fourth group of bit lines;
determining whether threshold voltages of selected non-volatile storage elements associated with the third group of bit lines are above or below a threshold voltage associated with a point one eight of the way into the window (W/8) in response to applying the read compare voltage; and
determining whether threshold voltages of selected non-volatile storage elements associated with the fourth group of bit lines are above or below a threshold voltage associated with a point three eighths of the way into the window (3W/8) in response to applying the read compare voltage.

8. A method for operating non-volatile storage that includes a plurality of NAND strings of non-volatile storage elements, the method comprising:
determining whether the threshold voltage of a first non-volatile storage element that is associated with a first NAND string of the plurality of NAND strings is above or below a first reference voltage within a voltage range;
determining whether the threshold voltage of a second non-volatile storage element that is associated with a second NAND string of the plurality of NAND strings is above or below the first reference voltage;
determining a first voltage difference to apply across the first NAND string based on the threshold voltage of the first non-volatile storage element;
determining a second voltage difference to apply across the second NAND string based on the threshold voltage of the second non-volatile storage element, the first voltage difference is different than the second voltage difference;
causing the first voltage difference across the first NAND string while causing the second voltage difference across the second NAND string;
applying a read compare voltage to a word line that is associated with the first non-volatile storage element and the second non-volatile storage element while causing the first and second voltage differences;
sensing a first condition of the first non-volatile storage element in response to the first voltage difference and read compare voltage to determine whether the threshold voltage of the first non-volatile storage element is above or below a second reference voltage within the voltage range; and
sensing a second condition of the second non-volatile storage element in response to the second voltage difference and read compare voltage to determine whether the threshold voltage of the second non-volatile storage element is above or below a third reference voltage within the voltage range, the third reference voltage is different from the second reference voltage.

9. The method of claim 8 wherein the voltage range has an upper voltage and a lower voltage, the first reference voltage is midway between the lower voltage and the upper voltage, the second reference voltage is half-way between the first reference voltage and the upper voltage, the third reference voltage is half-way between the first reference voltage and the lower voltage.

10. The method of claim 8 further comprising
determining a third voltage difference to apply across the first NAND string based on whether the threshold voltage of the first non-volatile storage element is above or below the second reference voltage;
determining a fourth voltage difference to apply across the second NAND string based on whether the threshold voltage of the second non-volatile storage element is above or below the third reference voltage;
causing the third voltage difference across the first NAND string while causing the fourth voltage difference across the second NAND string;
applying the read voltage to the word line while causing the third and fourth voltage differences;
sensing a third condition of the first non-volatile storage element in response to the third voltage difference and a read compare voltage to determine whether the threshold voltage of the first non-volatile storage element is above or below a fourth reference voltage within the voltage range; and
sensing a fourth condition of the second non-volatile storage element in response to the fourth voltage difference and a read compare voltage to determine whether the threshold voltage of the second non-volatile storage element is above or below a fifth reference voltage within the voltage range, the fifth reference voltage is different from the fourth reference voltage.

11. The method of claim 10 wherein the voltage range has an upper voltage and a lower voltage, the first reference voltage is midway between the lower voltage and the upper voltage, the second reference voltage is half-way between the first reference voltage and the upper voltage, the third reference voltage is half-way between the first reference voltage and the lower voltage, the fourth reference voltage is either midway between the second voltage and the upper voltage or midway between the first voltage and the second voltage, the fifth reference voltage is either midway between the third voltage and the lower voltage or midway between the first voltage and the third voltage.

12. The method of claim 8, wherein the causing the first voltage difference across the first NAND string while causing the second voltage difference across the second NAND string comprises:

applying a first voltage to a first bit line associated with the first NAND string;

applying a second voltage that is different from the first voltage to a second bit line associated with the second NAND string; and applying a voltage to a common source line associated with the first and second NAND strings while applying the first voltage to the first bit line and applying the second voltage to the second bit line.

13. The method of claim 12, wherein the voltage applied to the common source line is less than the first voltage and less than the second voltage.

14. The method of claim 12, wherein the voltage applied to the common source line is greater than the first voltage and greater than the second voltage.

15. A non-volatile storage device comprising:

a plurality of NAND strings of non-volatile storage elements, the NAND strings include a first NAND string having a first non-volatile storage element and a second NAND string having a second non-volatile storage element;

a plurality of word lines associated with the plurality of NAND strings; and one or more managing circuits in communication with the non-volatile storage elements, the one or more managing circuits determine whether the threshold voltage of the first non-volatile storage element is above or below a first reference voltage within a voltage range, the one or more managing circuits determine whether the threshold voltage of the second non-volatile storage element is above or below the first reference voltage, the one or more managing circuits determine a first voltage difference to apply across the first NAND string based on the threshold voltage of the first non-volatile storage element, the one or more managing circuits determine a second voltage difference to apply across the second NAND string based on the threshold voltage of the second non-volatile storage element, the first voltage difference is different than the second voltage difference, the one or more managing circuits cause the first voltage difference across the first NAND string while causing the second voltage difference across the second NAND string, the one or more managing circuits apply a read voltage to a selected word line that is associated with the first non-volatile storage element and with the second non-volatile storage element while causing the first and second voltage differences, the one or more managing circuits sense a first condition of the first non-volatile storage element in response to the first voltage difference and read voltage to determine whether the threshold voltage of the first non-volatile storage element is above or below a second reference voltage within the voltage range, the one or more managing circuits sense a second condition of the second non-volatile storage element in response to the second voltage difference and read voltage to determine whether the threshold voltage of the second non-volatile storage element is above or below a third reference voltage within the voltage range, the third reference voltage is different from the second reference voltage.

16. The non-volatile storage device of claim 15 wherein the voltage range has an upper voltage and a lower voltage, the first reference voltage is midway between the lower voltage and the upper voltage, the second reference voltage is half-way between the first reference voltage and the upper voltage, the third reference voltage is half-way between the first reference voltage and the lower voltage.

17. The non-volatile storage device of claim 15 wherein the one or more managing circuits determine a third voltage difference to apply across the first NAND string based on whether the threshold voltage of the first non-volatile storage element is above or below the second reference voltage, the one or more managing circuits determine a fourth voltage difference to apply across the second NAND string based on whether the threshold voltage of the second non-volatile storage element is above or below the third reference voltage, the one or more managing circuits cause the third voltage difference across the first NAND string while causing the fourth voltage difference across the second NAND string, the one or more managing circuits apply the read voltage to the word line while causing the third and fourth voltage differences, the one or more managing circuits sense a third condition of the first non-volatile storage element in response to the third voltage difference and read voltage to determine whether the threshold voltage of the first non-volatile storage element is above or below a fourth reference voltage within the voltage range, the one or more managing circuits sense a fourth condition of the second non-volatile storage element in response to the fourth voltage difference and read voltage to determine whether the threshold voltage of the second non-volatile storage element is above or below a fifth reference voltage within the voltage range, the fifth reference voltage is different from the fourth reference voltage.

18. The non-volatile storage device of claim 17 wherein the voltage range has an upper voltage and a lower voltage, the first reference voltage is midway between the lower voltage and the upper voltage, the second reference voltage is half-way between the first reference voltage and the upper voltage, the third reference voltage is half-way between the first reference voltage and the lower voltage, the fourth reference voltage is either midway between the second voltage and the upper voltage or midway between the first voltage and the second voltage, the fifth reference voltage is either midway between the third voltage and the lower voltage or midway between the first voltage and the third voltage.

19. The non-volatile storage device of claim 15, wherein when the one or more managing circuits cause the first voltage difference across the first NAND string while causing the second voltage difference across the second NAND string comprises the one or more managing circuits apply a first voltage to a first bit line associated with the first NAND string, the one or more managing circuits apply a second voltage that is different from the first voltage to a second bit line associated with the second NAND string, the one or more managing circuits applying a voltage to a common source line associated with the first NAND string and the second NAND string while applying the first voltage to the first bit line and applying the second voltage to the second bit line, wherein the voltage applied to the common source line is less than the first voltage and less than the second voltage.

20. The non-volatile storage device of claim 15, wherein when the one or more managing circuits cause the first voltage difference across the first NAND string while causing the second voltage difference across the second NAND string comprises the one or more managing circuits apply a first voltage to a first bit line associated with the first NAND string, the one or more managing circuits apply a second voltage that is different from the first voltage to a second bit line associated with the second NAND string, the one or more managing circuits applying a voltage to a common source line associated with the first NAND string and second NAND string while applying the first voltage to the first bit line and applying the second voltage to the second bit line, wherein the voltage applied to the common source line is greater than the first voltage and greater than the second voltage.

21. The method of claim 1, wherein:
the non-volatile storage comprises a three-dimensional memory array, the three-dimensional memory array comprising the plurality of NAND strings.

22. The method of claim 8, wherein:
the non-volatile storage comprises a three-dimensional memory array, the three-dimensional memory array comprising the plurality of NAND strings.

23. The non-volatile storage device of claim 15, further comprising:
a three-dimensional memory array, the three-dimensional memory array comprising the plurality of NAND strings.

\* \* \* \* \*

UNITED STATES PATENT AND TRADEMARK OFFICE
CERTIFICATE OF CORRECTION

PATENT NO.         : 8,873,285 B2                                           Page 1 of 1
APPLICATION NO.    : 13/937983
DATED              : October 28, 2014
INVENTOR(S)        : Sharon et al.

It is certified that error appears in the above-identified patent and that said Letters Patent is hereby corrected as shown below:

On the Title Page, Item 73, Assignee: Delete "SanDisk II, Ltd." and insert -- SanDisk IL Ltd. --.

Signed and Sealed this
Twenty-first Day of April, 2015

Michelle K. Lee
*Director of the United States Patent and Trademark Office*